(12) United States Patent
Kim et al.

(10) Patent No.: US 8,148,763 B2
(45) Date of Patent: Apr. 3, 2012

(54) THREE-DIMENSIONAL SEMICONDUCTOR DEVICES

(75) Inventors: Sukpil Kim, Yongin-si (KR); Yoondong Park, Yongin-si (KR); Wonjoo Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 247 days.

(21) Appl. No.: 12/615,424

(22) Filed: Nov. 10, 2009

(65) Prior Publication Data

US 2010/0128509 A1 May 27, 2010

(30) Foreign Application Priority Data

Nov. 25, 2008 (KR) .................. 10-2008-0117655
May 28, 2009 (KR) .................. 10-2009-0047101

(51) Int. Cl.
*H01L 27/108* (2006.01)

(52) U.S. Cl. . 257/296; 257/315; 257/324; 257/E29.309; 257/E29.3; 257/314; 365/63

(58) Field of Classification Search .................. 257/296, 257/314, 315, 324, E29.309, E29.3; 365/63
See application file for complete search history.

(56) References Cited

U.S. PATENT DOCUMENTS

| 7,141,838 B1 | 11/2006 | Brennan |
| 2007/0047309 A1 | 3/2007 | Satoh et al. |

FOREIGN PATENT DOCUMENTS

| JP | 06-077500 | 3/1994 |
| JP | 2007-027760 | 2/1997 |
| JP | 2008-078404 | 4/2008 |
| KR | 1020040055705 A | 6/2004 |
| KR | 1020060027749 A | 3/2006 |
| KR | 1020080033845 A | 4/2008 |
| KR | 1020080048313 A | 6/2008 |
| KR | 1020080058251 A | 6/2008 |

*Primary Examiner* — Long Pham
(74) *Attorney, Agent, or Firm* — Myers Bigel Sibley & Sajovec

(57) ABSTRACT

Provided are a three-dimensional semiconductor device and a method of operating the same. The three-dimensional semiconductor device includes: a plurality of word line structures on a substrate; active semiconductor patterns between the plurality of word line structures; and information storage elements between the plurality of word line structures and the active semiconductor patterns. Each of the plurality of word line structures includes a plurality of word lines spaced apart from each other and stacked, and the active semiconductor patterns include electrode regions and channel regions, the electrode regions and the channel regions having different conductive types and being alternately arranged.

10 Claims, 53 Drawing Sheets

|         | MR1   | MR2   | MR3   | MR4   |
|---------|-------|-------|-------|-------|
| $V_{WL11}$ | $V_{pgm}$ | $V_{pgm}$ | GND   | GND   |
| $V_{WL21}$ | GND   | GND   | $V_{pgm}$ | $V_{pgm}$ |
| ER1     | GND   | Vd    | GND   | Vd    |
| ER2     | Vd    | GND   | Vd    | GND   |
| CR      | GND   | GND   | GND   | GND   |

* $Vd > V_{pgm} - V_{th}$

Fig. 30

|  | MR1 | MR2 | MR3 | MR4 |
|---|---|---|---|---|
| $V_{WL11}$ | $V_{read}$ | $V_{read}$ | GND | GND |
| $V_{WL21}$ | GND | GND | $V_{read}$ | $V_{read}$ |
| ER1 | GND | Vd | GND | Vd |
| ER2 | Vd | GND | Vd | GND |
| CR | GND | GND | GND | GND |

| All WL | GND |
|---|---|
| All ER | Float |
| CR | $V_{ers}$ |

THREE-DIMENSIONAL SEMICONDUCTOR DEVICES

CROSS-REFERENCE TO RELATED APPLICATIONS

This U.S. non-provisional patent application claims priorities under 35 U.S.C. §119 of Korean Patent Application Nos. 10-2008-117655, filed on Nov. 25, 2008 and 10-2009-047101, filed on May 28, 2009, the entire contents of which are hereby incorporated by reference as if set forth fully herein.

BACKGROUND

The present invention disclosed herein relates to three-dimensional semiconductor devices and methods of operating the same.

Higher integration of semiconductor devices may be required to satisfy consumer demands for superior performance and inexpensive prices. In the case of semiconductor memory devices, since their integration may be an important factor in determining product price, increased integration may be especially required. In the case of typical two-dimensional or planar semiconductor memory devices, since their integration may be mainly determined by the area occupied by a unit memory cell, integration may be influenced by the level of fine patterning technology. However, since extremely expensive semiconductor equipments may be needed for increasing pattern fineness, integration of two-dimensional memory devices may be increasing but still limited.

SUMMARY OF INVENTION

The present invention may provide semiconductor memory devices with increased integration.

Some embodiments of the present invention may provide methods of operating semiconductor memory devices that have memory cells capable of storing multi-bits.

Embodiments of the present invention provide three-dimensional semiconductor memory device that includes multiple word line structures on a substrate, multiple active semiconductor patterns between the word line structures, and multiple information storage elements between the word line structures and the active semiconductor patterns. In some embodiments, each of the word line structures includes multiple word lines spaced apart from each other and stacked sequentially and the active semiconductor patterns include multiple electrode regions and multiple channel regions that are alternately arranged and have conductive types different from each other.

Some embodiments provide that the electrode regions and the channel regions constituting one active semiconductor pattern are continuously arranged and that each of the channel regions directly contacts two of the electrode regions adjacent thereto.

In some embodiments, multiple bit lines are provided that connect respective ones of the electrode regions and the bit lines are disposed above or below ones of the word line structures to cross the word lines. Some embodiments provide that the bit lines include first bit lines connecting ones of the electrode regions corresponding to odd-numbered active semiconductor patterns and second bit lines connecting ones of the electrode regions corresponding to even-numbered active semiconductor patterns and that are electrically separated from the first bit lines. In some embodiments, the first bit lines are disposed above the word line structures the second bit lines are disposed below the word line structures.

Some embodiments include multiple bit lines crossing above or below the word line structures and multiple switching elements disposed between ones of the electrode regions and ones of the bit lines to control an electrical connection between ones of the electrode regions and ones of the bit lines. In some embodiments, ones of the switching elements are configured to electrically connect ones of the electrode regions of one of one pair of adjacent active semiconductor patterns to corresponding ones of the bit lines and to electrically separate ones of the electrode regions of an other of the one pair of adjacent active semiconductor patterns from the bit lines.

In some embodiments, the substrate includes a cell array region on which the word line structures are disposed and a peripheral region on which a peripheral circuit is disposed. Some embodiments provide that the word line structures are placed at a level higher than the substrate below the peripheral circuit.

Some embodiments include multiple bit lines crossing above or below the word line structures, multiple switching elements disposed between ones of the electrode regions and the bit lines to control an electrical connection between the electrode regions and the bit lines, and multiple MUX circuits connected to the bit lines to select at least one of the bit lines. Some embodiments provide that each of the MUX circuits is configured to operate independently.

Some embodiments of the present invention include methods of operating the three-dimensional semiconductor memory device as described herein. Methods may include selecting a cell by selectively controlling a current path passing via memory cell transistors that include word lines, active semiconductor patterns and information storage elements. In some embodiments, selecting the cell includes applying a select word line voltage to a select word line constituting the selected memory cell transistor, applying a non-selected word line voltage, which is lower than the select word line voltage, to word lines of at least one of non-selected memory cell transistors, and applying a source voltage to one of the electrode regions constituting the selected memory cell transistor and applying a drain voltage to the other one of the electrode regions.

In some embodiments, the information storage elements of the memory cell transistors each include a first memory region and a second memory region respectively adjacent to two electrode regions of a corresponding memory cell transistor. Corresponding methods may include locally injecting charges into the first memory region to perform a first program operation and locally injecting charges into the second memory region to perform a second program operation.

Some embodiments provide that the first program operation and the second program operation are performed by selecting the cell by selectively controlling a current path passing via memory cell transistors. In some embodiments, selecting the cell for the first and second program operations includes selecting word line voltage, the source voltage and the drain voltage are so as to cause a hot-carrier-injection phenomenon.

In some embodiments, the first program operation includes applying the drain voltage to the electrode region adjacent to the first memory region and applying the source voltage to the electrode region spaced apart from the first memory region. Some embodiments provide that the second program operation includes applying the drain voltage to the electrode region adjacent to the second memory region and applying the source voltage to the electrode region spaced apart from the second memory region.

Some embodiments provide that in the first program operation or the second program operation, the non-selected word line voltage is applied to: (i) word lines which do not include the select word line and constitute the word line structures adjacent to the select word line; and (ii) other word lines which are included in the word line structure including the select word line.

In some embodiments, the information storage element of the memory cell transistor includes a first memory region and a second memory region respectively adjacent to two of the electrode regions of a corresponding memory cell transistor and that the methods include performing a first read operation of measuring dependence of the current passing via the memory cell transistor on a quantity of charges injected into the first memory region using the cell selecting operation and performing a second read operation of measuring dependence of the current passing via the memory cell transistor on a quantity of charges injected into the second memory region using the cell selecting operation.

In some embodiments, the voltages applied to the two electrode regions of the corresponding memory cell transistor are exchanged during the first and second read operations. Some embodiments include performing an erase operation of simultaneously erasing information stored in multiple memory cell transistors by generating a difference in electric potential between the word lines and the electrode regions, or between the word lines and the channel regions.

Some embodiments of the present invention include a three-dimensional semiconductor memory device. The device may include multiple word line structures including multiple spaced apart word lines on a substrate and multiple active semiconductor patterns that are arranged between the word line structures and that include multiple electrode regions and multiple channel regions. Some embodiments may include multiple information storage elements between the word line structures and the active semiconductor patterns. Devices may include multiple bit lines connecting respective ones of the electrode regions and crossing above or below the word line structures and multiple switching elements disposed between ones of the electrode regions and ones of the bit lines to control an electrical connection between ones of the electrode regions and ones of the bit lines.

In some embodiments, ones of the switching elements are configured to electrically connect ones of the electrode regions of one of one pair of adjacent active semiconductor patterns to corresponding ones of the bit lines and to electrically separate ones of the electrode regions of an other of the one pair of adjacent active semiconductor patterns from the bit lines.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention. In the figures:

FIGS. 30 and 31 are tables for illustrating read and write operations of a semiconductor memory device according to some embodiments of the present invention;

DETAILED DESCRIPTION

Figure 1:
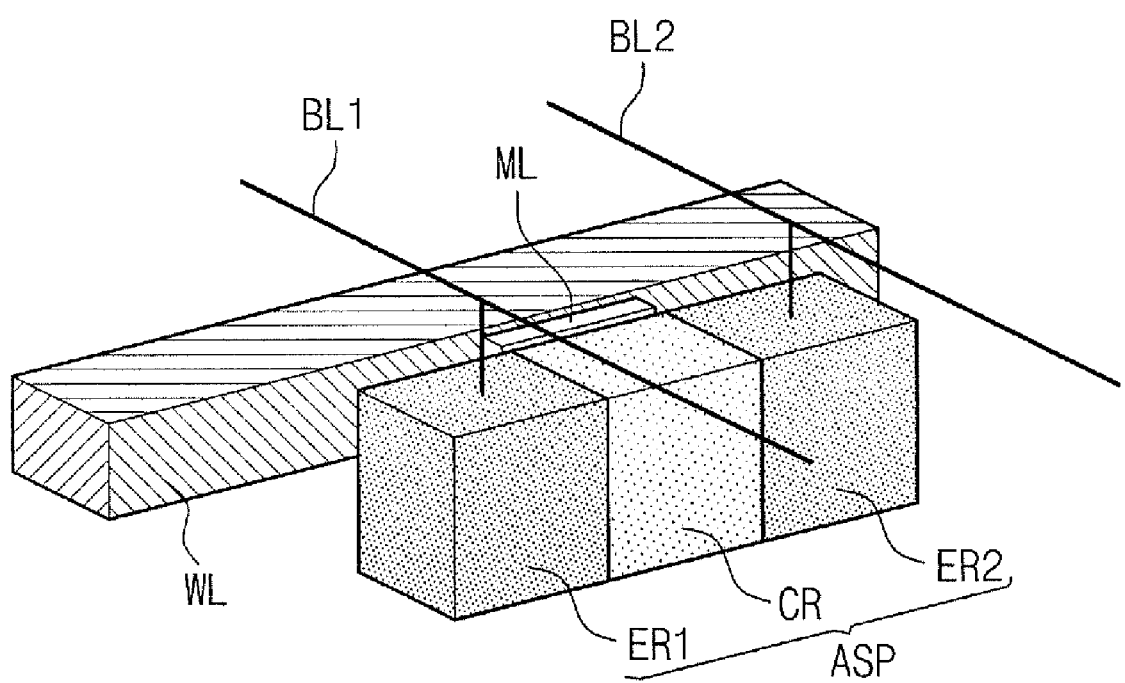
FIG. 1 is a perspective view for illustrating a unit cell structure of a three-dimensional semiconductor memory device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

FIG. 1 is a perspective view for illustrating a unit cell structure of a three-dimensional semiconductor memory device according to some embodiments of the present invention.

Referring to FIG. 1, the three-dimensional semiconductor memory device may include at least one word line (WL), at least one active semiconductor pattern (ASP), and a memory layer (ML) between the at least one word line (WL) and the at least one active semiconductor pattern (ASP). The active semiconductor pattern (ASP) may be at least one of materials providing semiconductor characteristics, and may include at least one electrode region (ER1, ER2), and at least one channel region (CR) between the electrode regions.

Some embodiments provide that one pair of electrode regions (ER1 and ER2) and one channel region (CR) between the one pair of electrode regions (ER1 and ER2) may constitute a unit memory cell of the three-dimensional memory device. The channel region (CR) may be a semiconductor lightly doped with first conductive type impurities, and the electrode regions (ER1 and ER2) may be semiconductors heavily doped with second conductive type impurities. For example, the channel region (CR) and the electrode regions (ER1 and ER2) may be a lightly doped p-type silicon ($p^-$ Si) and a heavily doped n-type silicon ($n^+$ Si) or a lightly doped n-type silicon ($n^-$ Si) and a heavily doped p-type silicon ($p^+$ Si), respectively. Accordingly, the electrode regions and the channel region (ER1, ER2 and CR) may form an npn structure or a pnp structure.

In some embodiments, the word line (WL) is configured to control the potential of the channel region (CR) and may be used as a gate electrode of a memory cell transistor controlling a current path between the electrode regions (ER1 and ER2). For this purpose, the word line (WL) may be formed of at least one of conductive materials.

The memory layer (ML) is interposed between the word line (WL) and the channel region (CR) and may be used as a gate dielectric of the memory cell transistor. The memory layer (ML) may include a thin film for charge storage. For example, the memory layer (ML) may include one of dielectrics having a trap site and/or one of electrically isolated conductive materials.

In addition, the electrode regions (ERs) may be electrically connected with bit lines (BL) crossing the word line (WL). The bit lines (BL) are electrically separated, and two different voltages may be alternately applied to the bit lines (BL) such that data can be stored through the Mirror-bit operating method. The technical features of the present invention related to structure and layout of the bit lines will be described in more detail with reference to FIGS. 5 through 18.

Figure 2:
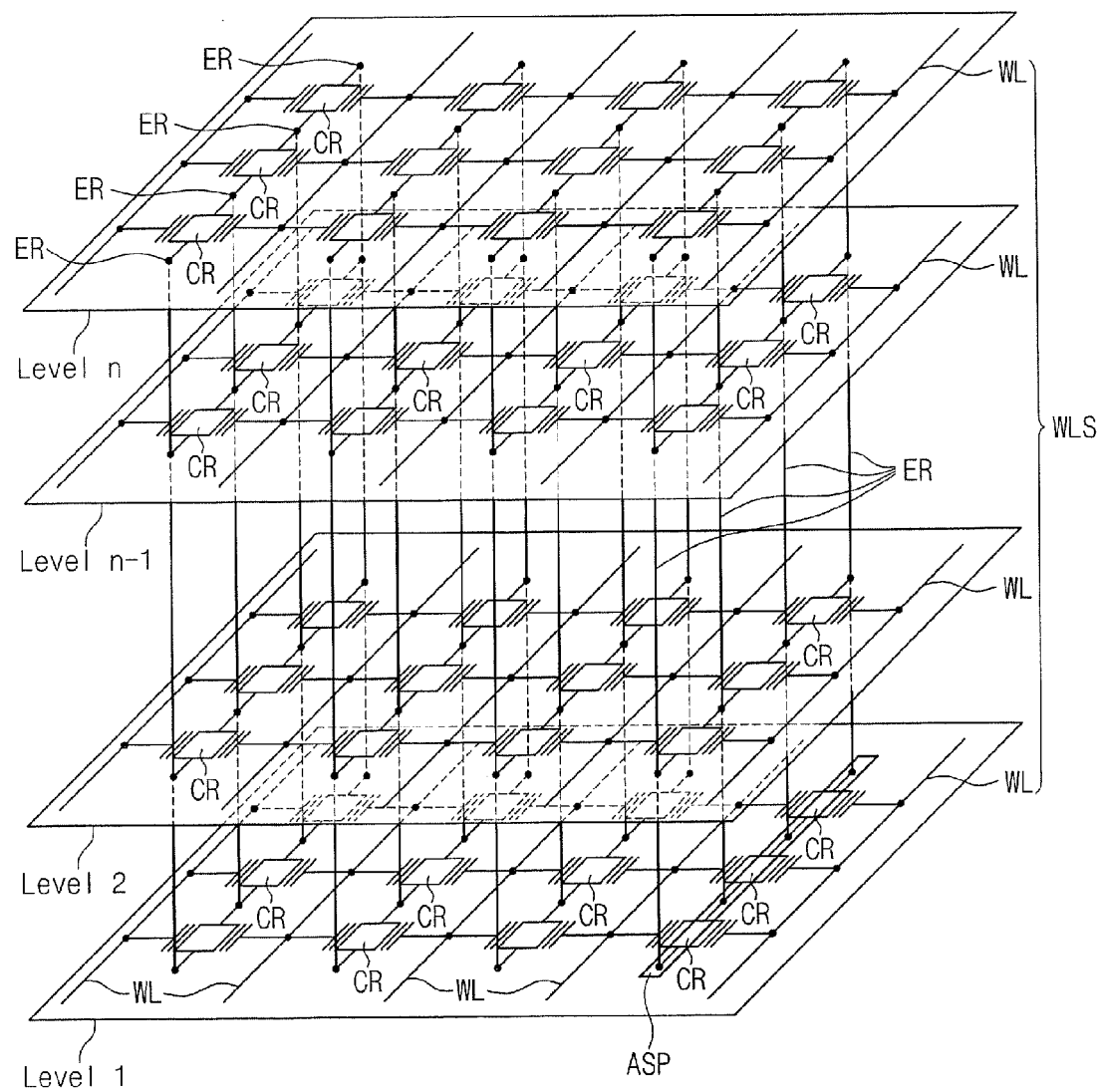
FIG. 2 is a circuit diagram for illustrating a cell array of a three-dimensional semiconductor memory device according to some embodiments of the present invention.
Figure 3:
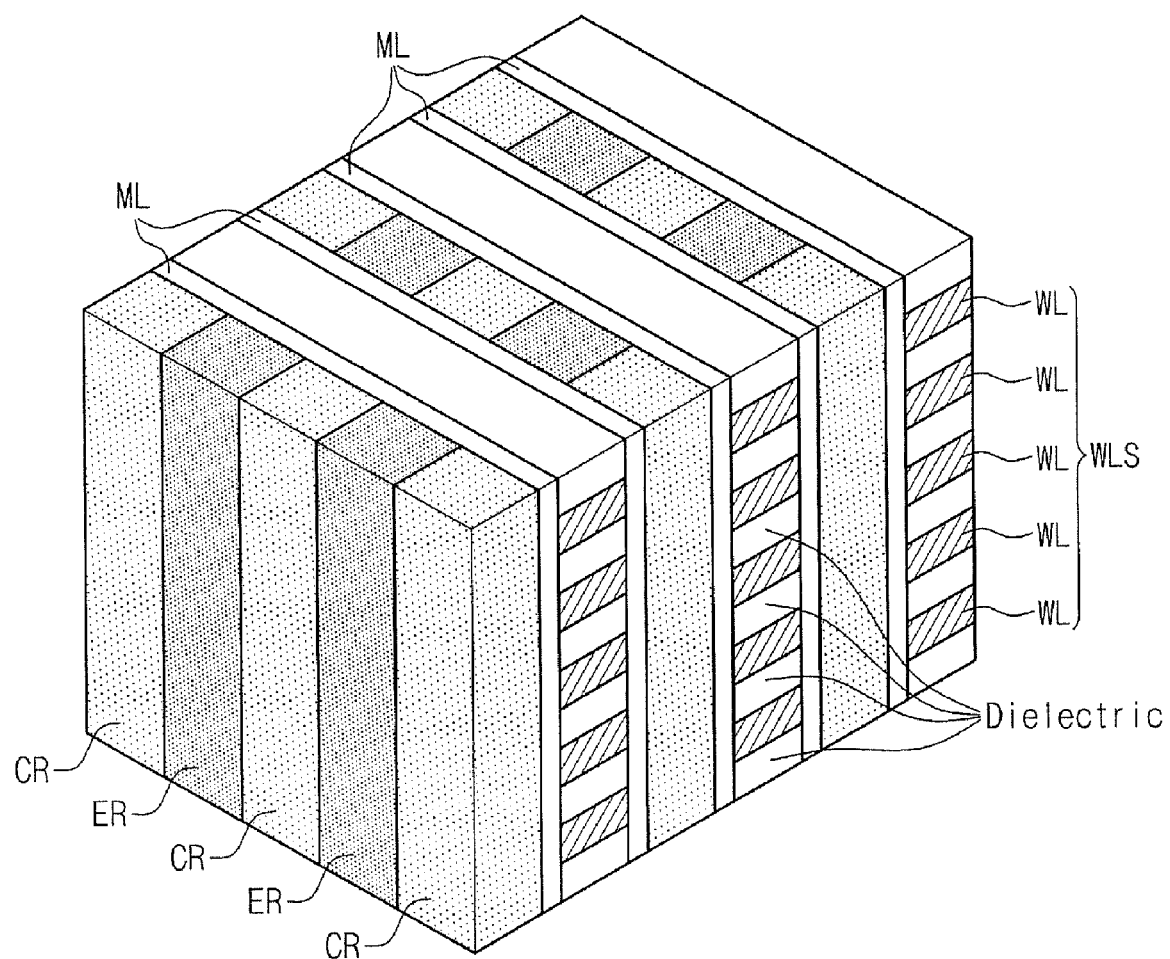
FIG. 3 is a perspective view for illustrating a cell array of a three-dimensional semiconductor memory device according to some embodiments of the present invention.

FIG. 2 is a circuit diagram illustrating a cell array of a three-dimensional semiconductor memory device according to some embodiments of the present invention. FIG. 3 is a perspective view for illustrating a cell array of a three-dimensional semiconductor memory device according to some embodiments of the present invention. For simplification of description, description of technical features of embodiments already explained with reference to FIG. 1 may be omitted.

Referring to FIGS. 2 and 3, the three-dimensional semiconductor memory device includes two or more word line structures (WLS), two or more active semiconductor patterns (ASP) between the two or more word line structures, and a memory layer (ML) between the word line structures (WLS) and the active semiconductor patterns (ASP), which constitute a three-dimensionally arranged memory cell transistor.

As shown in the drawings, each of the word line structures (WLS) may include two or more word lines (WL) positioned at different levels and dielectrics between the two or more word lines. Each of the word lines (WL) may be used as a gate electrode of the memory cell transistors. Each of the active semiconductor patterns (ASP) may include two or more electrode regions (ER) and two or more channel regions (CR) between the electrode regions (ER). The electrode regions (ER) and the channel regions (CR) contact each other, may be alternately arranged, and may have different conductive types, as shown in FIG. 1.

According to an aspect of some embodiments of the present invention, since the electrode regions (ER) and the channel regions (CR) contact each other and are alternately arranged, spaces between the word line structures (WLS) may be substantially filled by the active semiconductor patterns (ASP) and the memory layer (ML). That is, the adjacent channel regions (CR) may not be electrically separated by insulators but may be electrically separated by a semiconductor material (e.g., the electrode regions (ER)) having a conductive type different from the channel regions (CR).

Meanwhile, according to the aforementioned layout, one word line (WL) is disposed to face one pair of active semiconductor patterns (ASP) disposed at both sides thereof and one active semiconductor pattern (ASP) is disposed to face one pair of word line structures (WLS) disposed at both sides thereof. As a result, potentials of one pair of adjacent active semiconductor patterns (ASP) can be controlled by one word line between the one pair of adjacent active semiconductor patterns (ASP). That is, one word line (WL) may be used as a common gate electrode of two memory cell transistors adjacent thereto.

Similarly, potentials of both sidewalls of one active semiconductor pattern (ASP) may be controlled by one pair of word lines (WL) adjacent thereto. Here, in order to independently control the potentials of sidewalls of the active semiconductor pattern (ASP), the one pair of word lines (WL) adjacent to each other may be configured such that different voltages can be applied to the one pair of word lines (WL). For example, (2i−1)-th word lines may be formed separated from 2i-th word lines, where i is a natural number. In this case, one active semiconductor pattern (ASP) may be used as a common active region for two transistors, which use two word lines adjacent to the one active semiconductor pattern (ASP) as gate electrodes, respectively.

Figure 4:
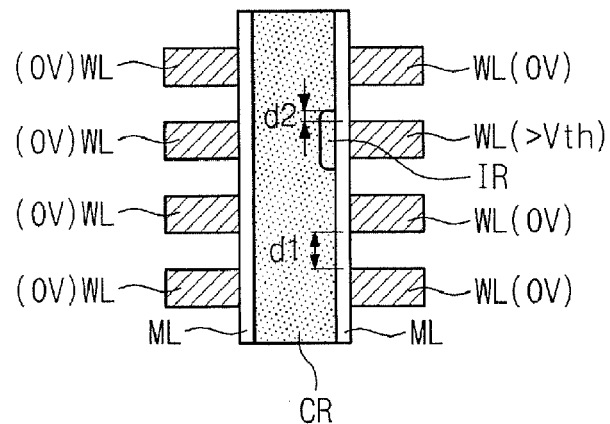
FIG. 4 is a cross-sectional view for illustrating an operation of a memory cell transistor according to some embodiments of the present invention.

FIG. 4 is a cross-sectional view for illustrating an operation of a memory cell transistor according to some embodiments of the present invention.

Referring to FIG. 4, as aforementioned, the word lines (WL) may be used as gate electrodes of memory cell transistors. That is, an inversion region (IR) may be formed in the channel region (CR) by a voltage applied to the word line (WL). The electrode regions (ER) positioned at both sides of the corresponding channel region (CR) may be electrically connected by the inversion region (IR). When the electrode regions (ER) are electrically connected, a corresponding memory cell transistor may be turned on.

Here, since information (e.g., charge) stored in the memory layer (ML) may influence the potential of the channel region (CR), forming the inversion region (IR) or turning-on the memory cell transistor may be dependent on the information stored in the memory layer (ML). According to some embodiments of the present invention, the information stored in the memory layer (ML) may be read by measuring dependence of a read current through the interconnection lines (e.g., bit lines) connected to the electrode regions (ER).

A write operation of a memory cell transistor according to some embodiments of the present invention may include injecting charges into the memory layer (ML) using pinch-off phenomenon. Pinch-off phenomenon means that a channel region (i.e., inversion region (IR)) is not formed in a region adjacent a drain electrode when a potential difference between a gate electrode and the drain electrode is smaller than a threshold voltage. In this case, since a large electric field may be formed between the drain electrode and the formed channel region, charges in the pinch-off region may have a large kinetic energy and thus may be injected into the memory layer (ML).

Meanwhile, since the electrode regions (ER) and the channel region (CR) may be thicker than those of each of the word lines (WL) or the word line structure (WLS), the electrode regions (ER) and the channel region (CR) may be formed to face the two or more word lines (WL). Accordingly, in the case where the inversion region (IR) is not locally formed around a selected word line but extends around word lines adjacent to an upper portion or a lower portion of the inversion region (IR), an error in write operation or read operation may be generated.

According to some embodiments of the present invention, a vertical spacing (d1) between the word lines (WL) (i.e., thicknesses of insulating layers (not shown) between the word lines (WL)) may be greater than an extending width (d2) of the inversion region (IR). In this case, since the inversion region (IR) does not extend to a side surface of non-selected word lines, the aforementioned error in write operation or read operation may be prevented.

Figure 5:
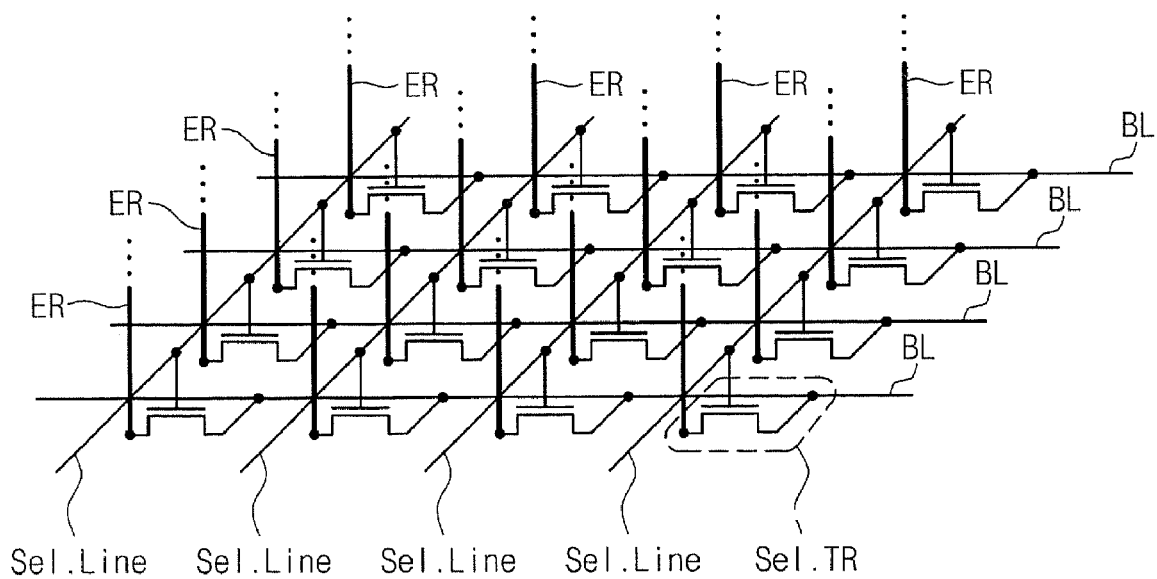
FIGS. 5 and 6 are circuit diagrams for illustrating cell array structures according to some embodiments of the present invention.
Figure 6:
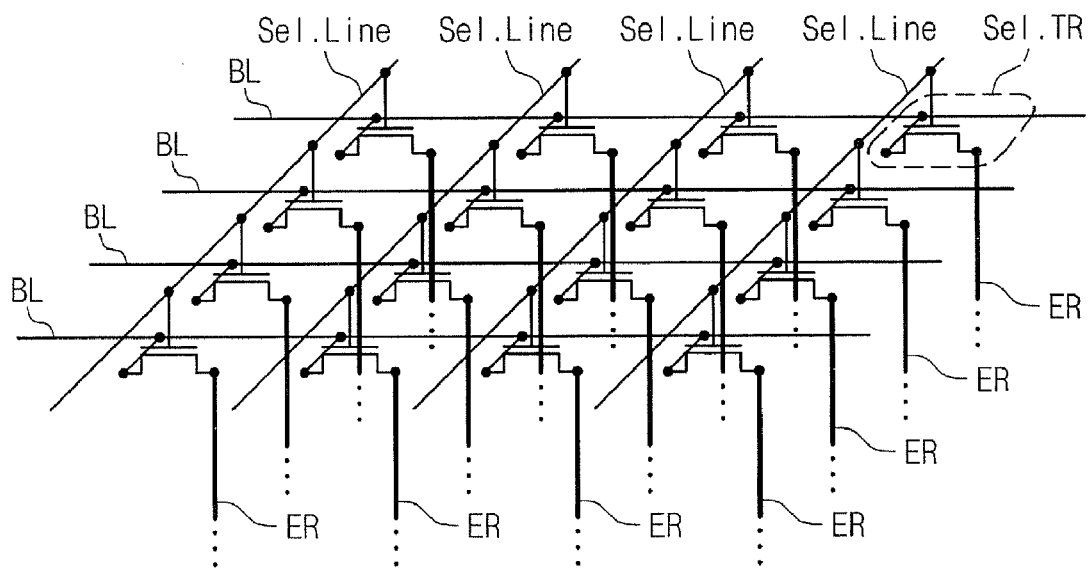

FIGS. 5 and 6 are circuit diagrams for illustrating cell array structures according to some embodiments of the present invention.

As shown in FIG. 5, select transistors (Sel.TR) may be two-dimensionally arranged below the active semiconductor patterns (ASP). In some embodiments, as shown in FIG. 6, select transistors (Sel.TR) may be two-dimensionally arranged above the active semiconductor patterns (ASP). Gate electrodes of the select transistors (Sel.TR) may be connected by select lines (Sel.line), drain electrodes (or source electrodes) of the select transistors may be connected by bit lines crossing the select lines (Sel.line), and the electrode regions (ER) may be connected to the source electrodes (or drain electrodes) of the select transistors (Sel.TR), respectively.

In this case, since each of the select lines (Sel.line) may control On/Off operation of the select transistors (Sel.TR), each of the select lines (Sel.line) may control an electrical connection between the bit line (BL) and the electrode region (ER). For example, in the case where one select line (Sel.line) and two adjacent bit lines (BL) are selected, two electrode regions (ER) connected to two adjacent select transistors (Sel.TR) selected by the one select line (Sel.line) and the two adjacent bit lines (BL) may be uniquely selected. Accordingly, when different voltages are applied to selected two bit lines (BL) and one of memory cells disposed above or below the selected two bit lines (BL) is turned on by a voltage applied to a predetermined word line, current passing through the turned-on memory cell may be generated.

Meanwhile, in the case where voltages applied to the selected two bit lines (BL) are exchanged, current may flow in an opposite direction to the current in the above described case. This change in current direction will be described in more detail with reference to FIGS. 27 through 29, and may be used as a method for storing two bits in one memory cell. According to some modified embodiments of the present invention, the select lines (Sel.line) may be grouped, and each group of select lines may include at least one select line (Sel.line) having an equipotential.

Figure 7:
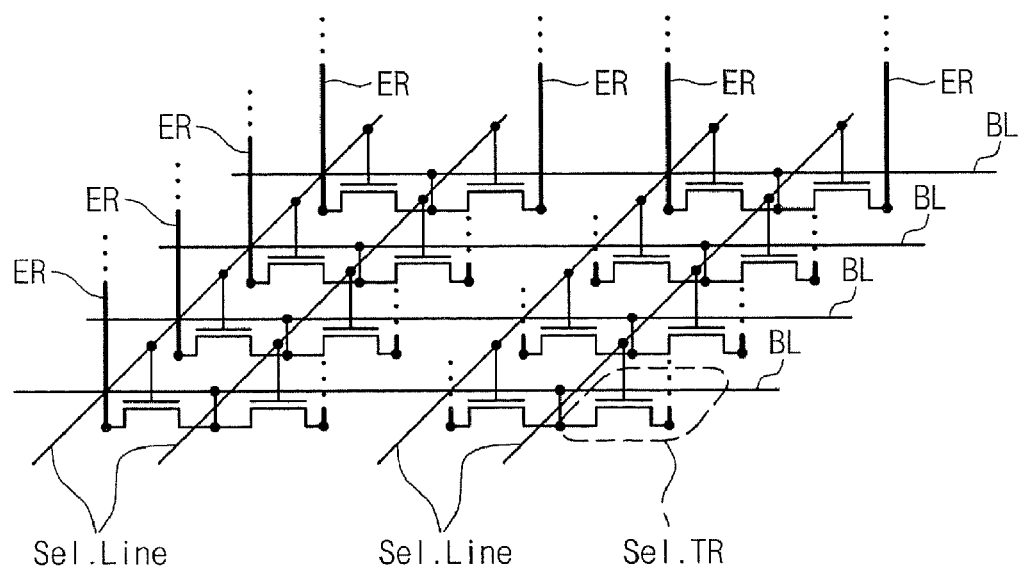
FIG. 7 is a circuit diagram for illustrating a cell array structure according to some embodiments of the present invention.

FIG. 7 is a circuit diagram for illustrating a cell array structure according to some other embodiments of the present invention. For simplicity of description, description on technical features overlapping those of the embodiments described with reference to FIGS. 5 and 6 may be omitted.

Referring to FIG. 7, select transistors (Sel.TR) may be two-dimensionally arranged below the active semiconductor patterns (ASP). In contrast with embodiments described above with reference to FIG. 5, some embodiments provide that one pair of select transistors (Sel.TR) share drain electrodes that are commonly connected to the bit line (BL) and that the electrode regions (ER) are connected to source electrodes of the select transistors (Sel.TR), respectively. Resultantly, the select transistors (Sel.TR) may have substantially the same layout structure as memory cell transistors of well-known DRAM.

Figure 8:
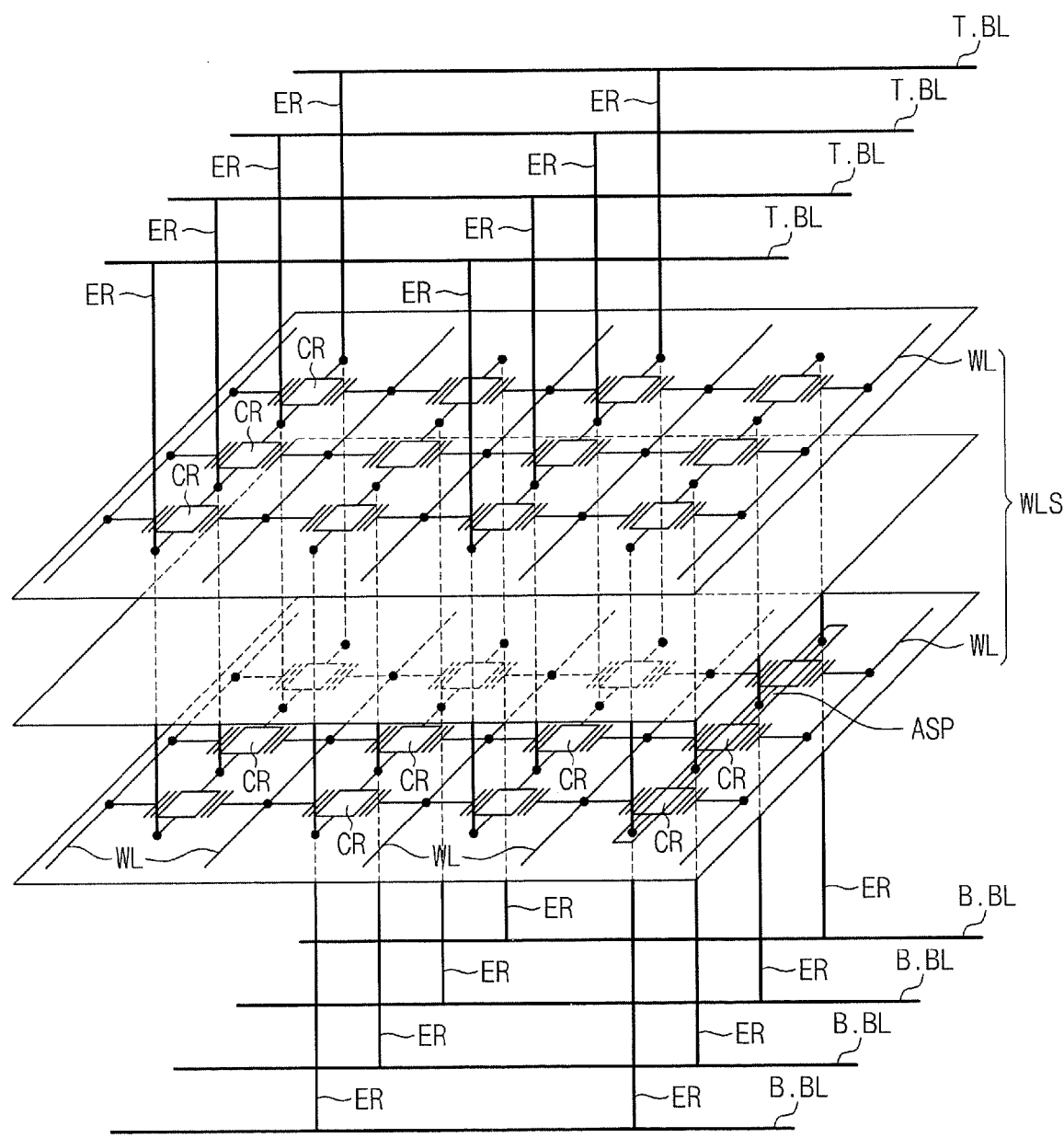
FIG. 8 is a circuit diagram for illustrating a cell array structure according to some embodiments of the present invention.
Figure 9:
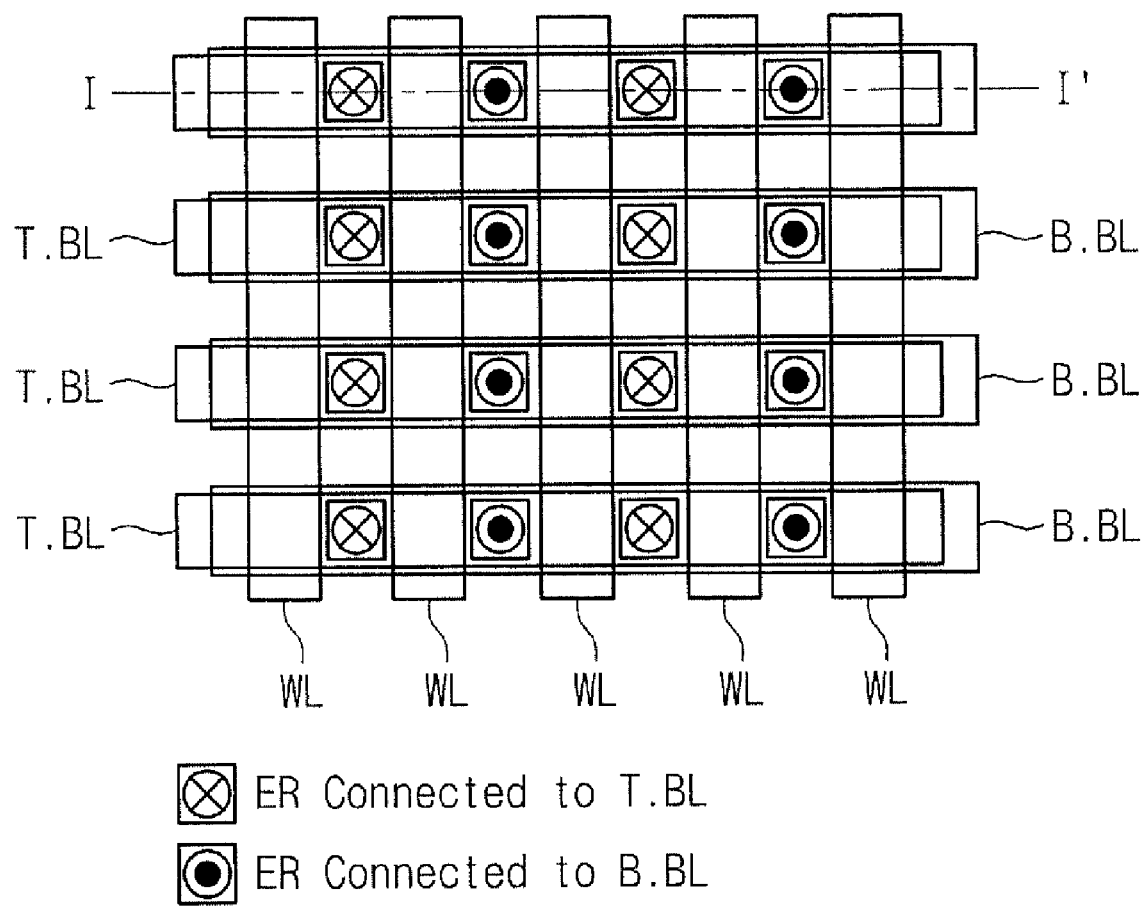
FIGS. 9 and 10 are plane view and cross-sectional view for illustrating a cell array structure according to some embodiments of the present invention.
Figure 10:
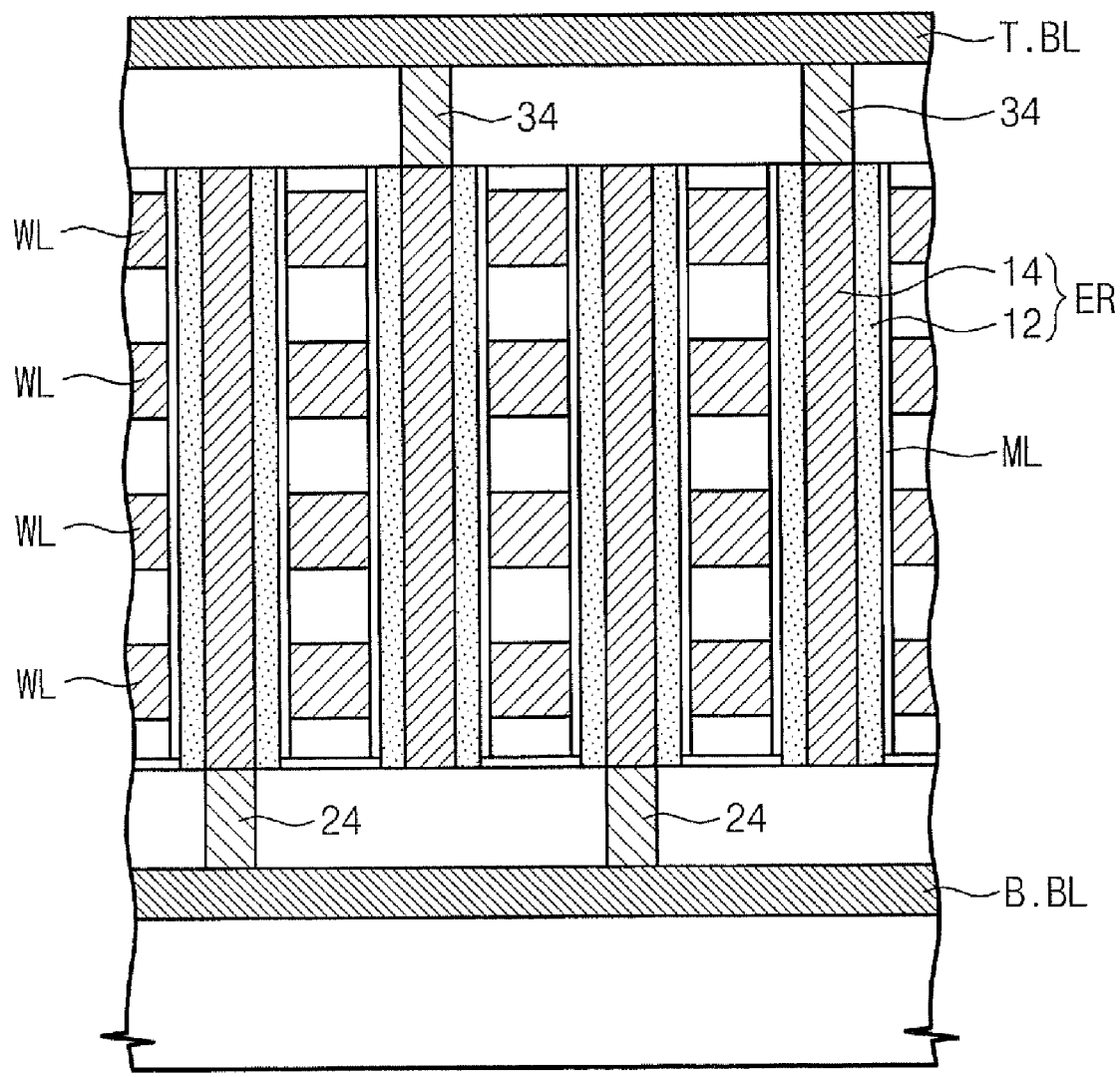

FIG. 8 is a circuit diagram for illustrating a cell array structure according to some other embodiments of the present invention, and FIGS. 9 and 10 are plane view and cross-sectional view for illustrating embodiments of FIG. 8. Specifically, FIG. 10 is a cross-sectional view taken along dotted line I-I' of FIG. 9.

Referring to FIGS. 8 through 10, the cell array structure may include top bit lines (T.BL) and bottom bit lines (B.BL) respectively arranged above and below the word line structures (WLS). The top bit lines (T.BL) and the bottom bit lines (B.BL) may be connected to different electrode regions (ER). For example, as shown in FIGS. 8 and 10, the top bit lines (T.BL) may be connected to tops of even-numbered electrode regions and the bottom bit lines (B.BL) may be connected to bottoms of odd-numbered electrode regions.

In this case, an electrical access to memory cell transistors using even-numbered electrode regions as source/drain electrodes may be achieved by selecting the top bit lines (T.BL). Similarly, an electrical access to memory cell transistors using odd-numbered electrode regions as source/drain electrodes may be achieved by selecting the bottom bit lines (B.BL). By separating these bit lines, it may be possible to uniquely select one memory cell without using a separate switching element. For example, by selecting one pair of adjacent top bit lines (T.BL) and one word line (WL), one of two memory cell transistors using the selected corresponding word line (WL) as a common gate electrode may be selected. Likewise, the other memory cell transistor may be independently selected by selecting one pair of adjacent bottom bit lines (B.BL).

As shown in FIG. 10, the bottom bit lines (B.BL) and the top bit lines (T.BL) may be connected to the electrode regions (ER) through plugs 24, 34. The plugs 24, 34 may include at least one selected from the group consisting of conductive materials (e.g., metallic materials, metal silicides, and/or polycrystalline silicon among others). In some embodiments, the electrode regions (ER) may include the channel region (CR), a semiconductor layer 12 contacting the memory layer (ML), and a plug electrode 14 inserted into the semiconductor layer 12. The plug electrode 14 may include at least one selected from the group consisting of conductive materials (e.g., metallic materials, metal silicides, and/or polycrystalline silicon among others), and may also include a barrier metal layer for ohmic contact with the semiconductor layer 12.

Some embodiments provide that the plugs 24, 34 or the plug electrodes 14 may be optional to achieving the technical spirits of the present invention and may be realized through variously modified embodiments.

Figure 11:
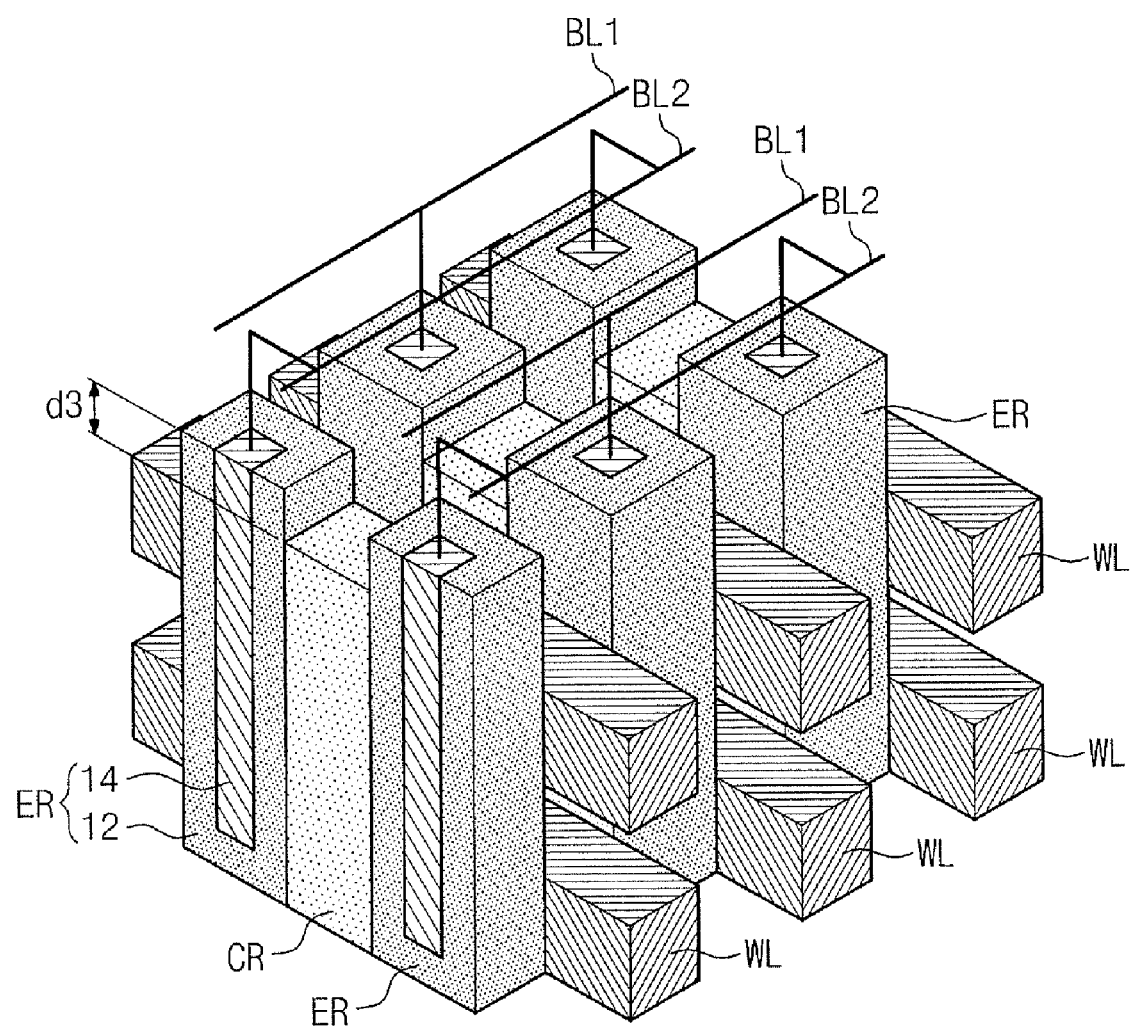
FIGS. 11 and 12 are perspective views for illustrating a cell array structure according to some embodiments of the present invention.
Figure 12:
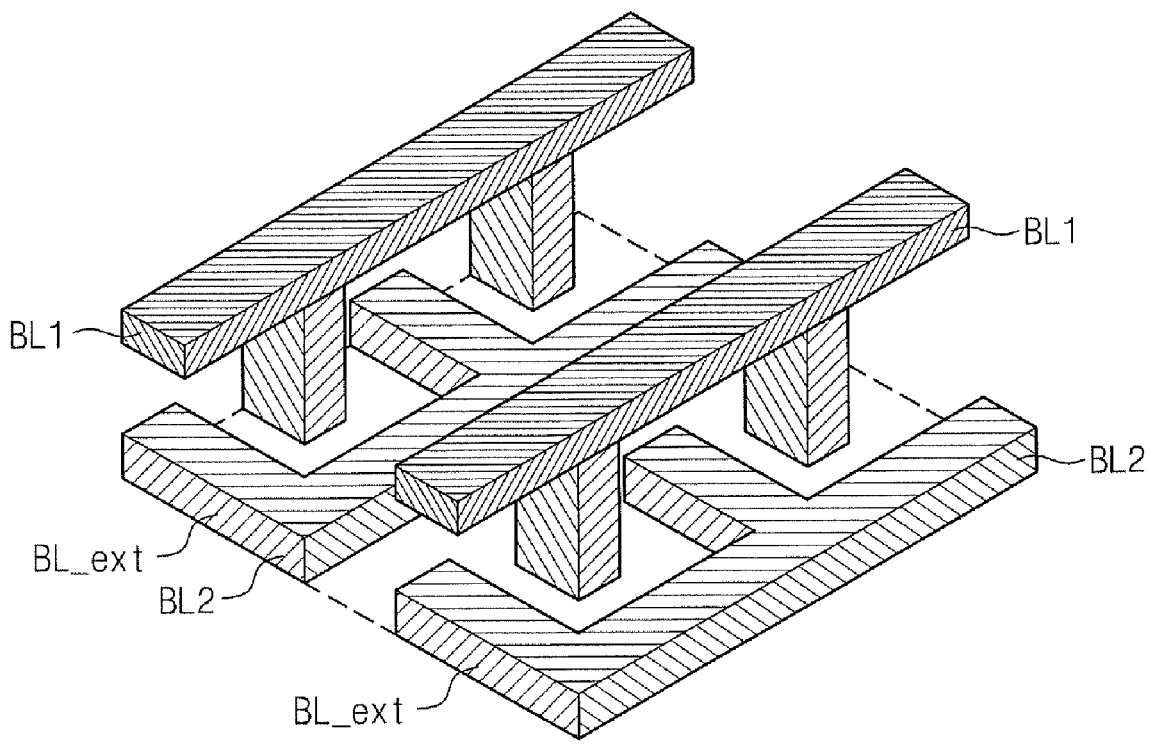

FIGS. 11 and 12 are perspective views for illustrating a cell array structure according to some modified embodiments of the present invention.

Referring to FIG. 11, the cell array structure may include first bit lines (BL1) disposed at a top of the word line structure (WLS) and second bit lines (BL2) disposed at a bottom of the word line structure (WLS). The first and second bit lines (BL1, BL2) may be connected to top regions of even-numbered electrode regions and odd-numbered electrode regions. For this purpose, as shown in FIG. 12, the second bit lines (BL2) may be disposed between the first bit lines (BL1), and may extend below the first bit lines (BL1) to include extending portions (BL2_ext) connected to the odd-numbered electrode regions. That is, the first bit lines (BL1) may be disposed above the electrode regions (ER) to cross the word lines (WL) and the second bit lines (BL2) may be disposed above the channel regions (CR) to cross the word lines (WL).

Meanwhile, for electrical separation between the second bit lines (BL2) and the channel regions (CR), a top surface of the channel region (CR) may be spaced apart by a predetermined distance (d3) from a bottom surface of the second bit line (BL2), as shown in FIG. 11. In this case, for electrical connection between the second bit line (BL2) and the electrode regions (ER), the electrode regions (ER) and the channel region (CR) may be formed so as to have a height difference corresponding to the above distance (d3). According to some embodiments, the second bit line (BL2) and the electrode regions (ER) may be electrically connected through separate plugs (e.g., plug 34 of FIG. 10) disposed between the second bit line (BL2) and the electrode regions (ER).

FIGS. 13 through 18 are perspective views for illustrating structures of the electrode regions according to some embodiments of the present invention.

Figure 13:
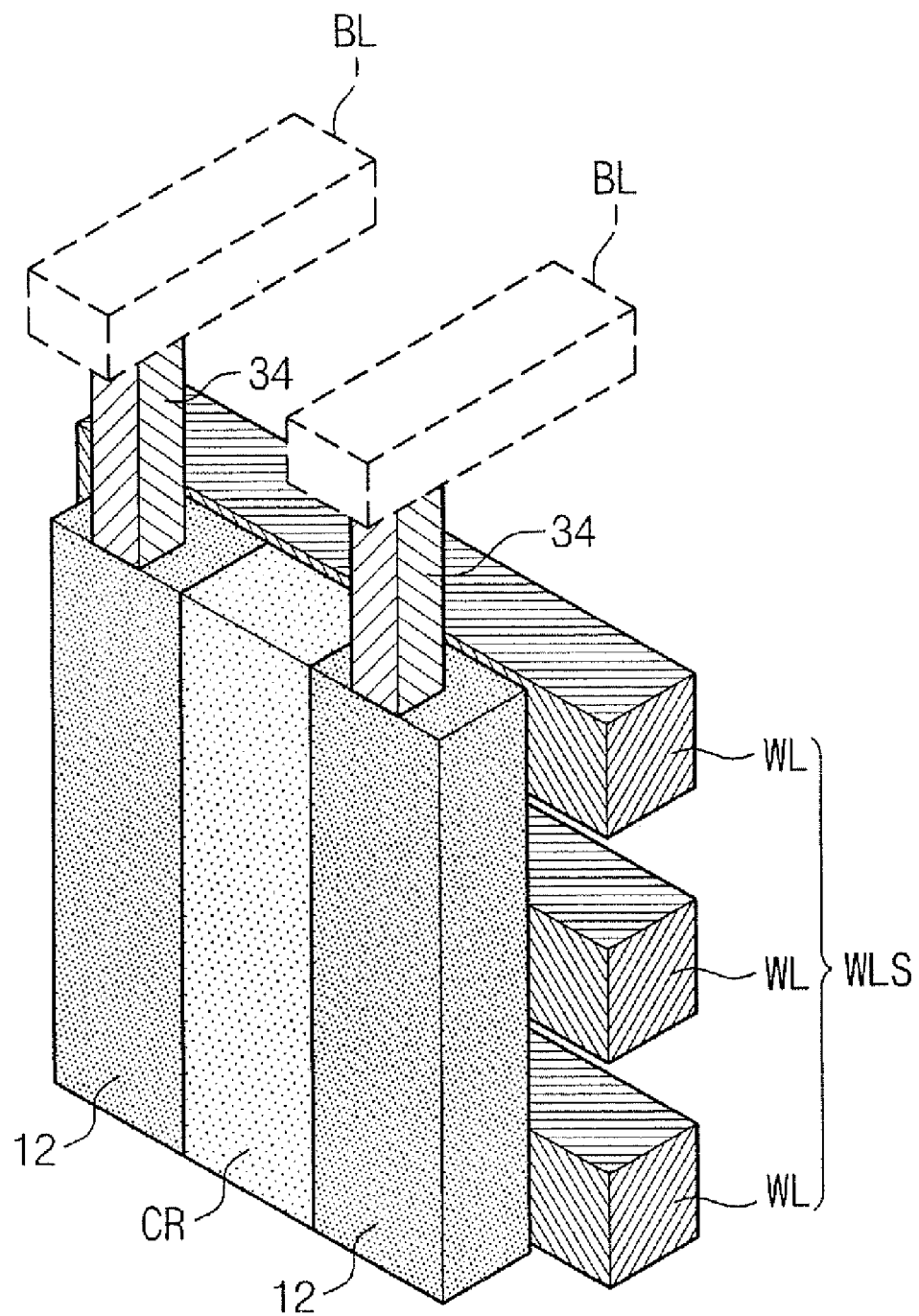
FIGS. 13 through 18 are perspective views for illustrating structures of the electrode regions according to some embodiments of the present invention.
Figure 14:
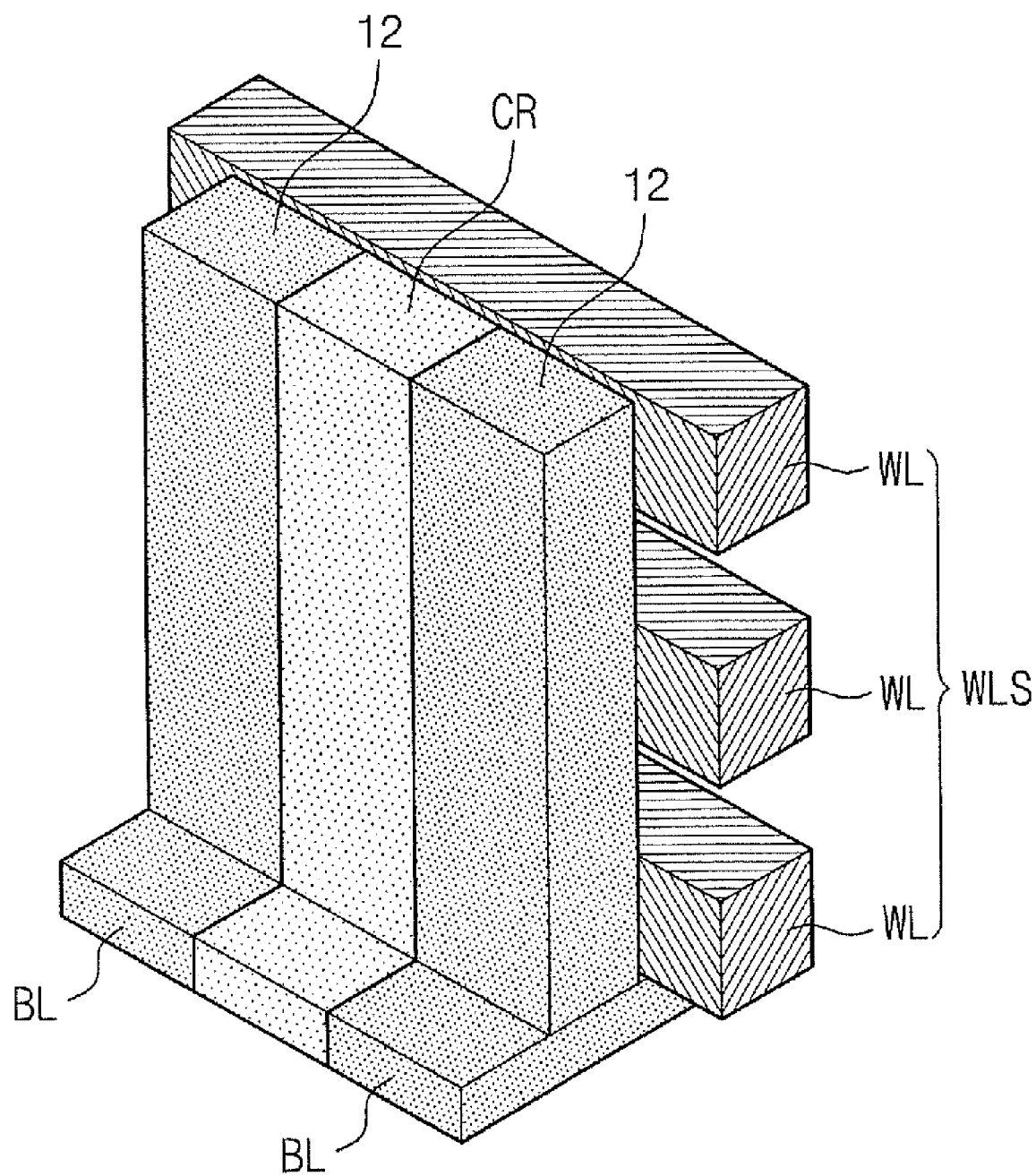
Figure 15:
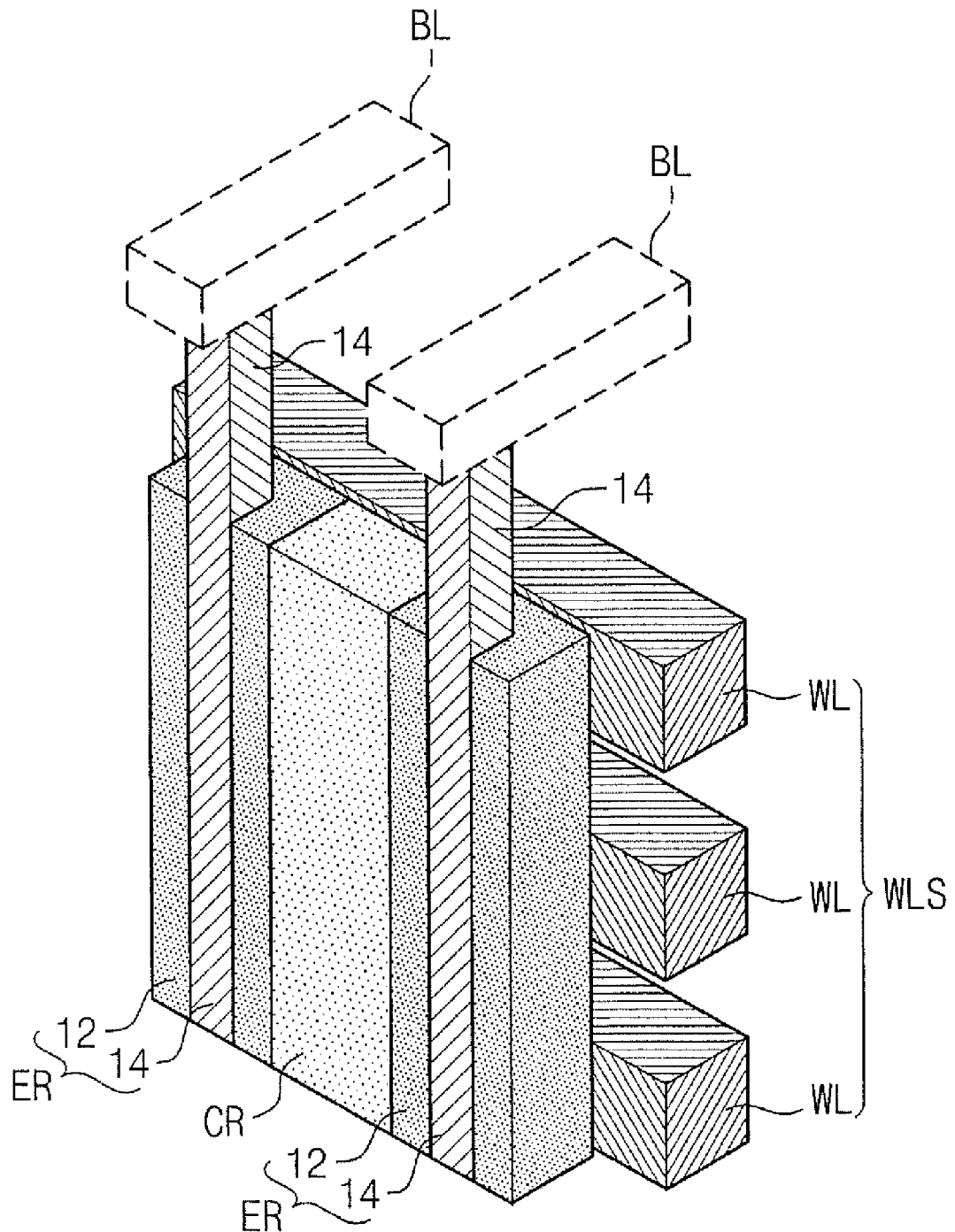

Referring to FIGS. 13 and 14, the electrode region may include a semiconductor layer 12 contacting the channel region (CR). The semiconductor layer 12 may be a semiconductor having a conductive type different from the channel region (CR). For example, the channel region (CR) may be a lightly doped p-type silicon, and the semiconductor layer 12 of the electrode region (ER) may be a heavily doped n-type silicon. Here, the channel region (CR) and the semiconductor layer 12 may have a single crystalline structure and/or a polycrystalline structure.

As shown in FIG. 13, in the case where the bit line (BL) is disposed above the electrode regions (ER), as aforementioned, the bit line (BL) may be connected to a top region of the electrode region (ER) through a top plug 34. As shown in FIG. 14, in the case where the bit line (BL) is disposed below the electrode regions (ER), the bit line (BL) may be directly connected to a bottom region of the electrode region (ER). However, as shown in FIG. 10, the bit line (BL) and the electrode region (ER) may be electrically connected through a separate bottom plug 24.

Referring to FIGS. 15 through 18, as in embodiments described above regarding FIGS. 10 and 11, the electrode region (ER) may include a semiconductor layer 12 contacting the channel region (CR), and a plug electrode 14 inserted into the semiconductor layer 12. The plug electrode 14 may penetrate the semiconductor layer 12, or may be inserted into the semiconductor layer 12 so as to have a bottom surface lower than a top surface of the lowest word line (WL), as shown in FIG. 13.

The semiconductor layer 12 may be a semiconductor having a different conductive type from the channel region (CR). For example, the channel region (CR) may be a lightly doped p-type silicon, and the semiconductor layer 12 of the electrode region (ER) may be a heavily doped n-type silicon. Here, the channel region (CR) and the semiconductor layer 12 may have a single crystalline structure and/or a polycrystalline structure. Although the semiconductor layer 12 of the electrode region (ER) may include impurities at a high concentration to thus have conductivity, some embodiments provide that the semiconductor layer 12 may have a resistivity higher than metal.

The plug electrode 14 may be formed of one selected from the group of consisting of materials having a resistivity relatively lower than the semiconductor layer 12. For example, the plug electrode 14 may be at least one selected from the group consisting of metallic materials, metal nitrides and/or metal silicides, among others. In this case, technical issues, such as low operation speed and/or high power consumption due to high resistivity of the semiconductor layer 12 may be decreased.

Some embodiments provide that a difference in material kind between the semiconductor layer 12 and the plug electrode 14 may make it possible to form a non-ohmic contact therebetween. According to some embodiments, the plug electrode 14 may include materials (e.g., metal nitrides) for ohmic contact in order to address such technical problems.

In some embodiments, the plug electrode 14 may have a top surface higher than the semiconductor layer 12. Accordingly, in embodiments described above regarding, for example, FIG. 10, the top plug 34 connecting the top bit line (T.BL) with the electrode region (ER) may be formed simultaneously with the plug electrode 14 by utilizing the process for forming the plug electrode 14.

Figure 16:
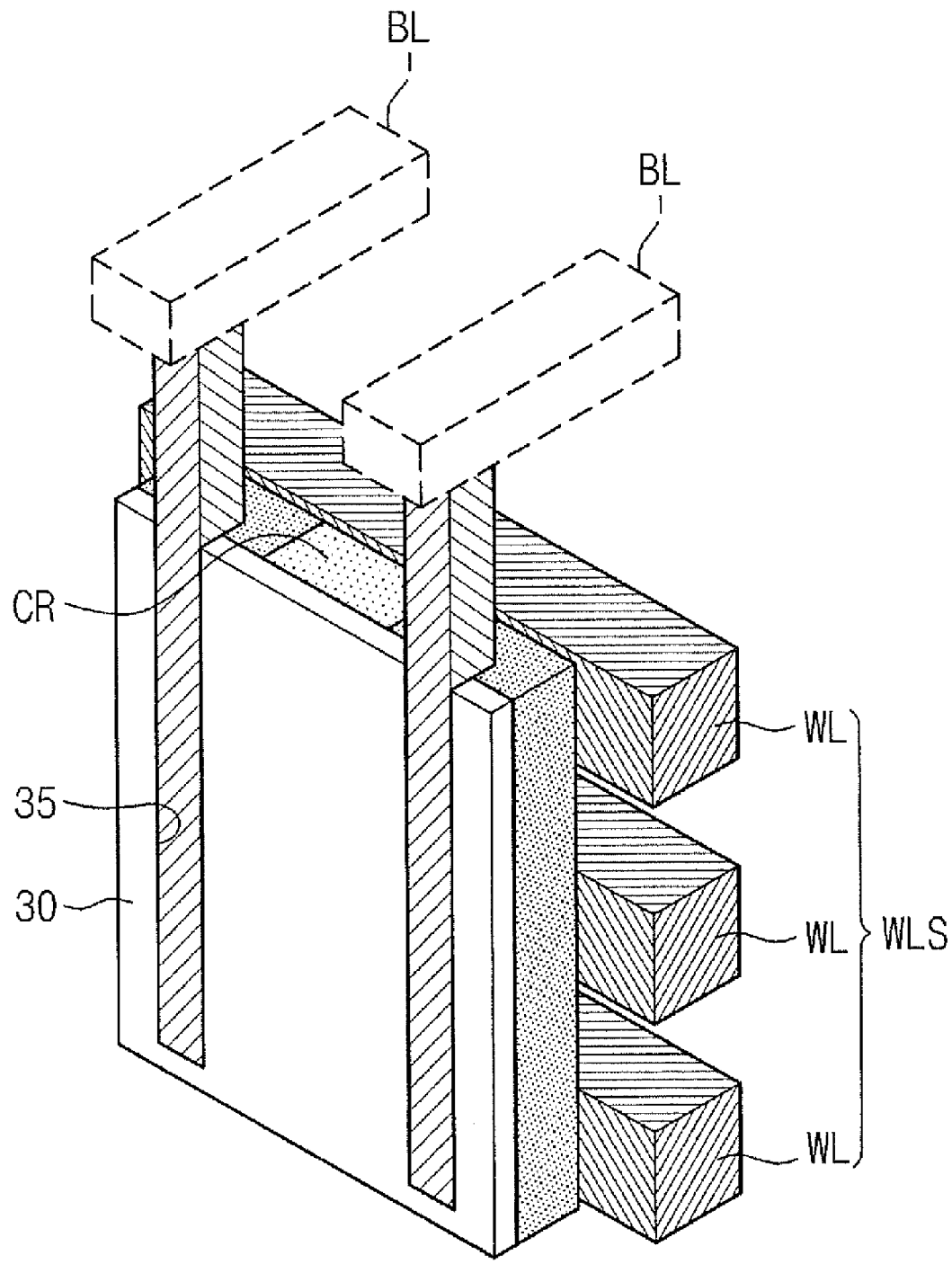

As shown in FIG. 16, an insulating layer 30 may be further formed between the word line structures (WLS). The channel regions (CR) and the electrode regions (ER) may be interposed between the insulating layer 30 and the word line structures (WLS). For example, in the case where the channel regions (CR) and the electrode regions (ER) are formed at conformal thicknesses using a vapor deposition technique, a gap region may be further formed between the word line structures (WLS) and be filled with the insulating layer 30. In this case, forming the plug electrode 14 may include patterning the insulating layer 30 to form holes 35 exposing inner walls of the electrode region (ER) and filling the holes with a conductive material.

At least some of the bit lines (BL) may be connected to bottom regions of the electrode regions at a bottom of the word line structure (WLS). In this case, the bit lines (BL) may be an impurity region formed in a substrate and/or a separate conductive pattern formed on the substrate. In the case where the bit lines (BL) are formed of a material different from the semiconductor layer 12, a thin layer (e.g., metal nitrides) for ohmic contact may be further formed between the bit line (BL) and the semiconductor layer 12.

Figure 19:
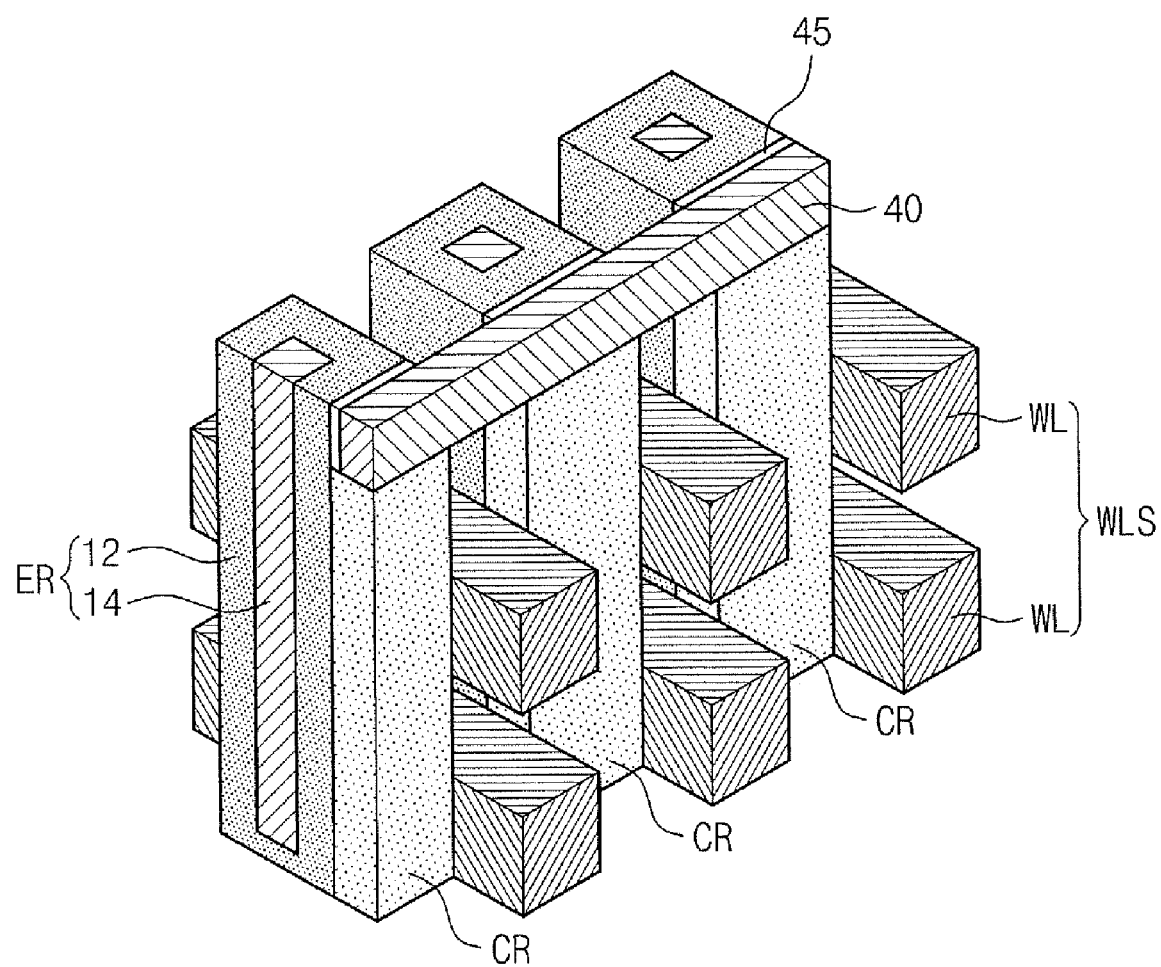
FIG. 19 is a perspective view for illustrating an electrical connection of channel regions according to some embodiments of the present invention.

FIG. 19 is a perspective view for illustrating an electrical connection of channel regions according some embodiments of the present invention.

Referring to FIG. 19, the channel regions (CR) may be electrically connected to a well pick-up line 40 disposed thereon. Accordingly, potentials of the channel regions (CR) can be controlled by the well pick-up line 40. According to some embodiments, the well pick-up line 40 crosses the word lines (WL) and electrically connects the channel regions (CR). For electrical separation between the well pick-up line 40 and the electrode regions (ER), an insulating material may be further interposed therebetween.

Figure 17:
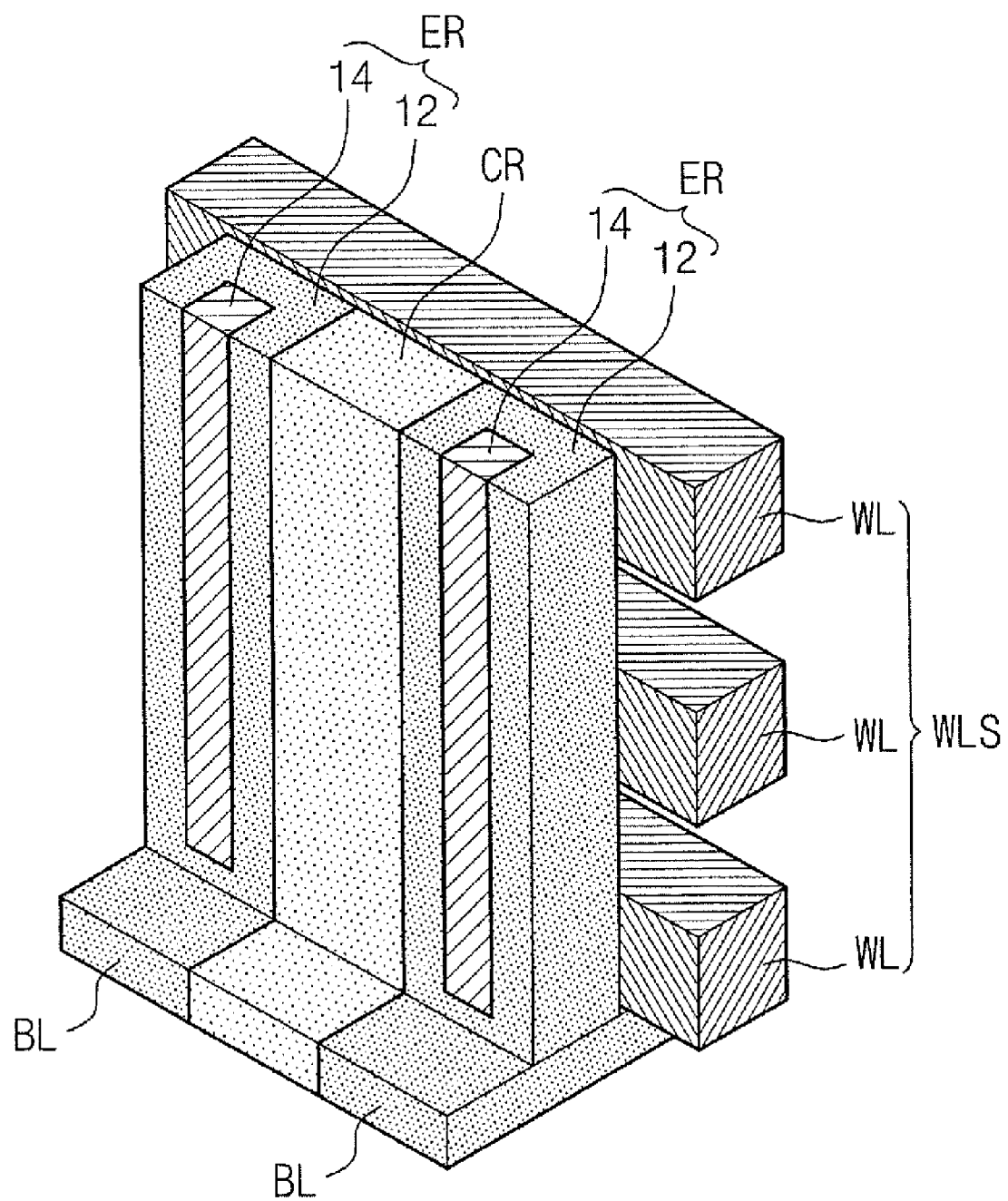
Figure 18:
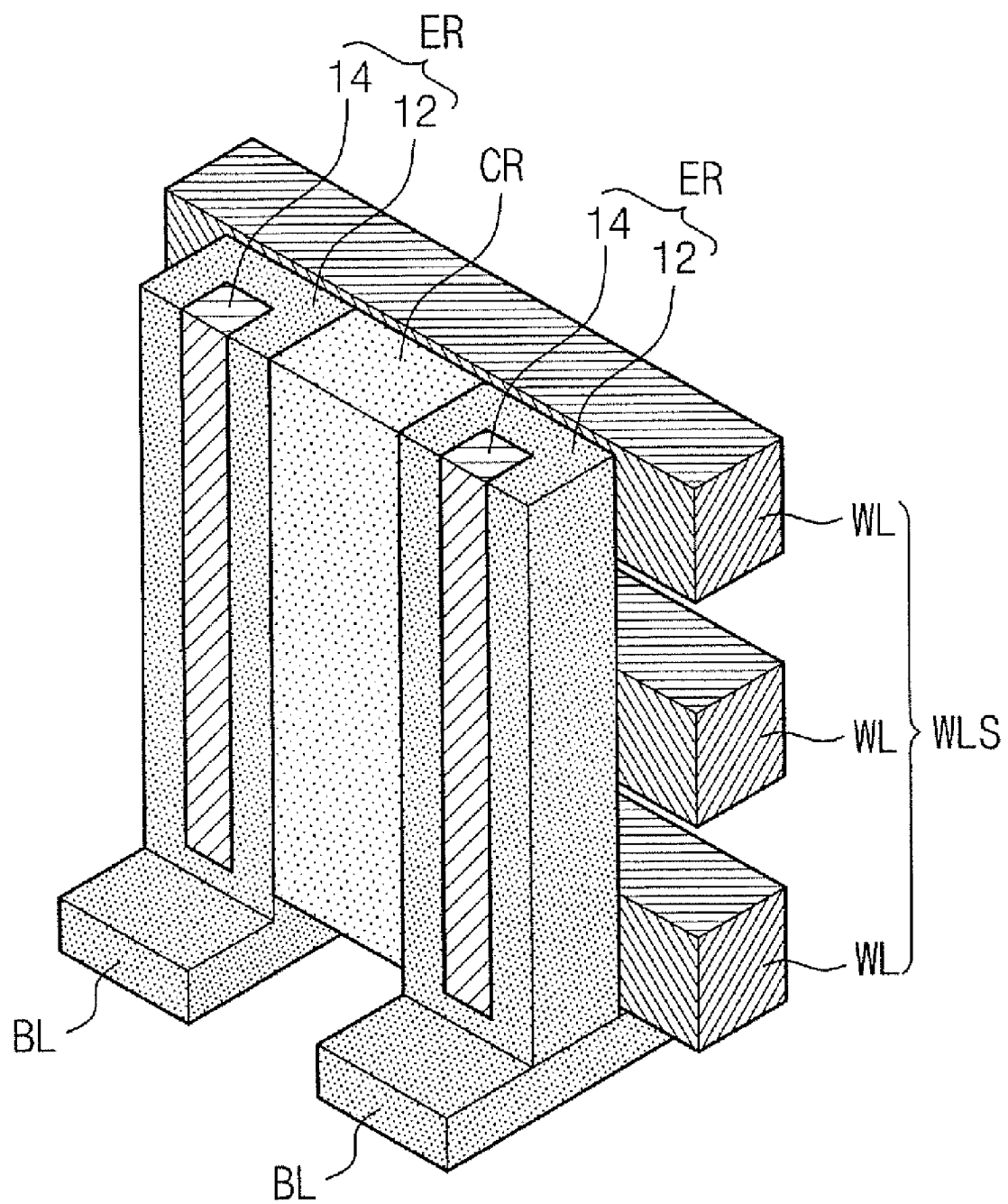

In some embodiments, as shown in FIG. 17, the channel regions (CR) may be electrically connected to a substrate (or a well region formed in the substrate). In this case, the potential of the substrate or the well region may be controlled by separate pick-up lines (not shown) formed on a predetermined region of the cell array region.

Figure 20:
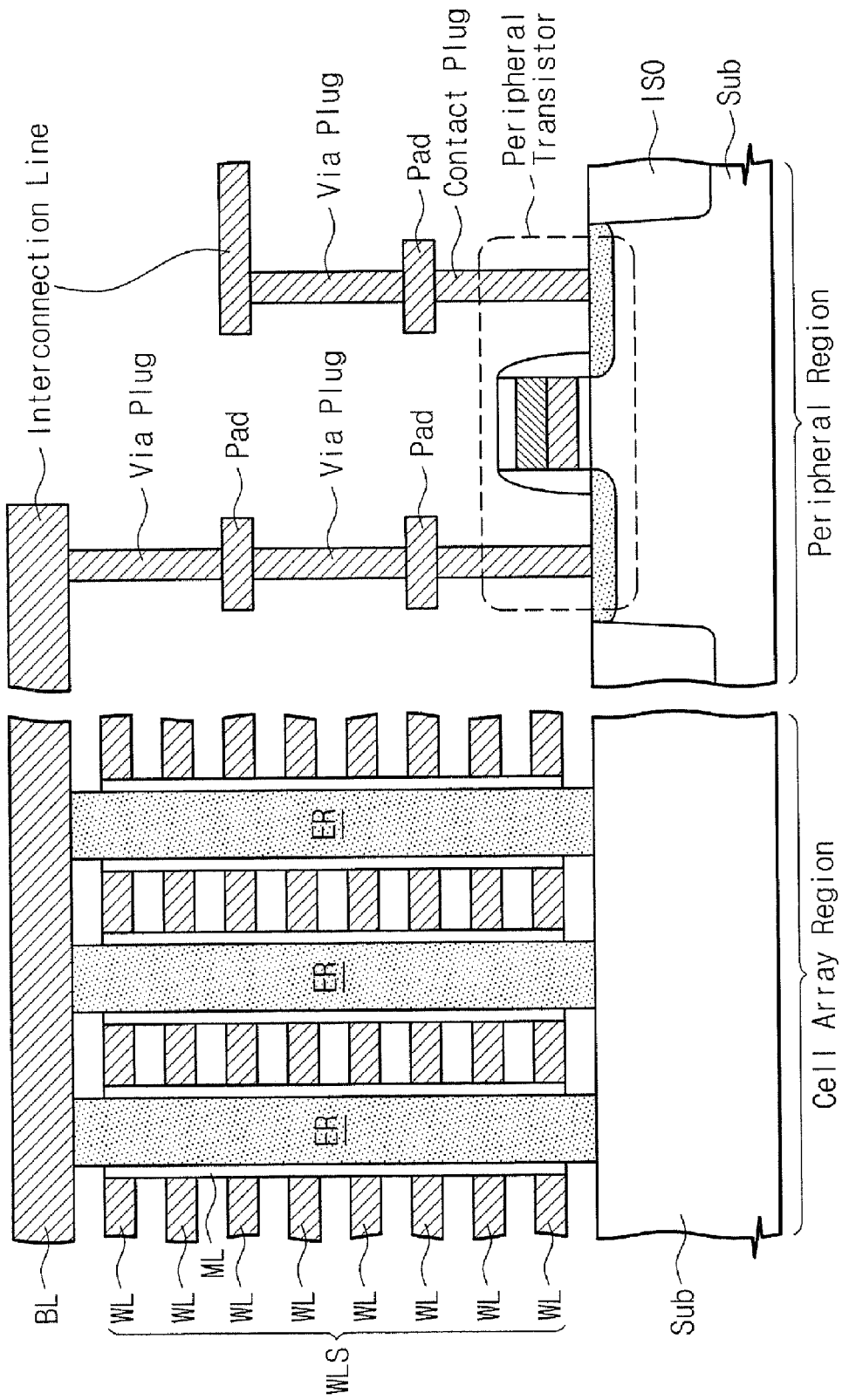
FIG. 20 is a cross-sectional view for illustrating one technical aspect of some embodiments of the present invention.

FIG. 20 is a cross-sectional view for illustrating one technical aspect of some embodiments according to the present invention.

Referring to FIG. 20, the substrate (Sub) may include a cell array region and a peripheral region. On the cell array region, the memory cell transistors described with reference to FIGS. 1 through 19 may be three-dimensionally arranged. That is, the cell array region may include the word line structures (WLS), the active semiconductor patterns (ASP), the memory layers (ML), and/or the bit lines (BL) constituting the aforementioned cell array structure.

On the peripheral region, functional circuits (e.g., decoder, amplifying circuit, sensing circuit, etc.) operating the memory cell transistors may be disposed and may include a peripheral transistor integrated on the substrate (Sub) as exemplarily shown in FIG. 20. The peripheral transistor may be electrically connected to the memory cell transistor through an interconnection line structure and the interconnection line structure may include a contact plug, a pad, a via plug and/or an interconnection line, which may be connected to electrodes of the peripheral transistor.

According to some embodiments, the cell array may be formed at a level substantially higher than a top surface of the substrate (Sub) of the peripheral region. For example, a bottom surface of the word line structure (WLS) may be higher than the top surface of the substrate (Sub) on which the peripheral transistor is integrated. As will be described below with reference to FIGS. 21 through 24, since the word line structures (WLS) may be formed by depositing thin layers on the substrate (Sub) and patterning the deposited thin layers, vertical level of the cell array according to the present invention may be higher than the top surface of the substrate (Sub).

In addition, after the word line structures (WLS) are formed, since the active semiconductor patterns (ASP) may be formed between the word line structures (WLS), the active semiconductor patterns (ASP) may be substantially different from the substrate (Sub) in terms of at least one of material kind, impurity concentration and/or crystal structure.

FIGS. 21 through 24 are perspective views for illustrating methods of manufacturing a semiconductor device according to some embodiments of the present invention.

Figure 21:
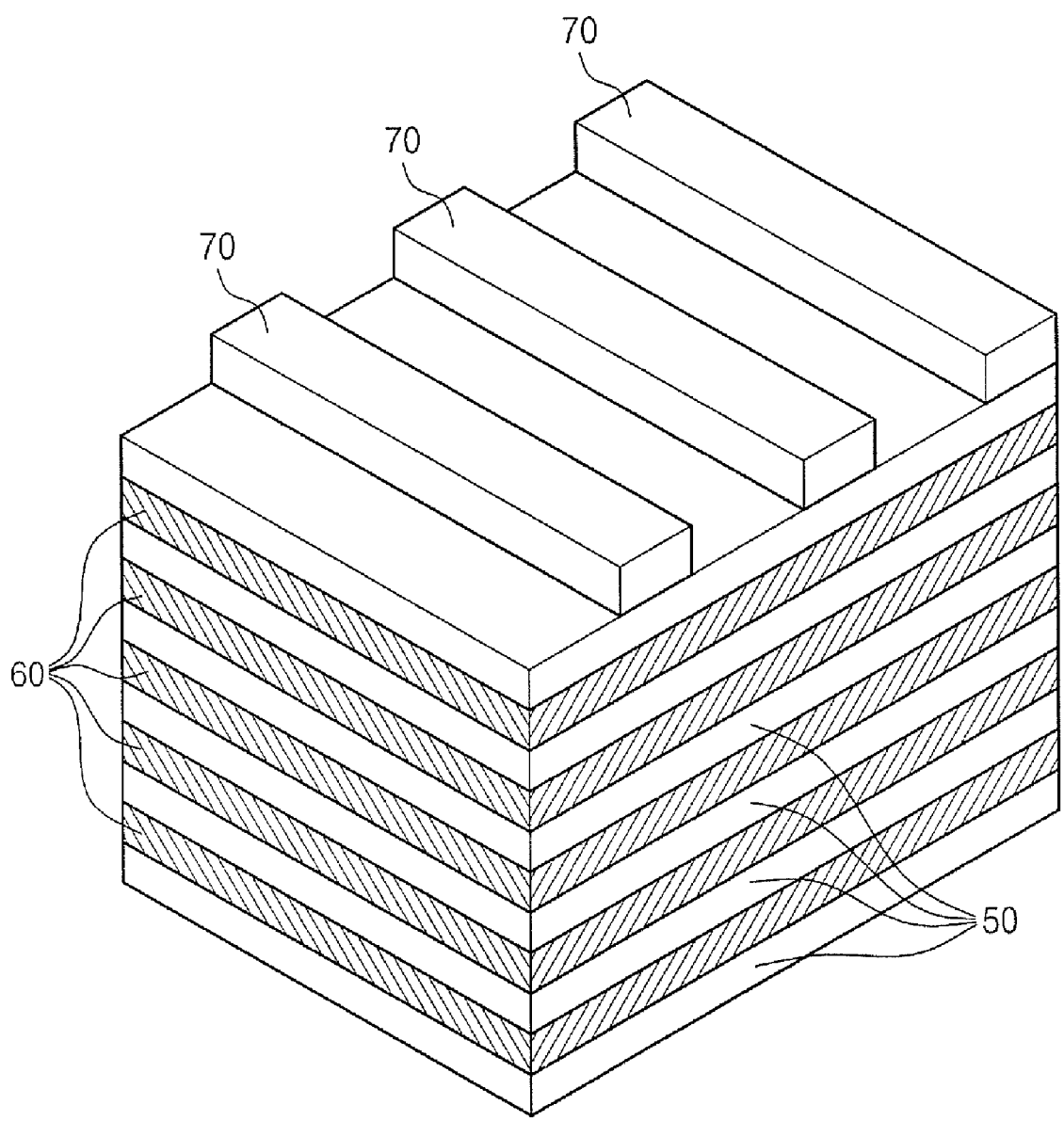
FIGS. 21 through 24 are perspective views for illustrating a method of manufacturing a semiconductor device according to some embodiments of the present invention.

Referring to FIG. 21, insulating layers 50 and conductive layers 60 may be sequentially and alternately deposited on a substrate. The insulating layers 50 and the conductive layers 60 may be formed by using, for example, one or more vapor deposition techniques. The insulating layers 50 may include at least one selected from the group consisting of a silicon oxide layer, a silicon nitride layer, a silicon oxynitride layer and/or low-k dielectrics, among others. The conductive layers 60 are thin layers which may be used as word lines (WL) and may include at least one selected from the group consisting of a heavily doped polysilicon layer, metal layers, metal silicide layers and/or metal nitride layers, among others.

On the conductive layers 60, mask patterns 70 having etch selectivity with respect to the insulating layers 50 and the conductive layers 60 may be formed. According to some embodiments, the mask patterns 70 may be photoresist patterns and may be formed in a line and/or stripe shape, as shown in the drawings.

Figure 22:
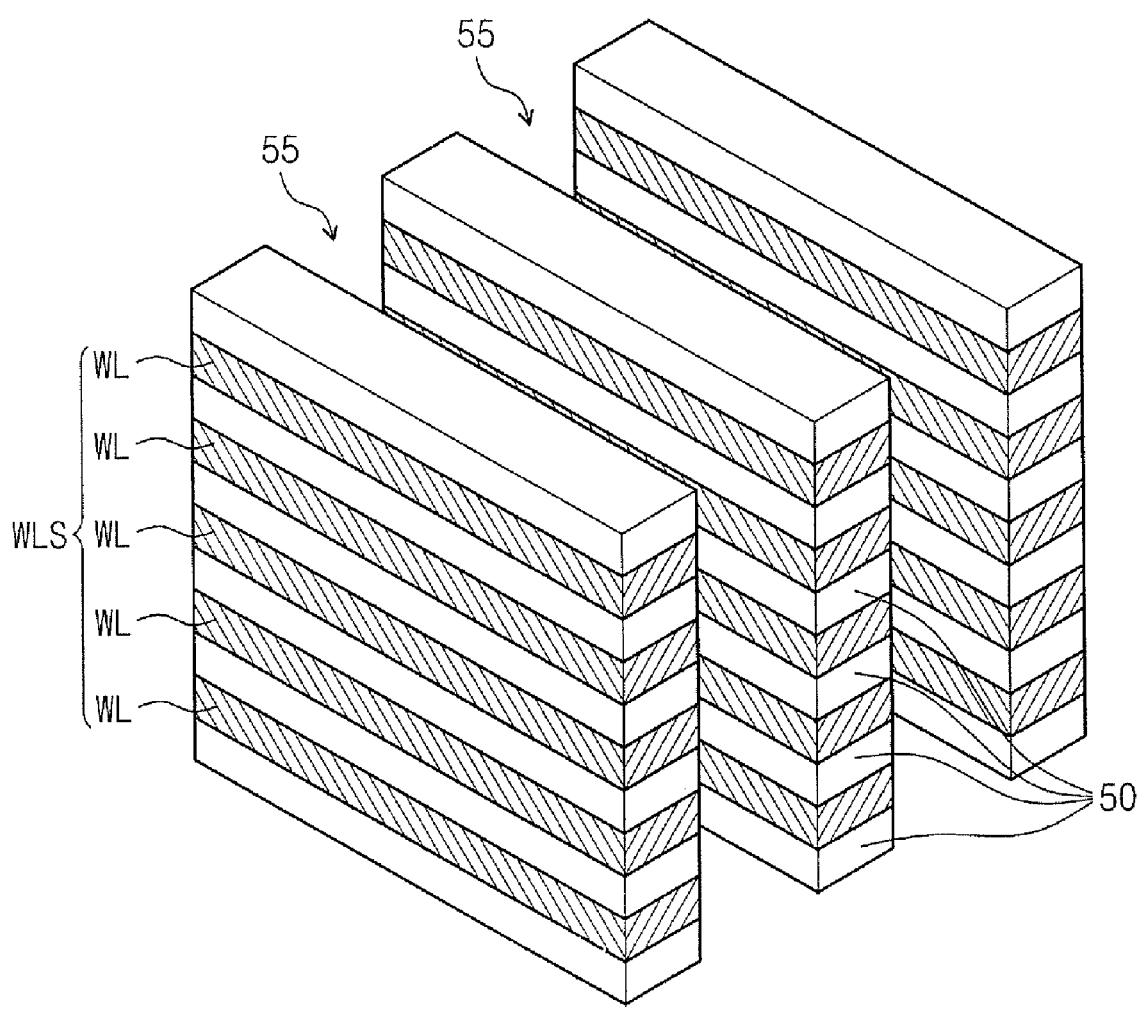

Referring to FIG. 22, the insulating layers 50 and the conductive layers 60 may be patterned using the mask patterns 70 as an etch mask to form line-shaped openings 55 defining shapes of the word lines (WL). That is, sidewalls of the word lines (WL) are exposed through the openings 55 and the word lines (WL) sequentially stacked between the two adjacent openings 55 constitute the aforementioned word line structure (WLS). Thereafter, the mask patterns 70 may be removed.

In some modified embodiments, the operation of sequentially and alternately depositing the insulating layers 50 and the conductive layers 60 and the operation of patterning the deposited insulating layers 50 and the conductive layers 60 to form the openings 55 may be alternately and repeatedly performed two or more times.

Figure 23:
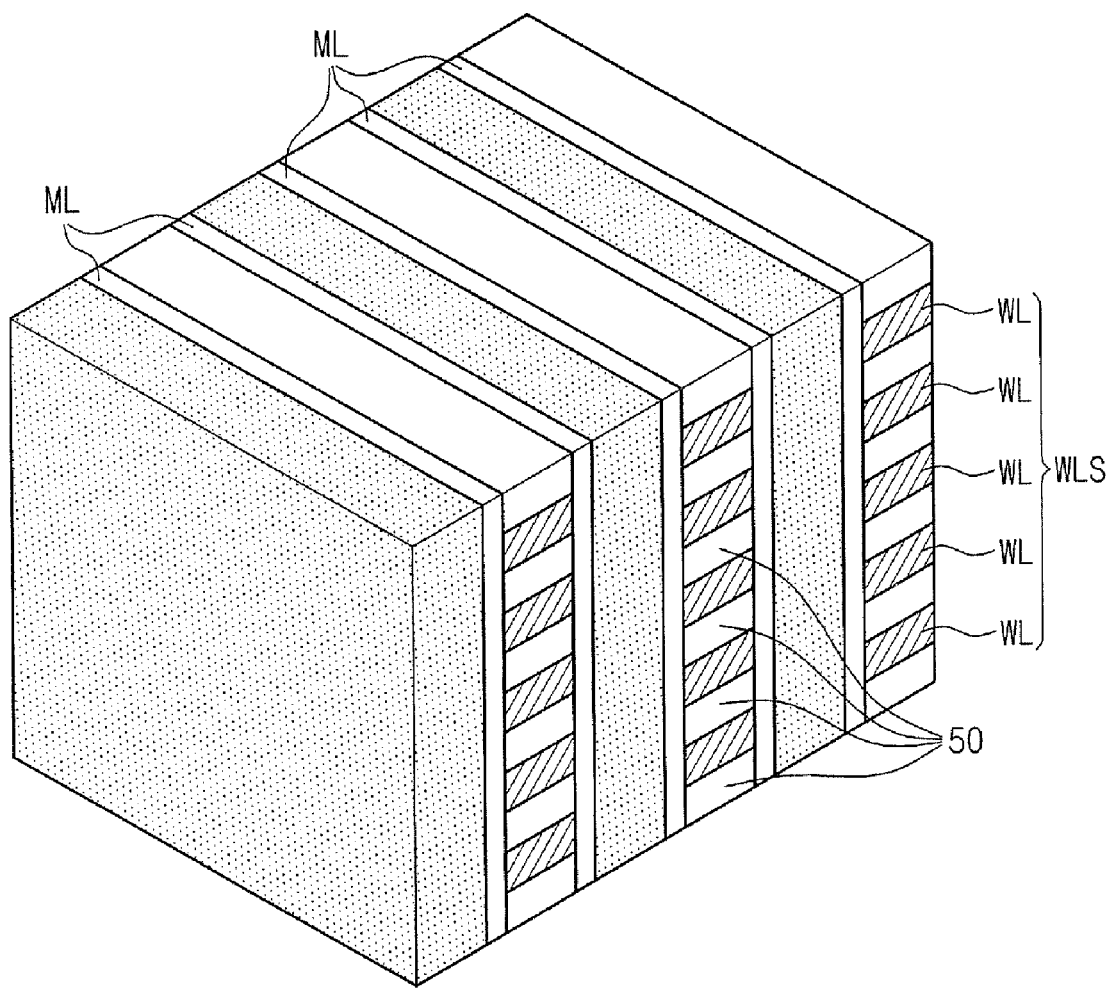

Referring to FIG. 23, a memory layer (ML) and a semiconductor layer 80 may be sequentially formed in the opening 55. According to some embodiments, the memory layer (ML) may include a charge storage layer. For example, the memory layer (ML) may include a silicon nitride layer, and may further include at least one selected from the group consisting of a silicon oxide layer and/or high-k dielectrics, among others.

The semiconductor layer 80 may be a semiconductor material containing first conductive type impurities at a low concentration. According to some embodiments, the semiconductor layer 80 may be a lightly doped p-type silicon layer formed by using a chemical vapor deposition. According to some other embodiments, the semiconductor layer 80 may be an epitaxial layer grown by using the substrate as a seed. In this case, prior to forming the semiconductor layer 80, the operation of etching the memory layer (ML) at the bottom of the opening 55 to expose a top surface of the substrate may be further performed so as to use the substrate as a seed layer. As described above with reference to FIGS. 5, 7 and 8, in the case of embodiments in which the electrode regions (ER) are electrically connected to the underlying bit lines (BL), the memory layer (ML) may be further etched at the bottom of the opening 55 for such an electrical connection.

Thereafter, an etch-back process of the semiconductor layer 80 and the memory layer (ML) may be further performed for node separation. In this case, the semiconductor layer 80 may be horizontally separated between the word line structures (WLS) as shown in the drawings. The blanket etch process may include a chemical mechanical polishing, which may use an etch recipe having an etch selectivity with respect to the insulating layer 50.

Figure 24:
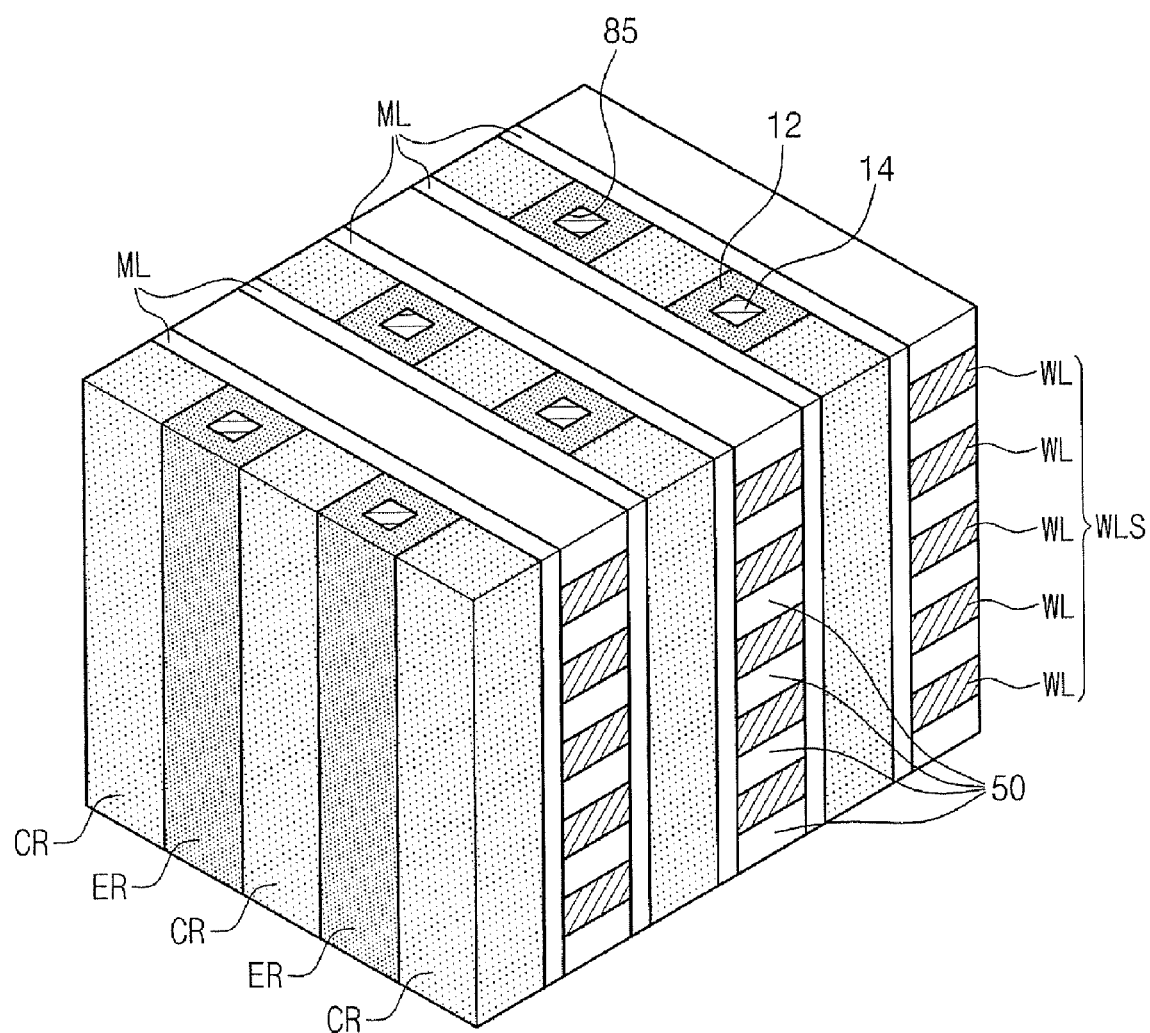

Referring to FIG. 24, the semiconductor layer 80 is patterned to form two-dimensionally arranged holes 85. The holes 85 may be formed deep such that bottom surfaces of the holes 85 are adjacent the lowest word line (WL) constituting the word line structure (WLS). Thereafter, second conductive type impurities may be implanted and/or diffused at a high concentration into an inner wall of the semiconductor layer 80 exposed through the holes 85, to form second conductive type semiconductor layers 12 in the semiconductor layer 80 positioned around the holes 80.

After a conductive material filling the holes 85 is formed, a node separation process may be performed to form the plug electrodes 14 connected to the semiconductor layers 80. The plug electrodes 14 may be formed of at least one selected from the group consisting of metallic materials, metal silicides, and/or metal nitrides, among others, and may include a barrier metal layer for the aforementioned ohmic contact.

According to some embodiments, after forming the plug electrodes 14, or prior to forming the conductive layers 60, an operation of forming bit lines for electrical connection with the electrode regions (ER) may be further performed.

According to some modified embodiments, in contrast with embodiments illustrated in FIG. 23, the semiconductor layer 80 may be substantially conformally formed, the thickness of which may be smaller than half of a spacing between the word line structures (WLS). In this case, gap regions, which may not be filled by the semiconductor layer 80, may be formed between one pair of adjacent word line structures (WLS). According to such modified embodiments, the gap regions may be filled with an insulating material 30, as in the embodiment described with reference to FIG. 16. In addition, prior to and/or after forming of the insulating material, holes exposing an inner wall of the gap region may be formed and then an ion implantation process and/or ion diffusion process may be performed for forming of the electrode regions (ER).

Figure 25:
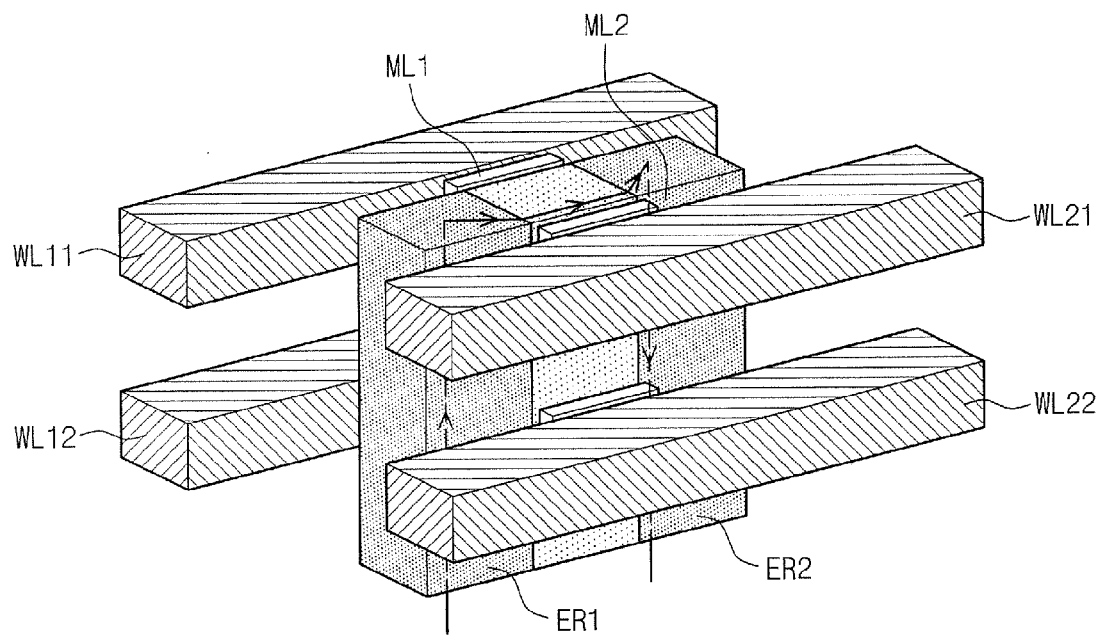
FIGS. 25 and 26 are perspective view and plane view for illustrating a method of operating a semiconductor device according to some embodiments of the present invention.
Figure 26:
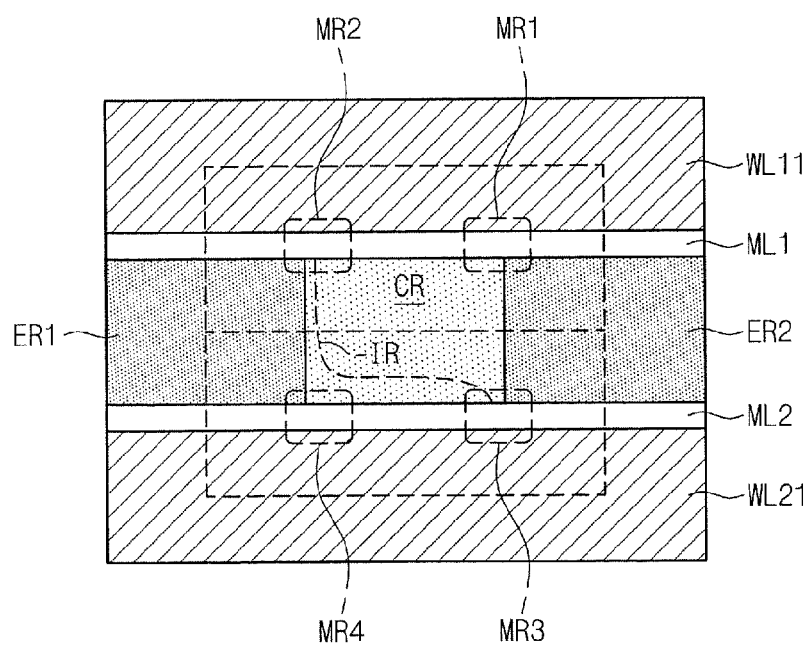
Figures 27, 28:
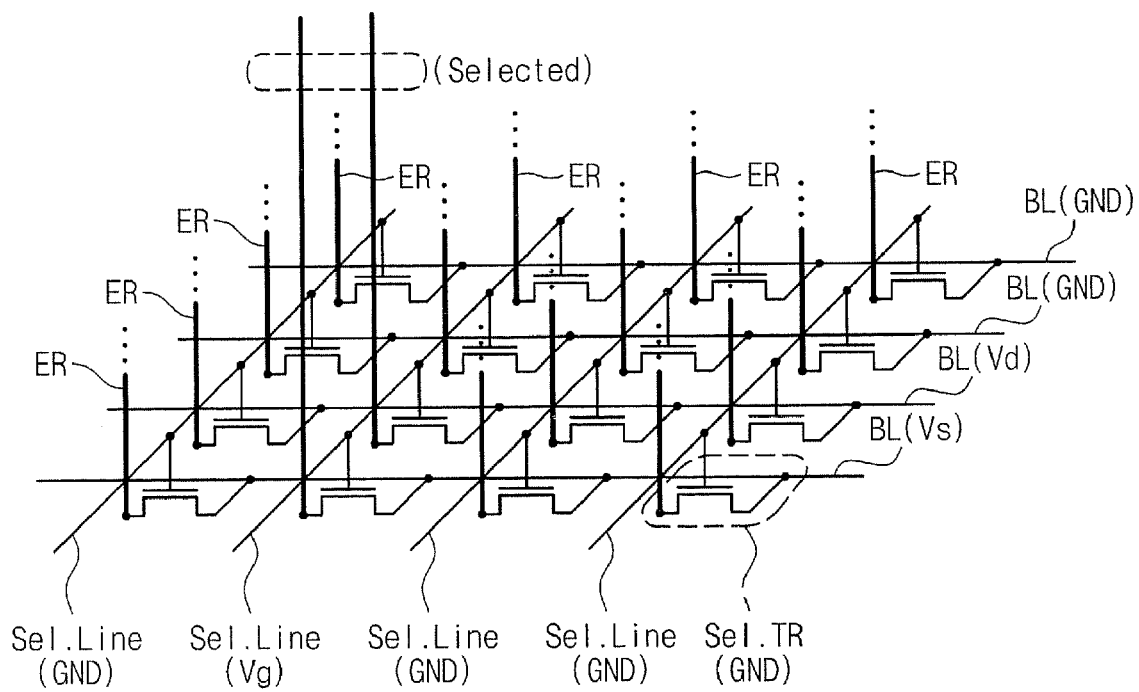
FIG. 27 is a table exemplarily showing a program method of a memory cell transistor according to some embodiments of the present invention.
FIGS. 28 and 29 are circuit diagrams exemplarily showing methods of selecting bit lines for the aforementioned four bit-programming.

FIGS. 25 and 26 are respectively perspective view and plane view for illustrating methods of operating a semiconductor device according to some embodiments of the present invention. FIG. 27 is a table showing an exemplary program method of a memory cell transistor according to some embodiments of the present invention.

Referring to FIGS. 25 and 26, when a voltage higher than a threshold voltage is applied to one of the word lines (e.g., WL21), an inversion region (IR) may be formed in one sidewall of a channel region adjacent to the one word line (WL21). Here, in the case where different voltages are applied to two adjacent electrode regions (ER1 and ER2), as described above with reference to FIG. 4, the electrode regions (ER1 and ER2) can be electrically connected through the inversion region (IR).

Meanwhile, when a difference between a voltage applied to one (e.g., ER2) of the electrode regions (ER1 and ER2) and a voltage applied to the selected word line (WL21) is smaller than a threshold voltage ($V_{th}$), the channel region of a corresponding memory cell transistor may be pinched-off. As described above with reference to FIG. 4, charges in a pinch-off region may have a high kinetic energy and thus can be locally injected into a memory region (MR3) adjacent the selected electrode region (ER2) of the corresponding memory layer (ML2). The methods of programming cell transistors of a memory device according to some embodiments of the present invention may use such a hot carrier injection.

When voltages applied to the electrode regions (ER1 and ER2) are exchanged, the portion where the pinch-off region is formed may also be changed. Accordingly charges may be locally injected into a memory region (MR4) adjacent the newly selected electrode region (i.e., ER1). As a result, according to this program method, two bits can be stored in one memory layer (ML2) between the selected word line (WL21) and the selected channel region (CR). In the case where another word line (WL11) adjacent to the selected channel region (CR) is selected, two bits can be likewise stored in another memory layer (ML1) adjacent to the selected word line (WL11). As a result, according to some embodiments of the present invention, one channel region (CR) between one pair of adjacent word lines may be commonly used during a programming for storing four bits in one channel region (CR).

Meanwhile, to prevent a non-intended program in a predetermined program operation, other word lines (WL11, WL12, WL22) adjacent to the selected word line (WL21) may be connected to a voltage (e.g., ground voltage) lower than the threshold voltage (Vth) or floated, as shown in FIG. 27.

Figure 29:
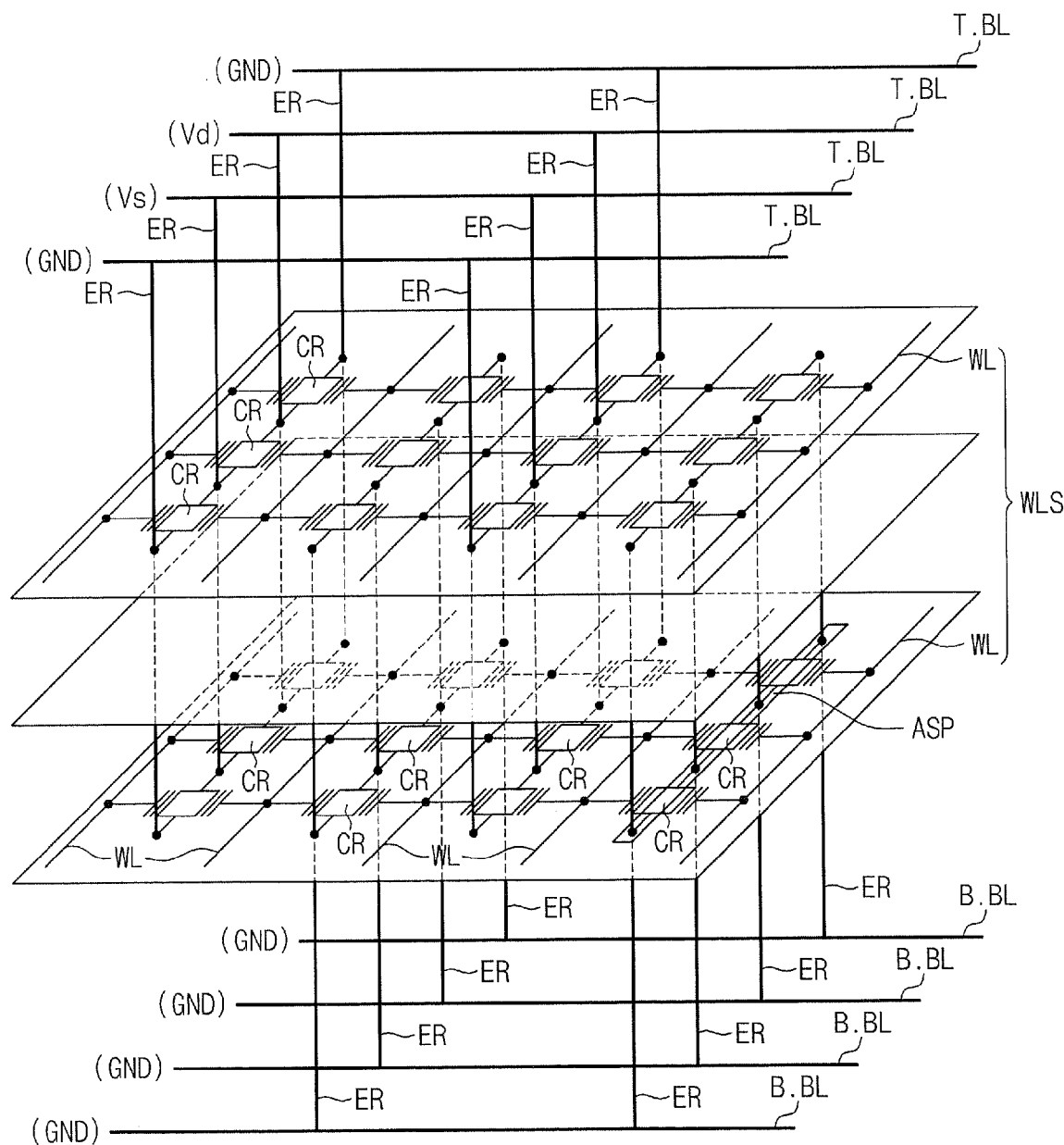

FIGS. 28 and 29 are circuit diagrams showing exemplary methods of selecting bit lines for the aforementioned four bit bit-programming. It will be understood that these circuit diagrams are provided as examples illustrating the technical spirit of the present invention. In this regard, the application voltage, operation method and the like may be variously modified.

Referring to FIG. 28, a gate voltage (Vg) that can turn on a corresponding select transistor may be applied to a predetermined select line (Sel.Line) and a ground voltage may be applied to another select line. Source voltage (Vs) and drain voltage (Vd) may be respectively applied to the adjacent two bit lines (BL). A ground voltage (GND) may be applied to another bit line (BL). Some embodiments provide that the source and drain voltages (Vs, Vd) may be selected so as to cause the pinch-off phenomenon. In such embodiments, as shown in the drawing, one pair of adjacent electrode regions (ER) may be selected and the source and drain voltages (Vs, Vd) may be applied to the respective electrode regions (ER).

Referring to FIG. 29, source voltage (Vs) and drain voltage (Vd) may be applied to one pair of adjacent top select lines (e.g., T.BL2, T.BL3), respectively. A ground voltage (GND) may be applied to other top select lines (T.BL1, T.BL4). In this case, the source and drain voltages (Vs and Vd) can be selectively applied to electrode regions (ER) connected to the selected top select lines (T.BL2, T.BL3). Accordingly, when program voltage (Vpgm) is applied to one of the word lines, only one memory cell commonly adjacent a selected word line (WL) and selected electrode regions (ER) may be programmed.

FIGS. 30 and 31 are tables for illustrating read and write operations of a semiconductor memory device according to some embodiments of the present invention. However, it can be understood that these tables are simply provided by way of example to describe some embodiments. In this regard, application voltage, etc., may be variously modified.

Referring to FIG. 30, according to the aforementioned program method, one memory layer between the selected word line and the selected channel region (CR) includes first and second memory regions (MR1 and MR2) which may be discriminated from each other and thus may store two bits. A read operation according to some embodiments may include sensing variation of current via a corresponding memory cell transistor by charges stored respectively in the first and second memory regions (MR1 and MR2). For this operation, read voltage may be applied to the selected word line and ground voltage may be applied to non-selected word lines. Ground voltage (GND) and drain voltage (Vd) of less than about 1 volt may be applied to the electrode regions (ER1 and ER2) of the selected memory cell transistor, respectively. Similar to the program operation, the voltages applied to the electrode regions (ER1, ER2) may be changed during the operation of reading information stored in the first memory region and the operation of reading information stored in the second memory region.

Referring to FIG. 31, an erase operation according to some embodiments may include generating a potential difference, which may cause Fowler-Nordheim Tunneling between the word lines (WL) and the channel region (CR), to release charges injected into the memory regions (MR1, MR2). For this purpose, ground voltage may be applied to all the word lines (WL) in a selected block, erase voltage (Vers) may be applied to all the channel regions in the selected block, and all the electrode regions (ER) in the selected block may be made to a floating state. In this case, substantially all of the memory cells in the selected block may be substantially erased at the same time. According to some modified embodiments, a method of applying the erase voltage (Vers) to all the electrode regions (ER) in the selected block may be employed.

FIGS. 32 through 39 are circuit diagrams and perspective views for illustrating cell array of semiconductor memory devices according to some modified embodiments of the present invention. The cell arrays according to these modified embodiments may be similar to those in the embodiments described above except for technical features related to an electrical separation between bit lines or word lines. Accordingly, for simplification of description, descriptions of technical features of the aforementioned embodiments may be omitted. Additionally, the cell arrays of the semiconductor memory devices according to some embodiments may include two or more word lines (WL) positioned at different levels. However, to avoid the complexity, FIGS. 32, 34 and 37 exemplarily show only word lines and memory cells, which may be formed at a single layer.

Figure 32:
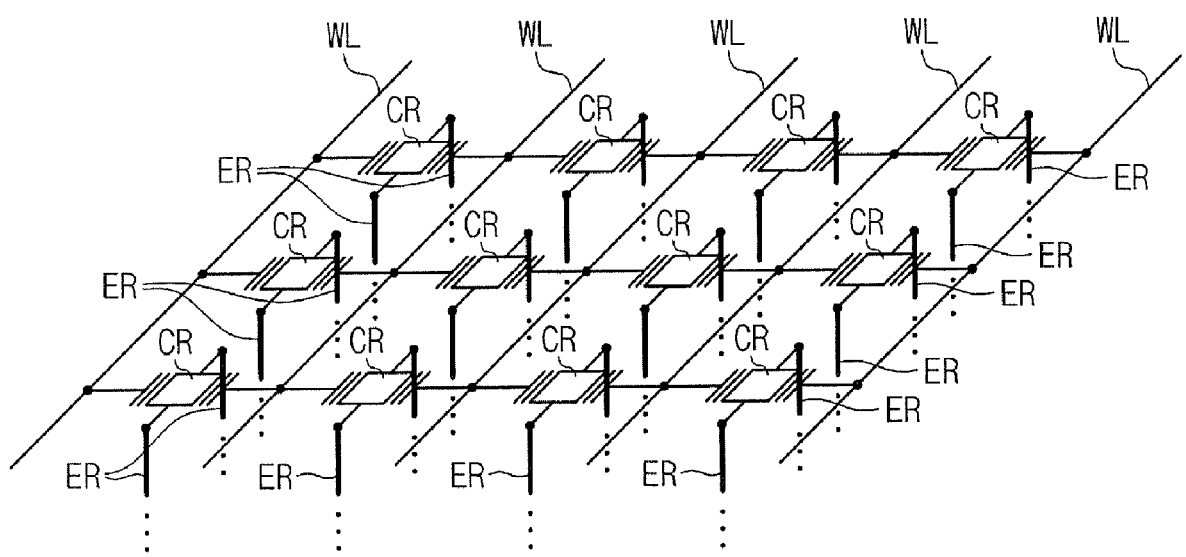
FIGS. 32 and 33 are circuit diagram and perspective view for illustrating a cell array of a semiconductor memory device according to some embodiments of the present invention.
Figure 33:
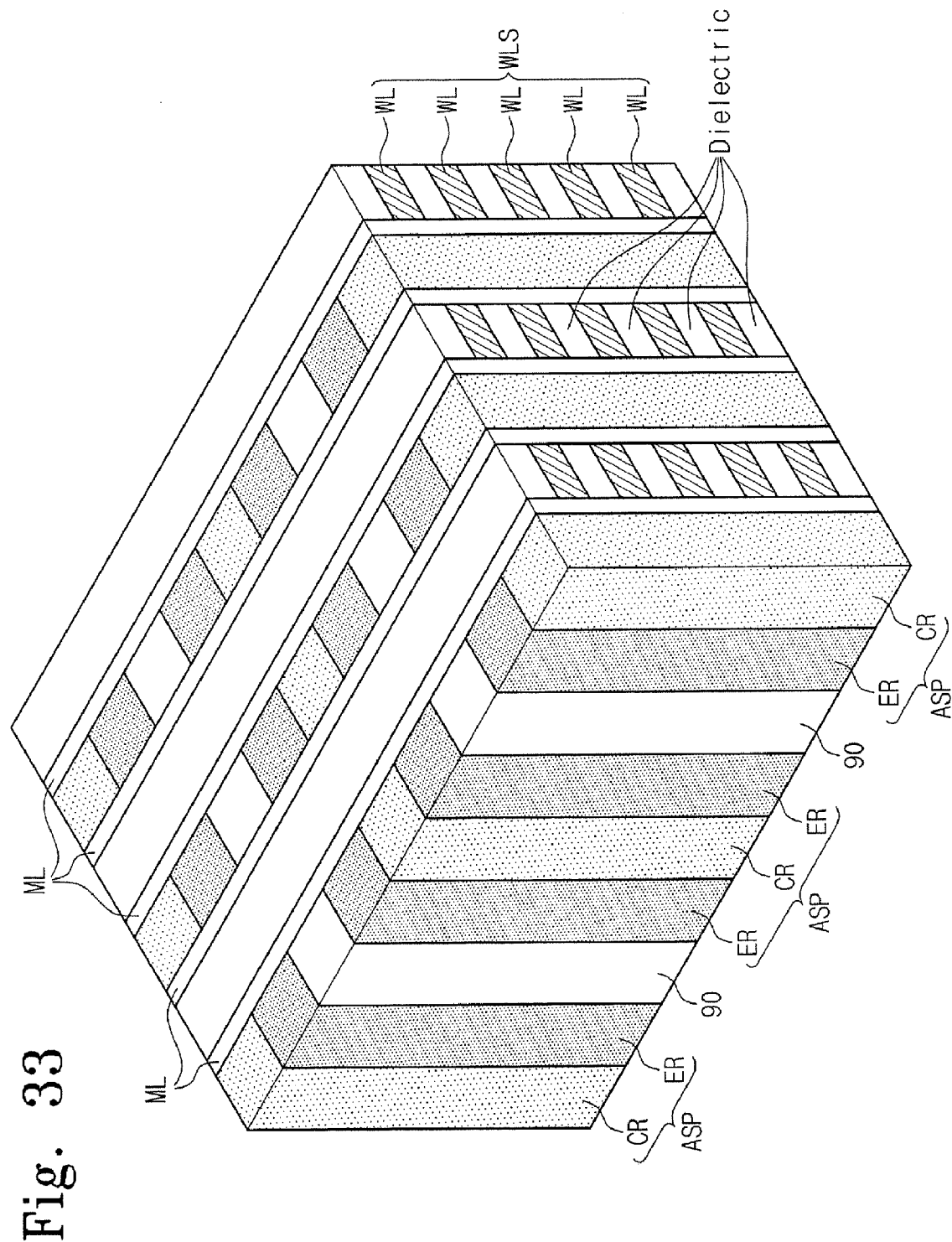
Figure 34:
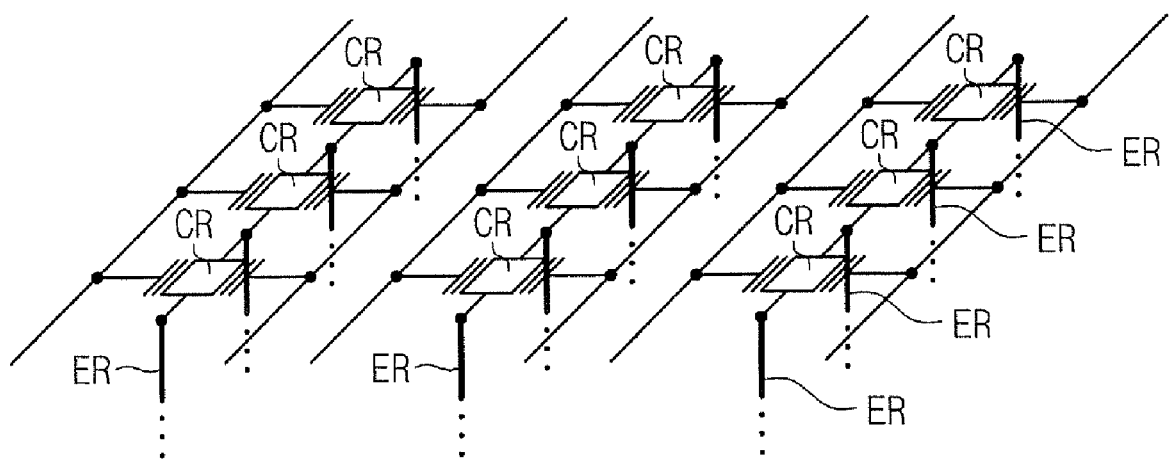
FIGS. 34 and 35 are circuit diagram and perspective view for illustrating a cell array of a semiconductor memory device according to some embodiments of the present invention.
Figure 35:
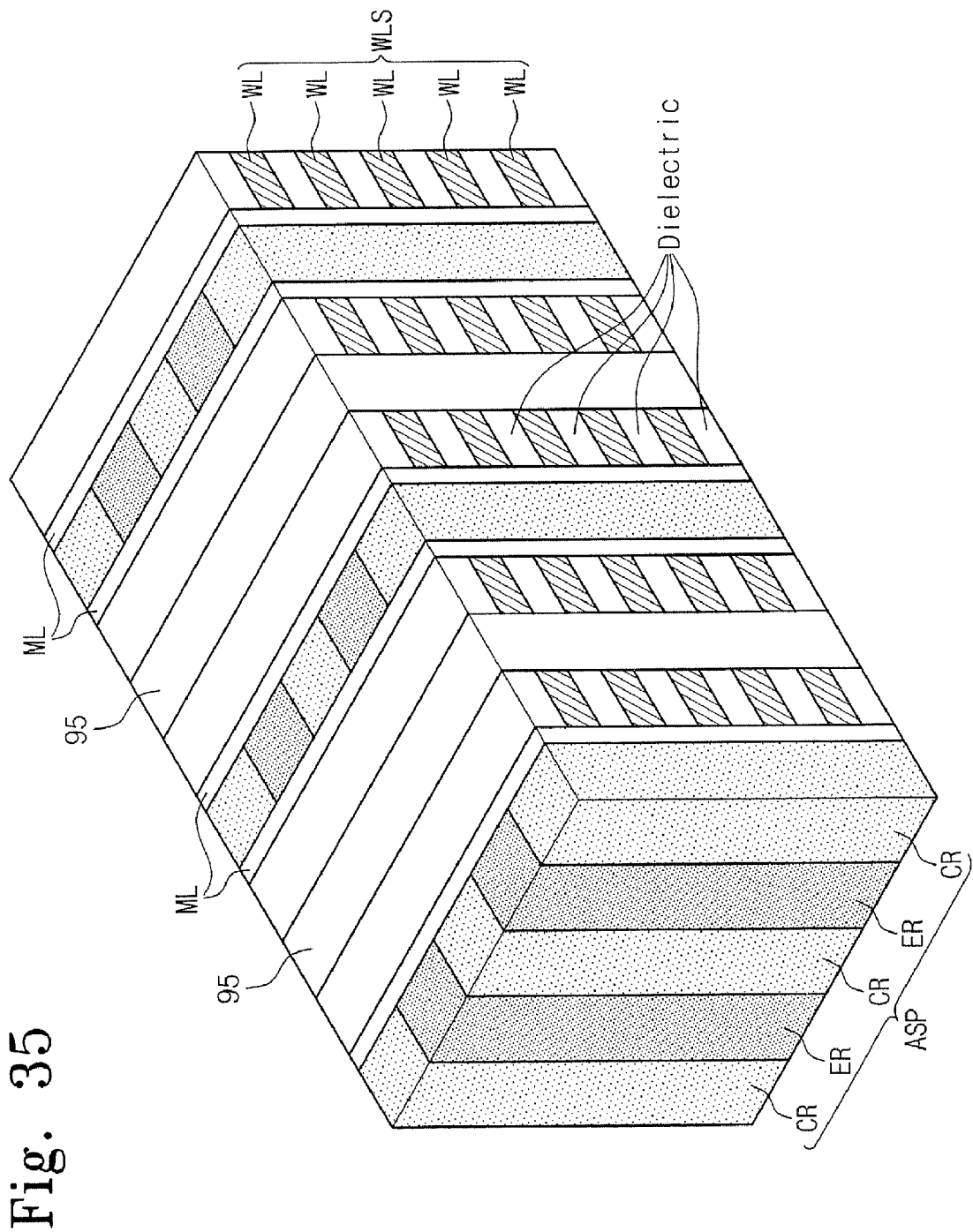
Figure 36:
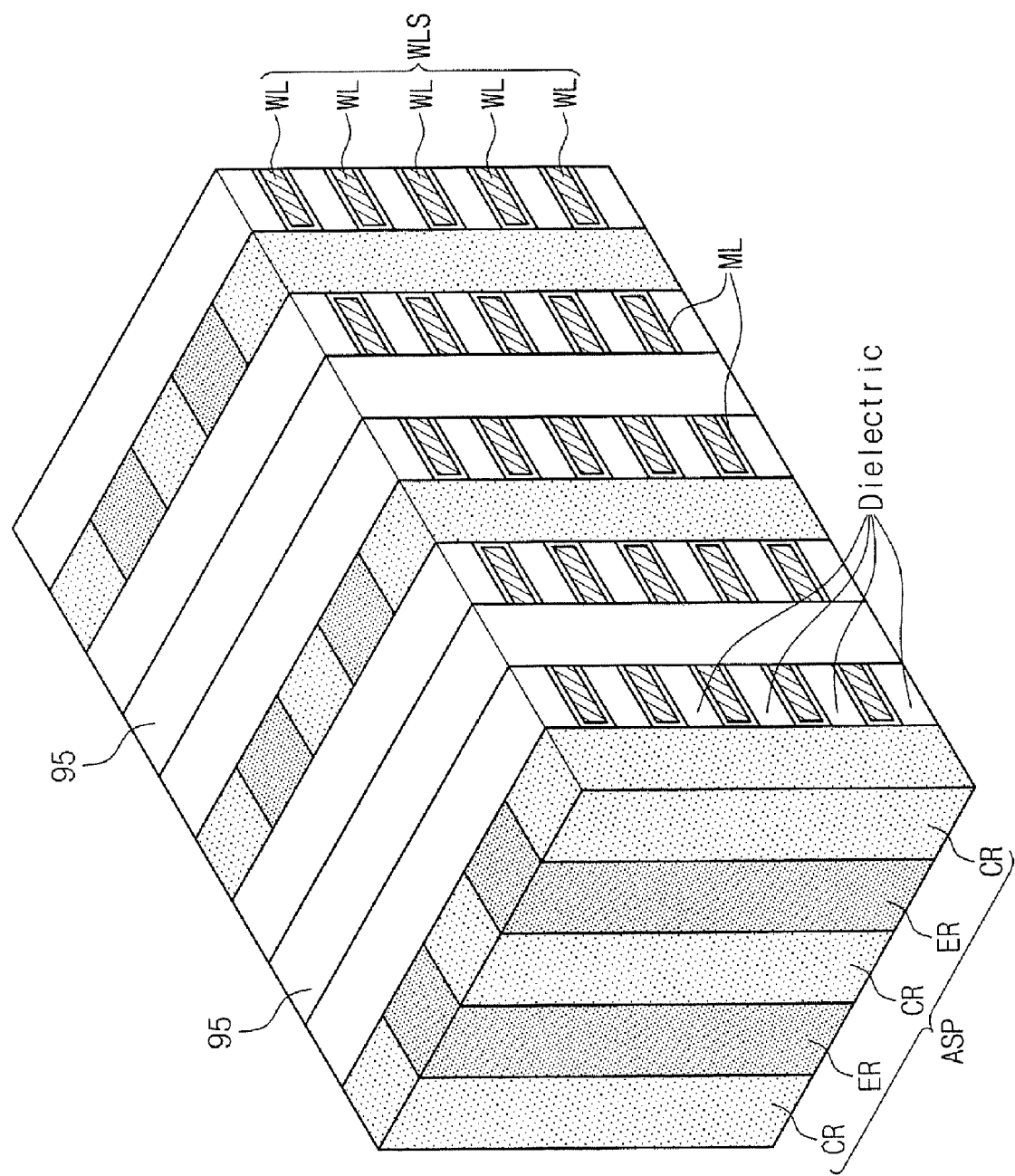
FIG. 36 is a perspective view for illustrating a cell array of a semiconductor memory device according to some embodiments of the present invention.
Figure 37:
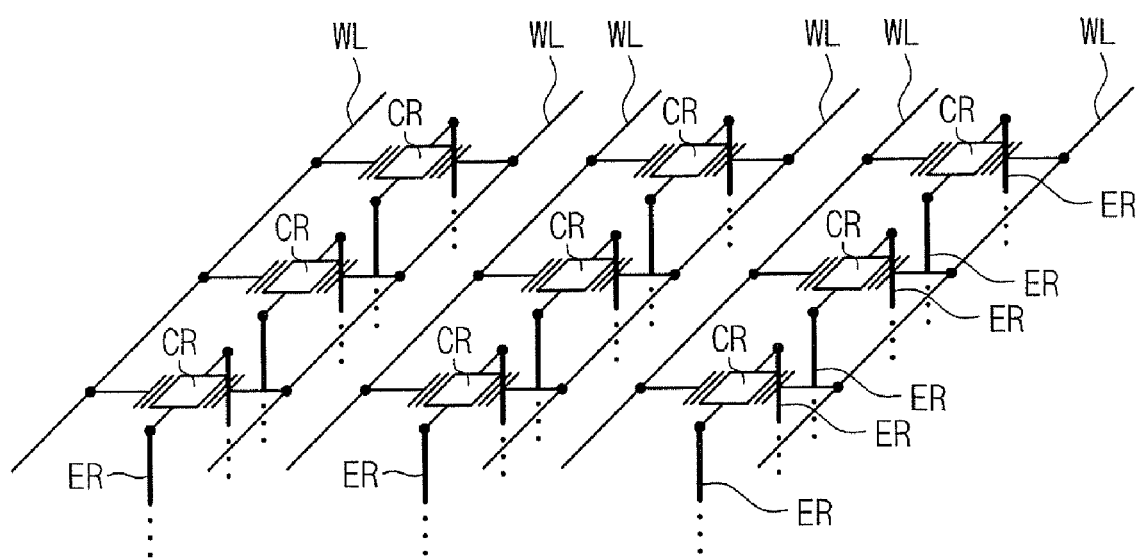
FIGS. 37 and 38 are circuit diagram and perspective view for illustrating a cell array of a semiconductor memory device according to some embodiments of the present invention.
Figure 38:
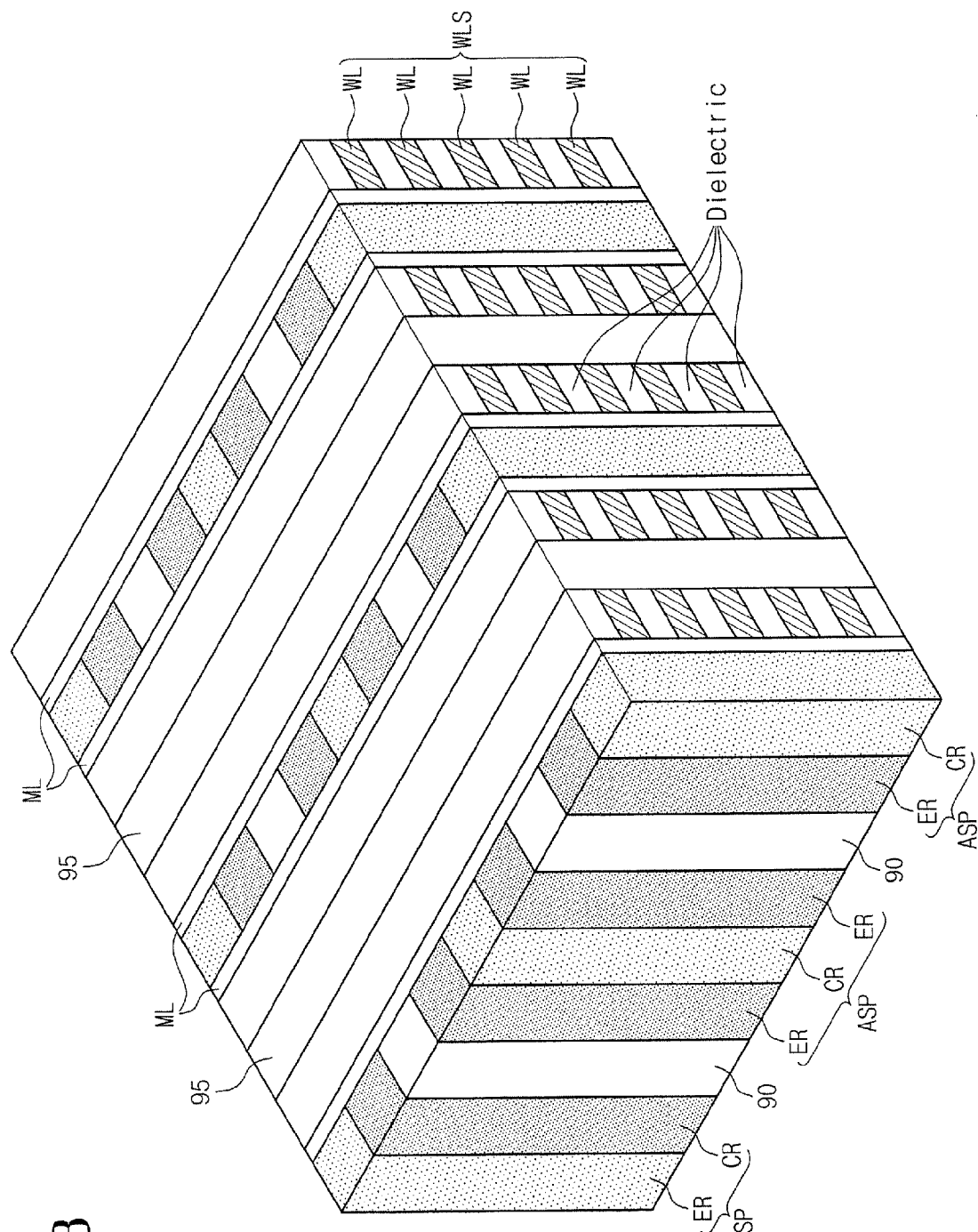
Figure 39:
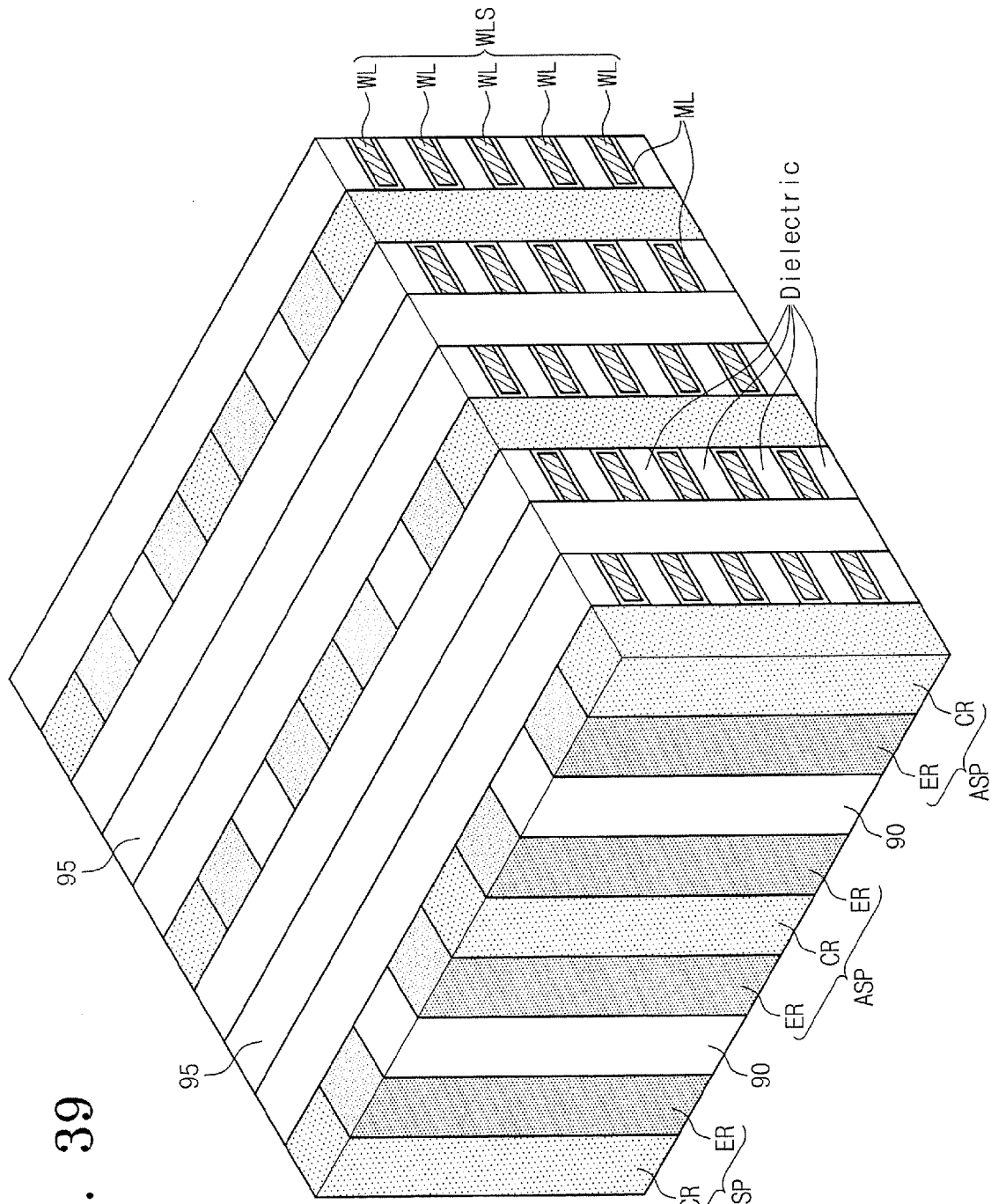
FIG. 39 is a perspective view for illustrating a cell array of a semiconductor memory device according to some embodiments of the present invention.

FIGS. 32 and 33 are circuit diagram and perspective view for illustrating a cell array of a semiconductor memory device according to some first modified embodiments of the present invention, FIGS. 34 and 35 are circuit diagram and perspective view for illustrating a cell array of a semiconductor memory device according to some second modified embodiments of the present invention, FIG. 36 is a perspective view for illustrating a cell array of a semiconductor memory device according to some third modified first embodiments of the present invention, FIGS. 37 and 38 are circuit diagram and perspective view for illustrating a cell array of a semiconductor memory device according to some fourth modified embodiments of the present invention, and FIG. 39 is a perspective view for illustrating a cell array of a semiconductor memory device according to some fifth modified embodiments of the present invention.

Referring to FIGS. 32, 33 and 37-39, active semiconductor patterns between word lines (WL) may be separated from each other, and each of the active semiconductor patterns (ASP) may include one channel region (CR) and electrode regions (ER) disposed at both sides of the one channel region (CR). The electrode region (ER) of one memory cell transistor connected to a predetermined word line (WL) may be spaced apart from the electrode region (ER) of an adjacent memory cell transistor connected to the same word line, and a device isolation pattern 90 may be interposed between the spaced two electrode regions (ER), as shown in FIGS. 33, 38 and 39.

As a result, according to some embodiments, the two adjacent memory cell transistors between the two adjacent word lines (WL) may be connected to bit lines (or electrode regions (ER)) that may be electrically separated. That is, one electrode region (ER) (or bit line) may not be shared by two adjacent memory cell transistors.

In the case of some embodiments described above with reference to FIG. 2, since one electrode region (ER) (or bit line) may be shared by two adjacent memory cell transistors, it may be difficult to independently operate two adjacent memory cell transistors that are commonly connected to one word line (WL). However, since bit lines connected to two adjacent memory cell transistors may be electrically separated from each other, memory cell transistors commonly connected to one word line (WL) may operate independently.

In this case, two or more memory cell transistors connected to one word line (hereinafter referred to as 'select word line') may be programmed once. For example, when a program gate voltage is applied to the select word line, two or more memory cell transistors connected to the select word line may be selectively programmed according to electrode regions (ER) of the two or more memory cell transistors. In this regard, some embodiments provide that since potentials of the electrode regions connected to the memory cell transistors can be independently controlled, the aforementioned simultaneous programming of two or more memory cell transistors can be realized.

Referring to FIGS. 34, 35, 37 and 38, word lines, which are horizontally separated by a gate separation insulating layer 95, may be disposed between two adjacent active semiconductor patterns (ASP). Accordingly, two active semiconductor patterns (ASP) between word lines (WL) may be controlled by word lines (WL) that are different from each other.

In the case of some embodiments described above with reference to FIG. 2, since one word line may be used as a common gate electrode controlling potentials of two active semiconductor patterns (ASP) adjacent to the one word line, a gate voltage for operating memory cells disposed at one side of one word line (hereinafter referred to as 'select line') may be simultaneously applied to memory cells disposed at the other side of the select word line. However, according to such embodiments, since the potential of two adjacent active semiconductor patterns (ASP) can be controlled by separated word lines (WL), the semiconductor memory device may have data disturbance characteristics improved as compared with that in the embodiments of FIG. 2.

According to some of the third and fifth modified embodiments shown in FIGS. 36 and 39, word lines (WL), which are horizontally separated by the gate separation insulating layer 95, may be disposed between two adjacent active semiconductor patterns (ASP), as similarly described above regarding FIG. 35. However, according to these embodiments, a memory layer (ML) may extend to a top surface and a bottom surface from between the active semiconductor pattern (ASP) and the word lines (WL), to thus have a U-shaped section. The memory layer (ML) does not cover sidewalls of dielectrics between the word lines (WL) but is interposed between the dielectrics and the word lines (WL). The semiconductor memory devices shown in FIGS. 36 and 39 may be manufactured through manufacturing methods described above with reference to FIGS. 44 through 53.

Figure 40:
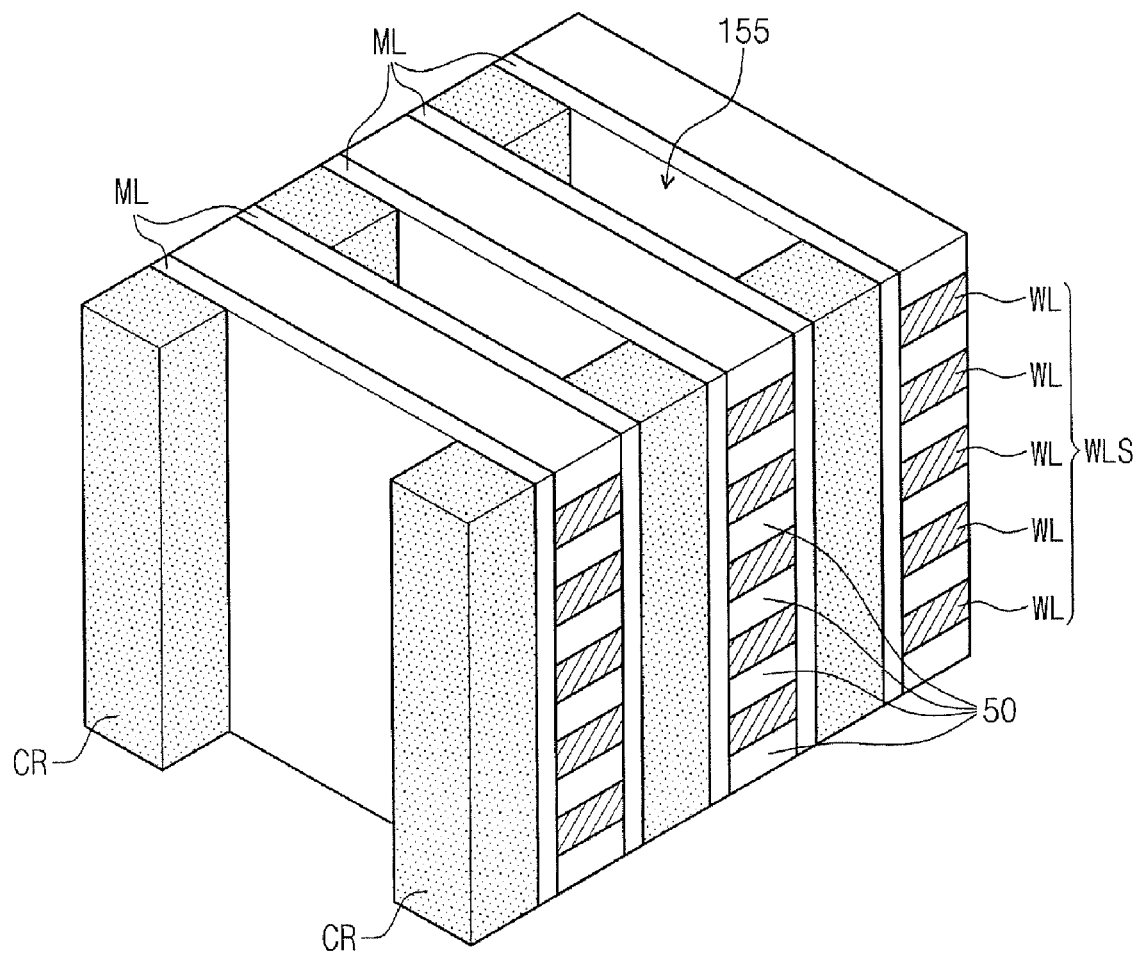
FIGS. 40 and 41 are perspective views for illustrating methods of manufacturing the semiconductor memory device according to some embodiments of the present invention.
Figure 41:
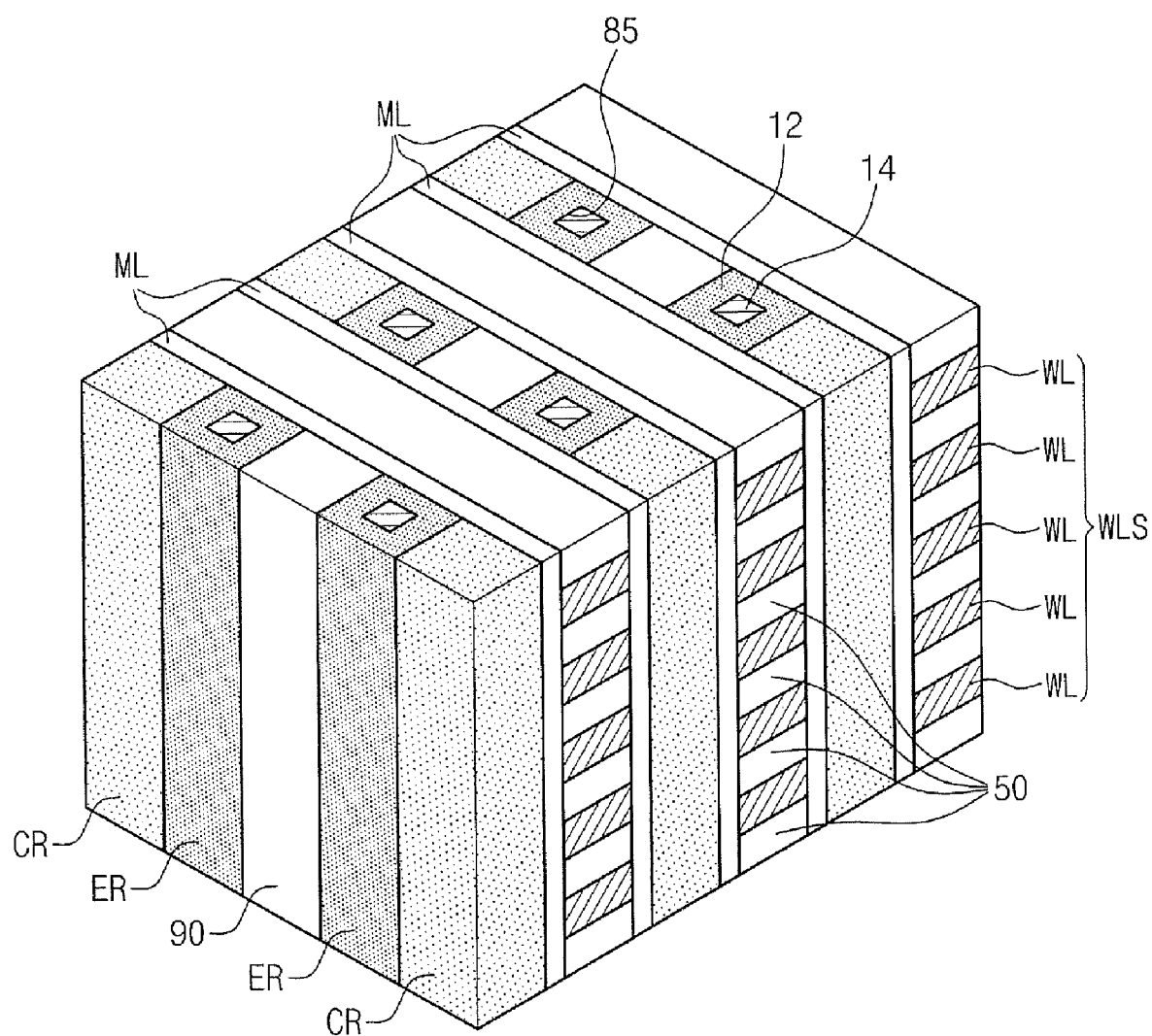

FIGS. 40 and 41 are perspective views for illustrating methods of manufacturing the semiconductor memory device according to first modified embodiments of the present invention. The manufacturing methods described with reference to FIGS. 21 through 23 may be used equally for these embodiments. The manufacturing methods, which will be described below, may be used to manufacture the semiconductor memory devices according to the fourth and fifth modified embodiments as described above with reference to FIGS. 38 and 39.

Referring to FIGS. 23 through 40, after forming a mask pattern (not shown) crossing the word lines (WL), the semiconductor layer 80 may be selectively etched using the formed mask pattern to form the channel semiconductor patterns (CR). Accordingly, trenches 155 exposing sidewalls of the memory layer (ML) may be formed between the channel semiconductor patterns (CR) and between the word lines (WL).

Referring to FIG. 41, an electrode semiconductor layer filling the trenches 155 may be formed. The electrode semiconductor layer may be formed of a semiconductor material, which may have a conductivity that is different from the channel semiconductor patterns (CR) and may have an impurity concentration higher than the channel semiconductor patterns (CR). The electrode semiconductor layer may be formed using a chemical vapor deposition (CVD) and/or may be formed by an epitaxial growth technique using the exposed sidewalls of the channel semiconductor pattern (CR) as a seed.

The electrode semiconductor layer may be patterned to faun separated electrode semiconductor patterns (ER), and then device isolation patterns 90 electrically separating the electrode semiconductor patterns (ER) may be formed between the electrode semiconductor patterns (ER). As shown in the drawings, plug electrodes 14 for electrical connection with bit lines may be further formed in the electrode semiconductor patterns (ER).

According to some modified embodiments, during the etching for forming the trenches 155, the memory layer (ML) may be also etched to expose sidewalls of the word lines (WL). In such embodiments, prior to forming the electrode semiconductor layer, the operation of forming a thin insulating layer on the sidewalls of the word lines (WL) may be further performed. When the memory layer (ML) remains, the thin insulating layer may be further formed. Since potentials of the electrode regions (ER) do not need to be controlled by the word lines (WL), the thin insulating layer may be formed at a thickness that can prevent a dielectric breakdown between the word line (WL) and the electrode region (ER).

According to some modified embodiments, the electrode and the channel semiconductor patterns (ER, CR) may be formed by using manufacturing methods as described above with reference to FIGS. 21 through 24. In such operations forming the device isolation pattern 90 may include forming a trench separating one electrode semiconductor pattern (ER) into two electrode semiconductor patterns (ER) and then forming an insulating layer filling the trench.

Figure 42:
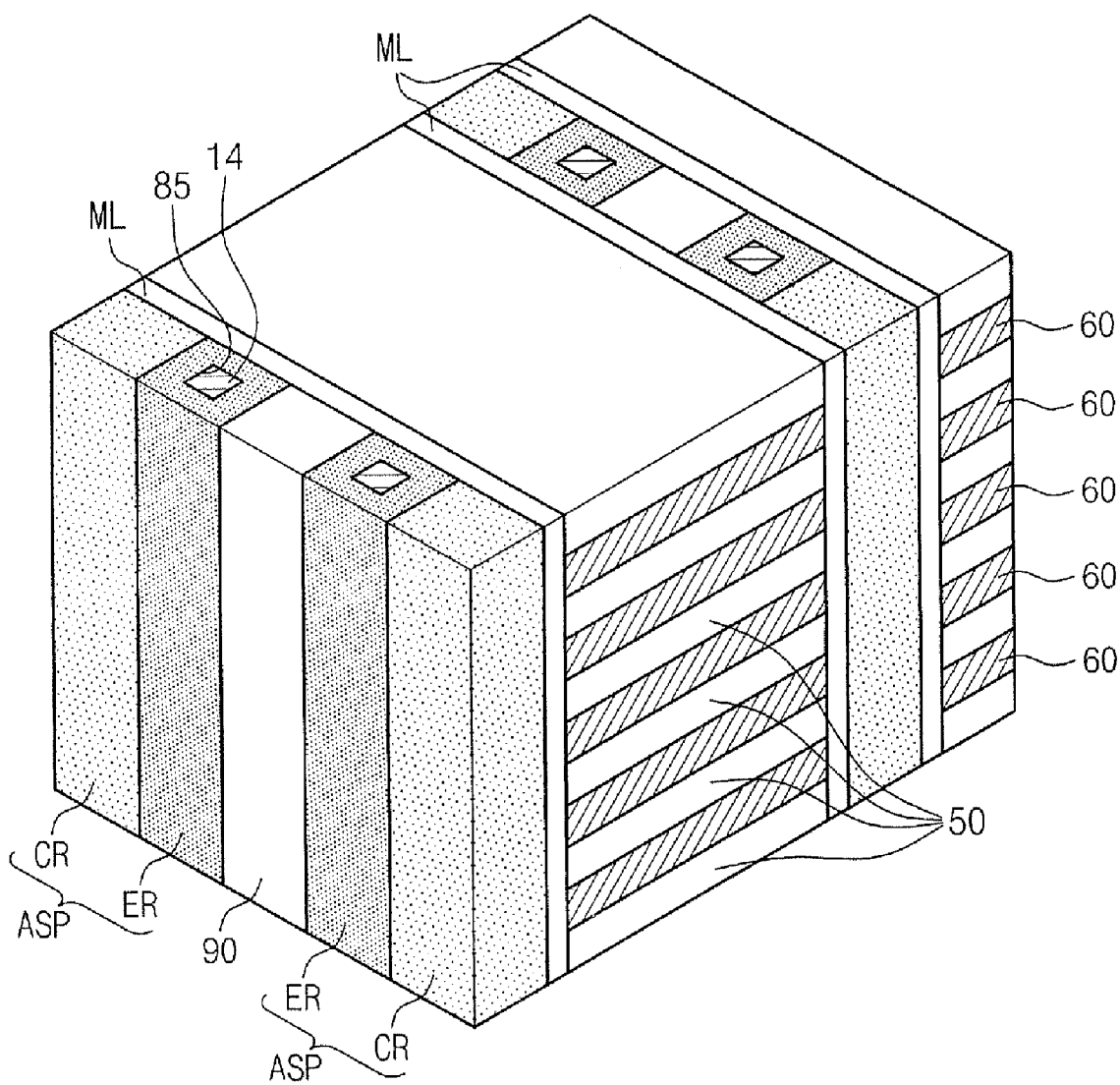
FIGS. 42 and 43 are perspective views for illustrating methods of manufacturing the semiconductor memory devices according to some embodiments of the present invention.
Figure 43:
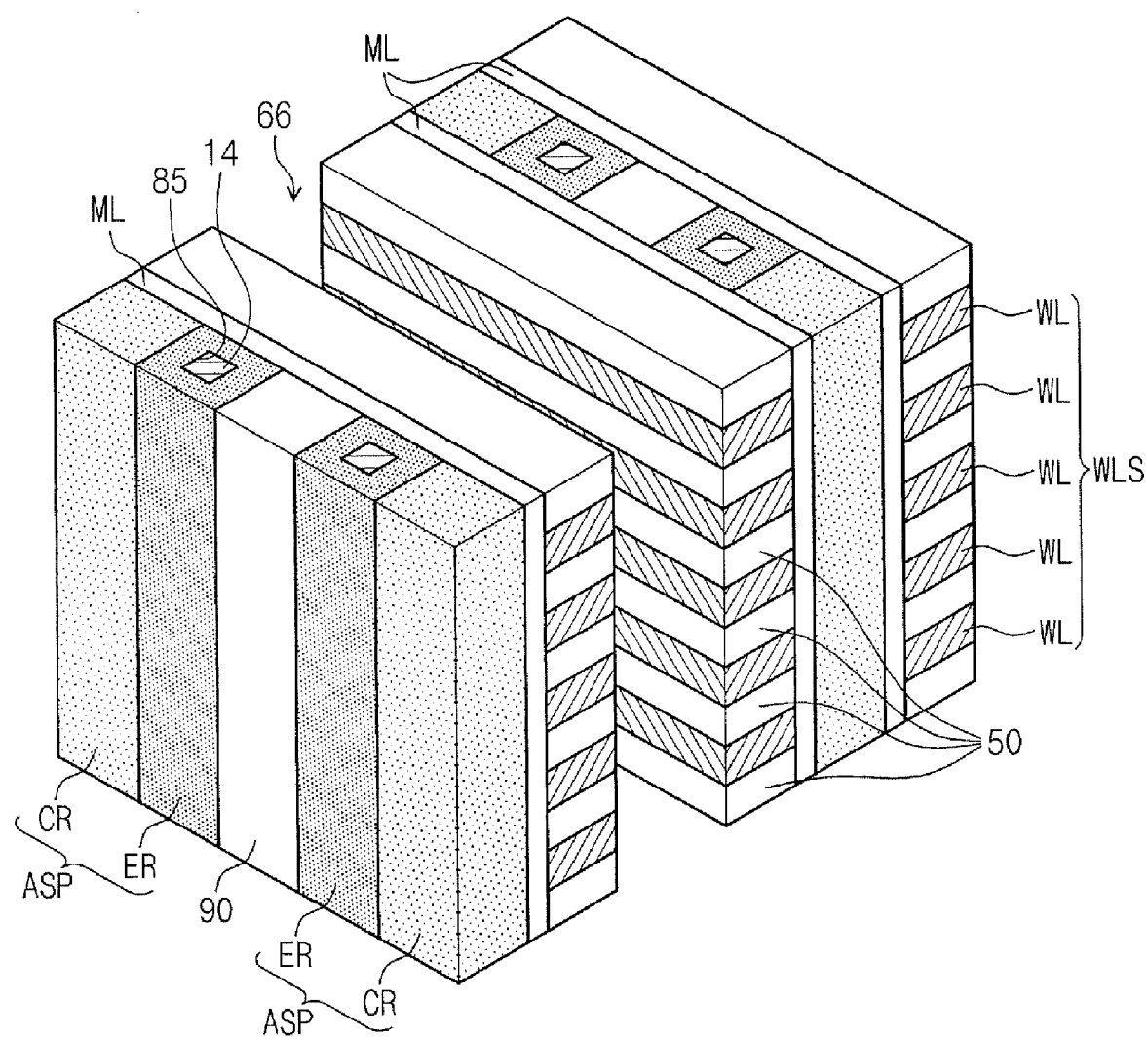

FIGS. 42 and 43 are perspective views illustrating methods of manufacturing semiconductor memory devices according to the second and fourth modified embodiments of the present invention. In such embodiments, technical features overlapping the aforementioned embodiments will be omitted.

According to some embodiments, forming word lines may include two different patterning operations of patterning the conductive layers 60 constituting the word line structure. One of the patterning operations may include patterning the conductive layers 60 so as to form the active semiconductor patterns (ASP) as shown in FIG. 42. The other patterning operation may include a patterning operation for forming a word line separation region 66, which may separate the conductive layers 60 between the active semiconductor patterns (ASP) to define the word lines (WL). Thereafter, a gate separation insulating layer 95 filling the word line separation region 66 may be formed. In this case, the cell array of the semiconductor memory device shown in FIG. 38 may be formed.

According to some embodiments, as shown in the drawings, the patterning operations for forming the word line separation region 66 may be performed after the patterning operation for defining a region where the active semiconductor patterns (ASP) are being formed.

According to some other embodiments, the patterning operation for defining a region for the active semiconductor patterns (ASP) may be performed after the patterning operation for forming the word line separation region 66 is performed. In this case, the word line separation region 66 may be formed by using the patterning operation for forming the trenches 155 as described with reference to FIG. 40 or the patterning operation for forming the device isolation pattern 90 as described with reference to FIG. 41.

According to some other embodiments, the region for the active semiconductor patterns (ASP) and the word line separation region 66 may be formed at the same time. In this case, the active semiconductor patterns (ASP) may be formed on the word line separation region 66. The active semiconductor patterns (ASP) on the word line separation region 66 may be removed during the patterning operation for forming the trenches 155 as described with reference to FIG. 40, or the patterning operation for forming the device isolation patterns 90 as described with reference to FIG. 41.

FIGS. 44 through 53 are perspective views for illustrating methods of manufacturing semiconductor memory devices according to the third and fifth modified embodiments of the present invention.

Figure 44:
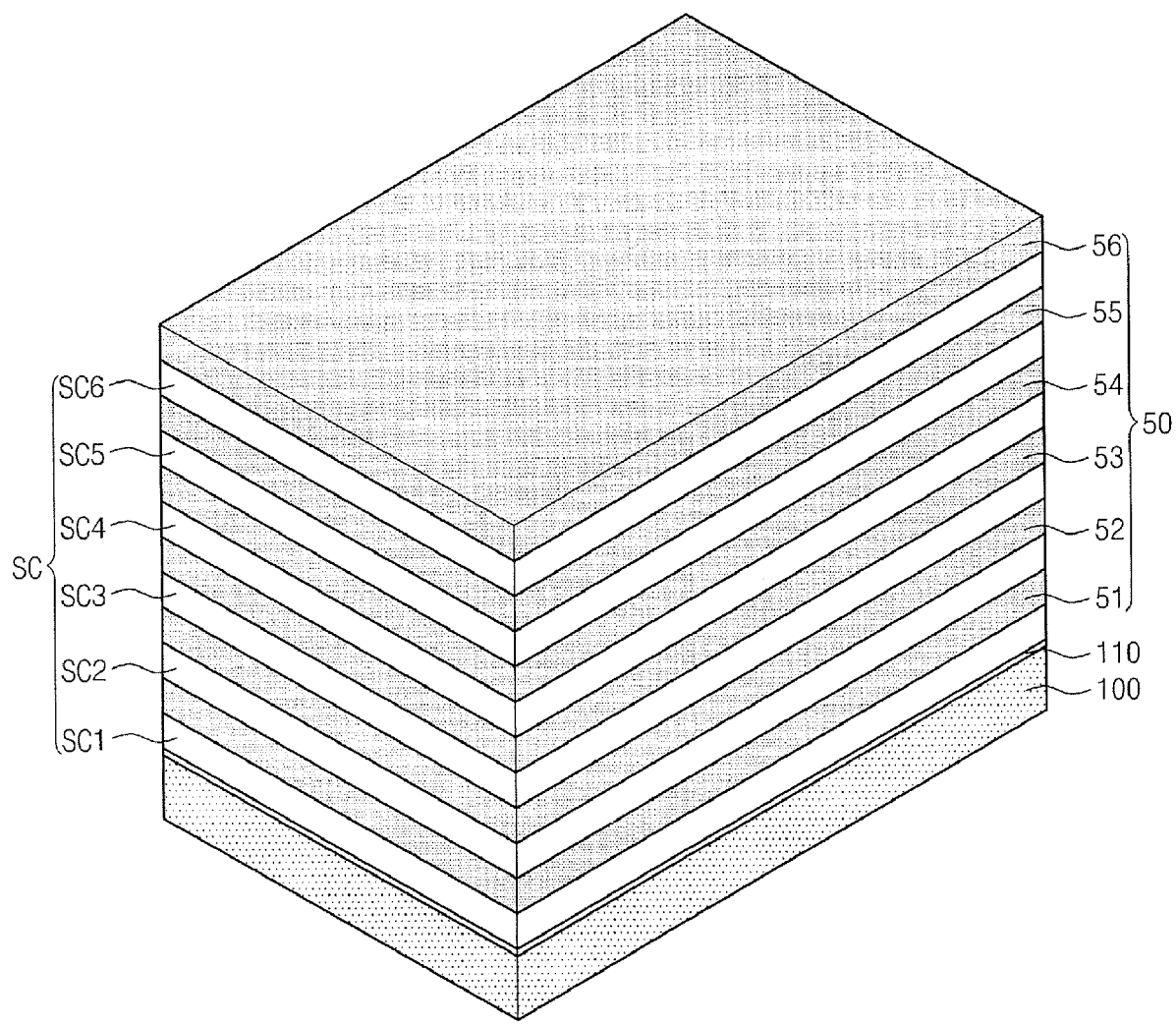
FIGS. 44 through 53 are perspective views for illustrating methods of manufacturing the semiconductor memory devices according to some embodiments of the present invention.
Figure 45:
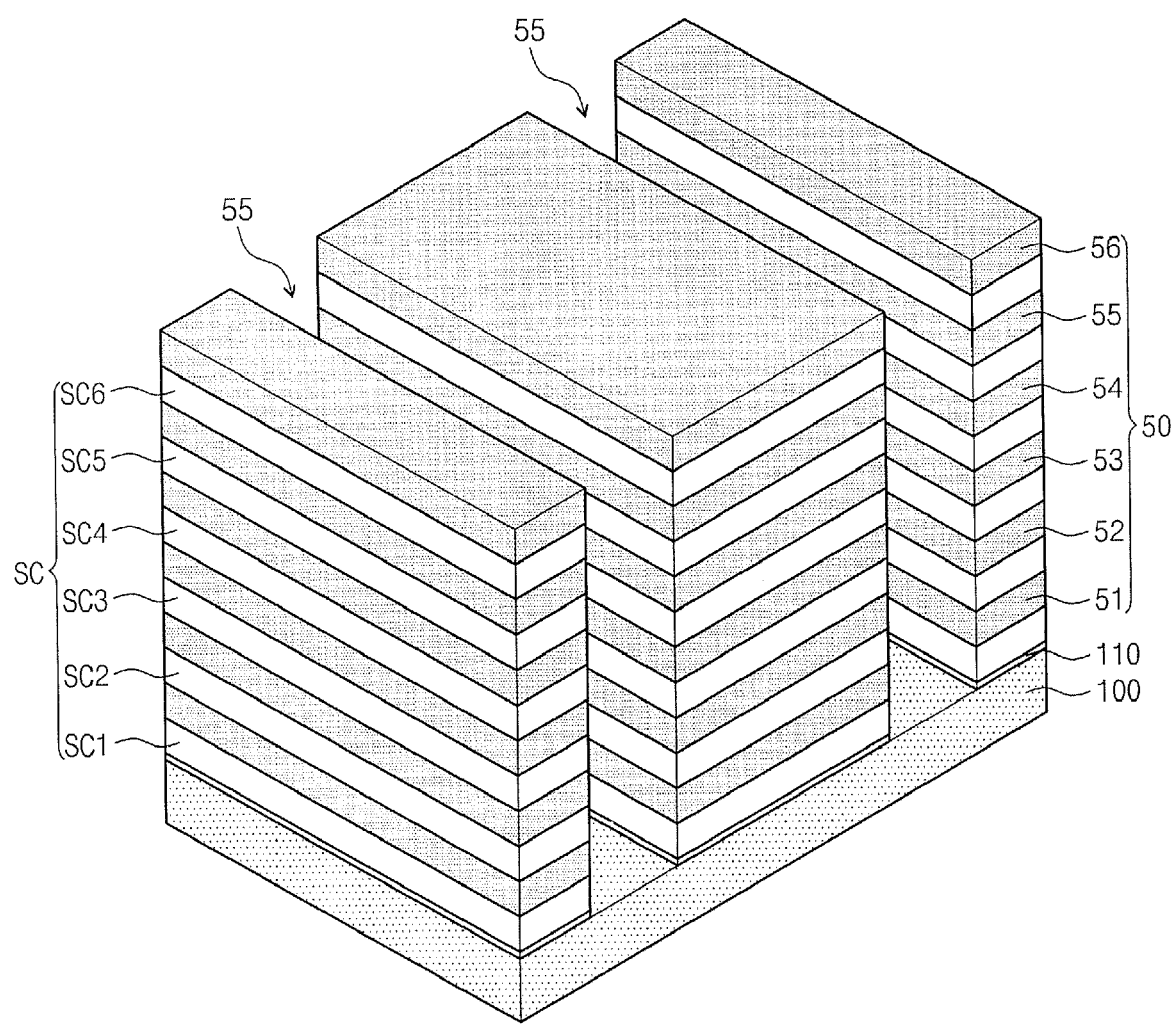

Referring to FIGS. 44 and 45, sacrificial layers (SC1, SC2, SC3, SC4, SC5, SC6) and gate interlayer dielectrics 51, 52, 53, 54, 55, 56 may be alternately formed on a semiconductor substrate 100. The sacrificial layers (SC1, SC2, SC3, SC4, SC5, SC6) constitute a sacrificial layer structure (SC) and may be spaced by the gate interlayer dielectric 51-56 and stacked. The gate interlayer dielectrics 51-56 between the sacrificial layers (SC1-SC6) may constitute a gate interlayer dielectric structure 50. A buffer layer 110 and/or select transistors as described with reference to FIG. 28 may be further formed between the lowest sacrificial layer (SC1) and the semiconductor substrate 100. In the case where the select transistors are further formed, a spacing distance between the lowest sacrificial layer (SC1) and the semiconductor substrate 100 may be larger than the relative dimensions of the drawing may otherwise suggest.

The gate interlayer dielectrics 51-56 may be formed of at least one selected from a group consisting of well-known dielectrics. For example, the gate interlayer dielectrics 51-56 may include at least one selected from the group consisting of silicon oxide and/or silicon nitride, among others. The sacrificial layers (SC1-SC6) may be formed of materials that can minimize an etching of the gate interlayer dielectrics 51-56 and be selectively removed.

Thereafter, as shown in FIG. 45, the gate interlayer dielectric structure 50 and the sacrificial layer structure (SC) may be patterned to form openings 55 exposing a top surface of the semiconductor substrate 100. According to some embodiments, each of the openings 55 may be formed in a linear shape and/or a hole shape.

Figure 46:
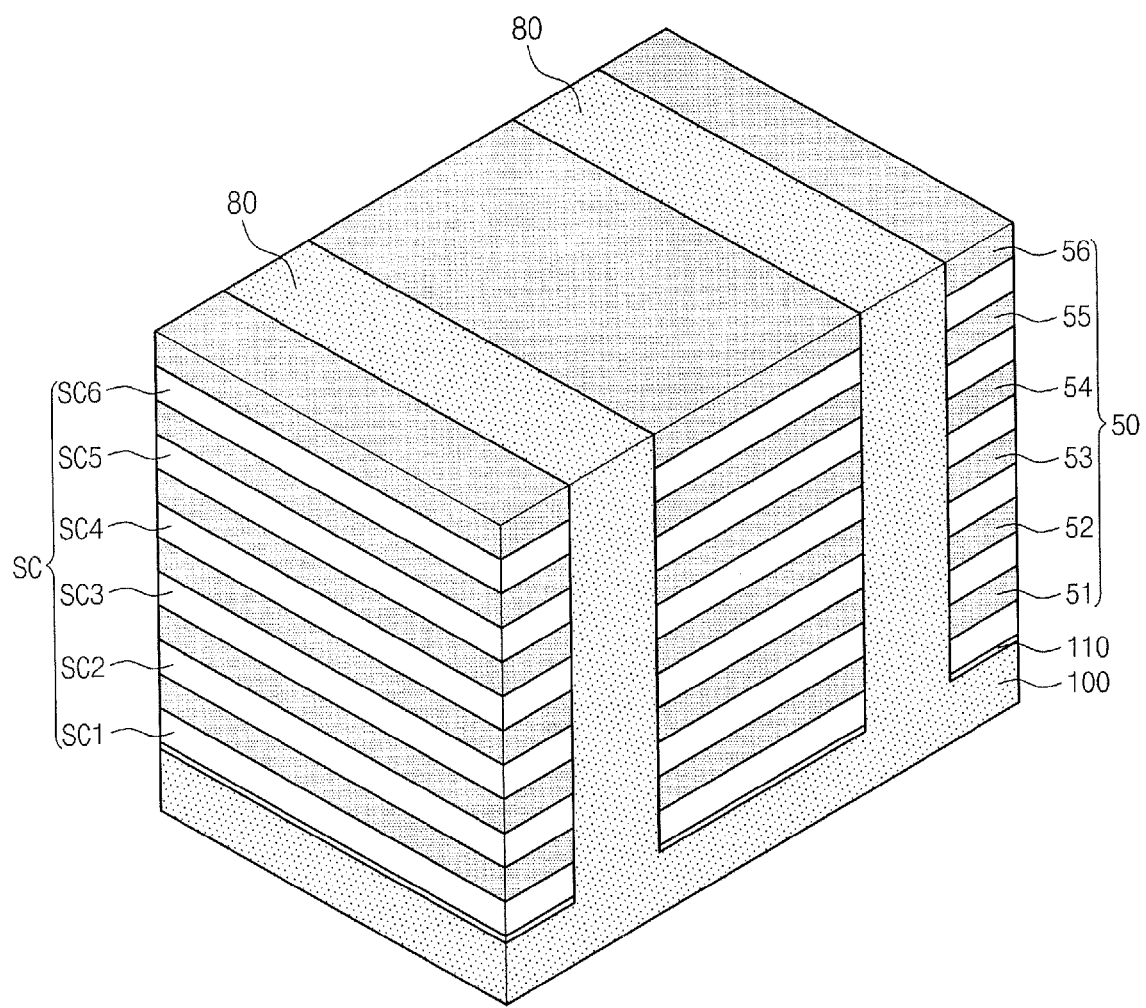

Referring to FIG. 46, a semiconductor layer 80 filling the openings 55 may be formed. The semiconductor layer 80 may be patterned in a direction crossing the openings 55 as described below, and may be used as the active semiconductor pattern (ASP) constituting memory cell transistors. According to some embodiments, the semiconductor layer 80 may be formed using an epitaxial growth and/or chemical vapor deposition, among others.

According to modified embodiments, the semiconductor layer 80 may be formed so as to conformally cover inner walls of the openings 55 through a chemical vapor deposition. In this case, a remaining space in the opening 55 may be filled with insulators (e.g., silicon oxide, silicon nitride and/or air).

Figure 47:
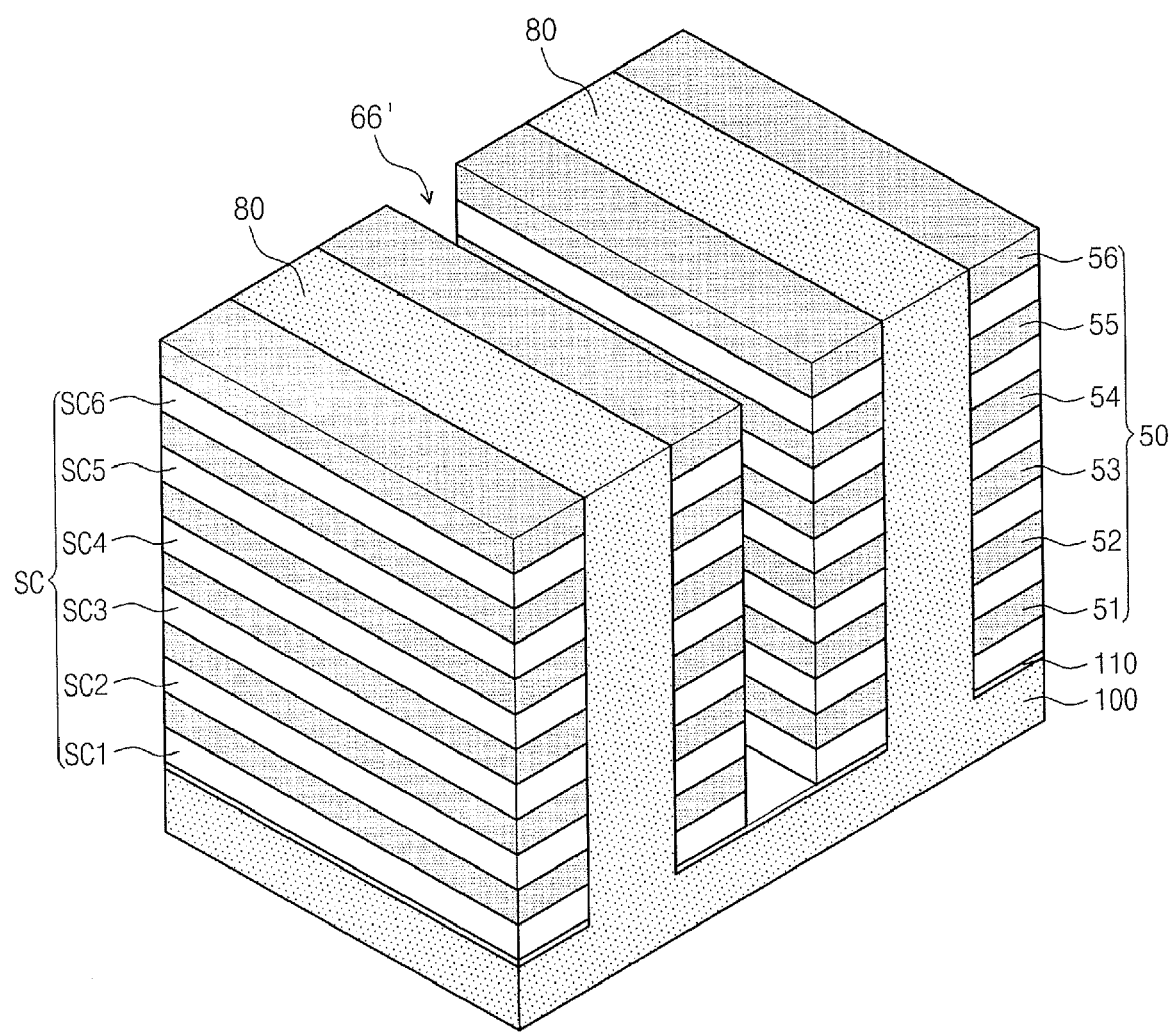

Referring to FIG. 47, the gate interlayer dielectric structure 50 and the sacrificial layer structure (SC) may again be patterned to form a preliminary word line separation region 66' exposing a top surface of the semiconductor substrate 100 or the buffer layer 110 between the openings 55. That is, the preliminary word line region 66' is formed between the adjacent semiconductor layers 80, and, in some embodiments, may be formed at the middle of the adjacent semiconductor layers 80. As a result, sidewalls of the gate interlayer dielectrics 51-56 and the sacrificial layers (SC1-SC6) may be exposed by the preliminary word line separation region 66'.

Some embodiments provide that forming the preliminary word line separation region 66' may use the etching process for forming the aforementioned openings 55, equally. Here, the buffer layer 110 may be used as an etch stop layer to prevent the semiconductor substrate 100 from being excessively recessed.

Figure 48:
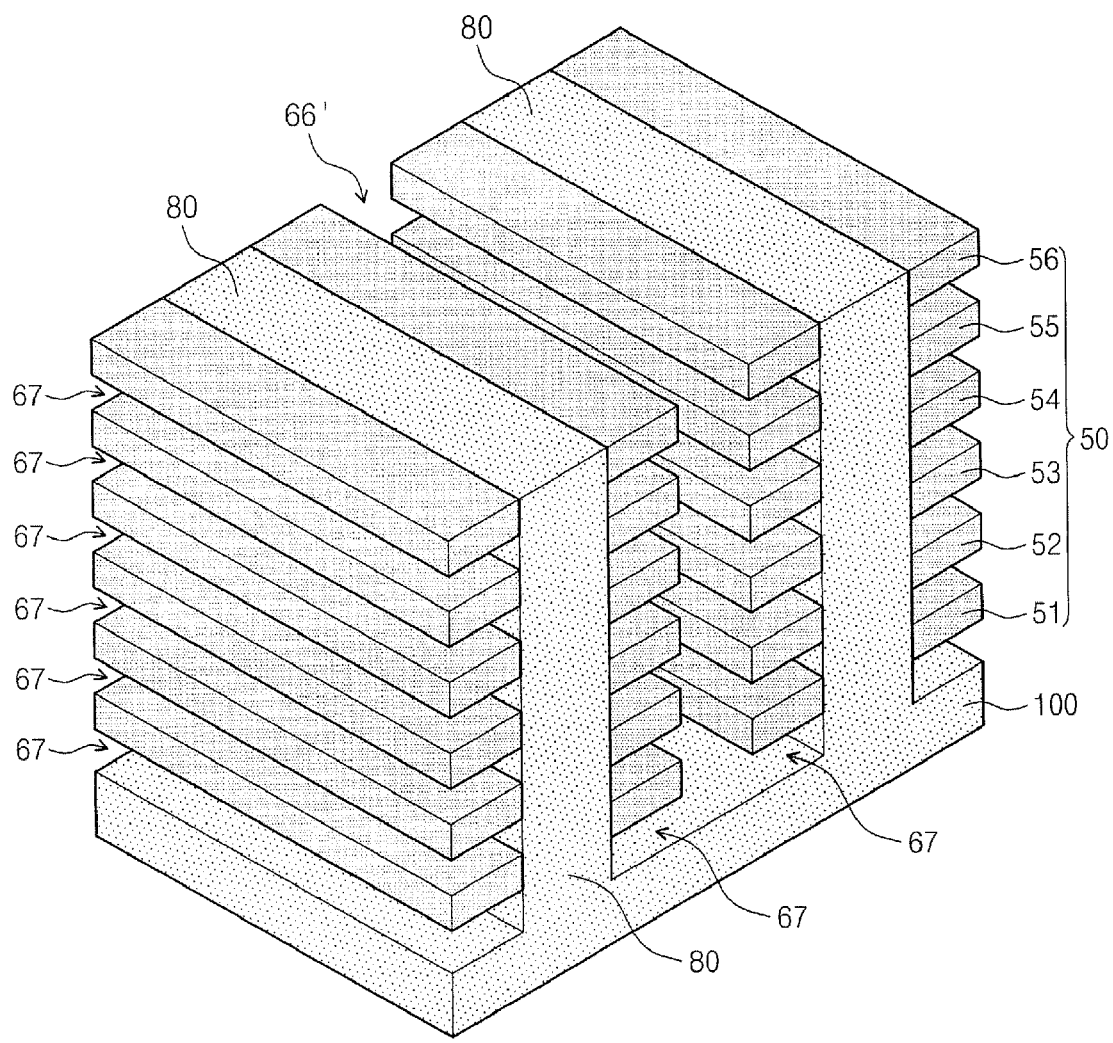

Referring to FIG. 48, the sacrificial layers (SC1-SC6) exposed by the preliminary word line separation region 66' may be removed. As a result, as shown in the drawing, gate regions 67 exposing sidewalls of the semiconductor layer 80 may be formed between the gate interlayer dielectrics 51-56. According to some embodiments, while the sacrificial layers (SC1-SC6) are removed, the buffer layer 110 may be removed as shown in the drawing. According to some modified embodiments, the buffer layer 110 may not be removed and thus may be left.

In some embodiments, removing the sacrificial layers (SC1-SC6) may be performed by using an etch recipe having an etch selectivity with respect to the semiconductor substrate 100 and/or the semiconductor layer 80. Also, removing the sacrificial layers (SC1-SC6) may be performed by a dry and/or wet etch. In some embodiments, removing the sacrificial layers (SC1-SC6) may be performed by an isotropic etch.

Figure 49:
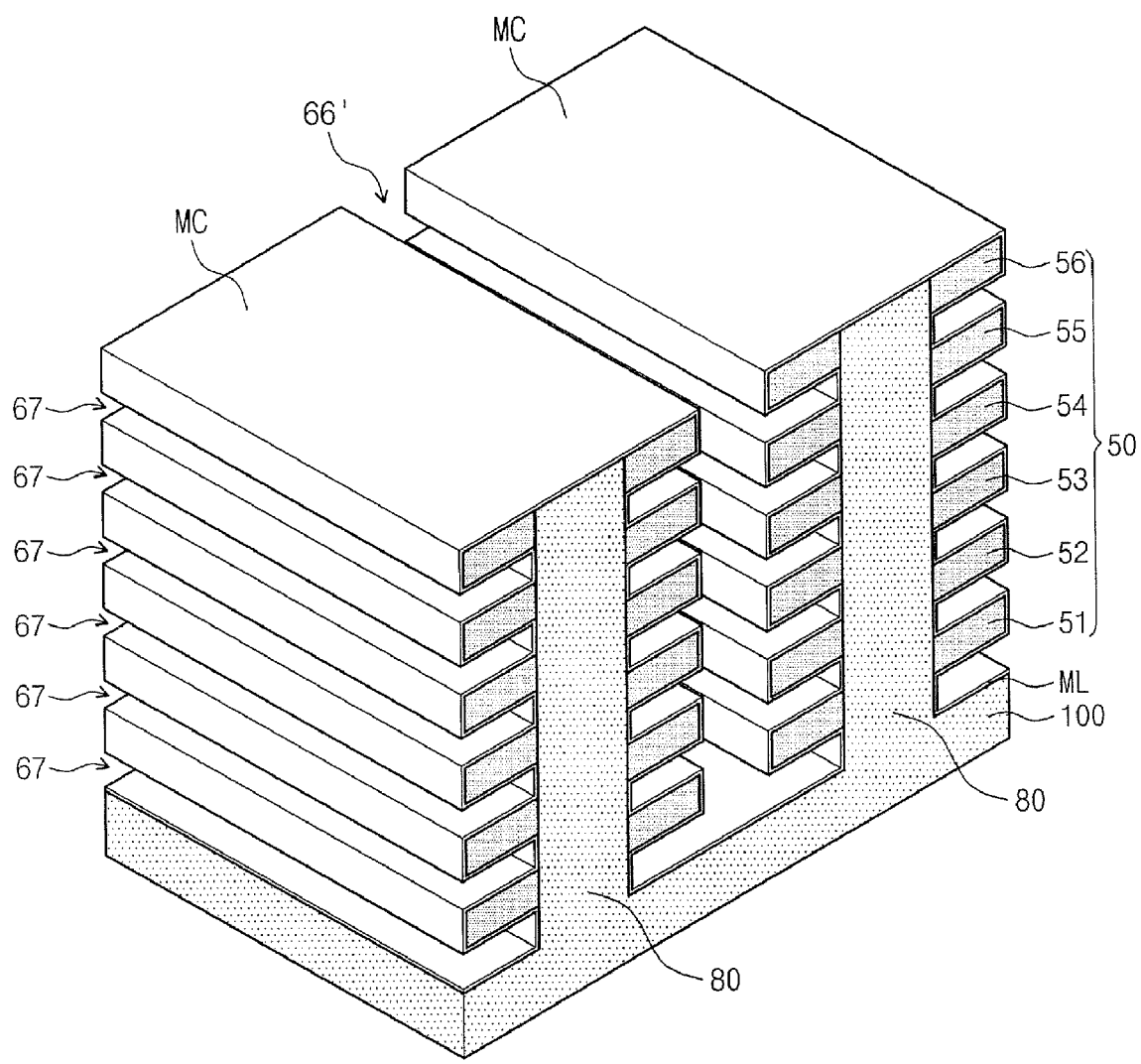

Referring to FIG. 49, a memory layer (ML) may be formed on a resultant structure on which the gate regions 67 are formed. The memory layer (ML) may include a blocking dielectric, a charge storage layer and/or a tunnel dielectric. According to some embodiments, the tunnel dielectric may be formed so as to at least cover the sidewalls of the semiconductor layer 80 exposed through the gate region 67. The charge storage layer and the blocking dielectric may be formed so as to conformally cover the resultant structure on which the tunnel dielectric is formed.

According to some embodiments, as aforementioned, since the sidewalls of the semiconductor layer 80 may be exposed through the gate regions 67, it may be possible to directly form a thermal oxide layer on the exposed surface of the semiconductor layer 80. The tunnel dielectric according to some embodiments may be a thermal oxide layer formed through such methods. A surface damage of the semiconductor layer 80 that may have been caused by the previous process operations, may be cured during the operations of forming the thermal oxide layer.

The charge storage layer and the blocking dielectric may be formed using thin film forming methods (e.g., chemical vapor deposition and/or atomic layer deposition) providing superior step coverage. Methods of forming the charge storage layer and the blocking dielectric and kinds of formed thin layers may be changed or modified by using conventional technologies.

Figure 50:
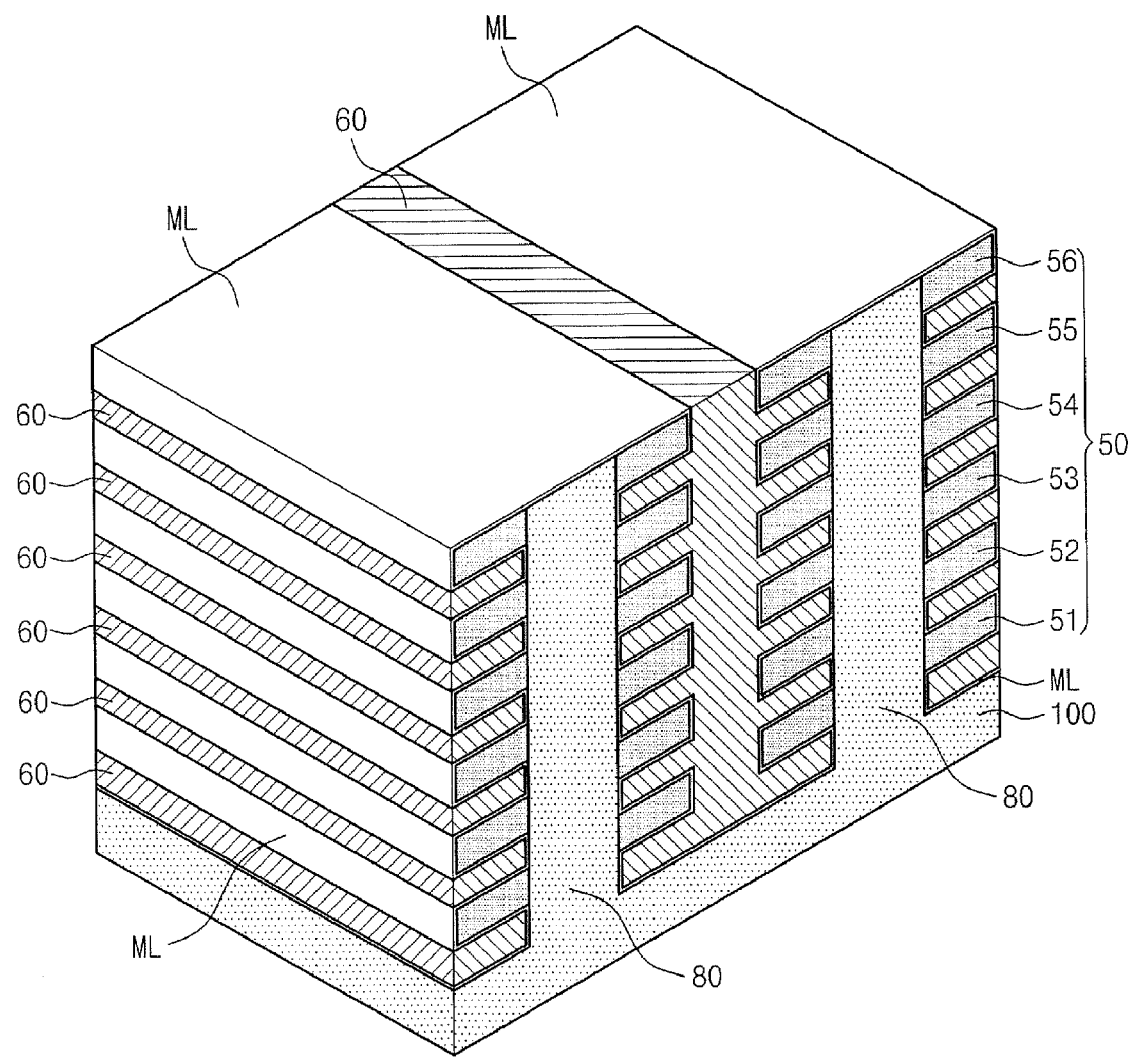

Referring to FIG. 50, a gate conductive layer 60 filling the preliminary word line separation region 66' and the gate region 67 may be formed on the resultant structure on which the memory layer (ML) is formed. The gate conductive layer 60 may be formed using at least one thin film forming techniques providing superior step coverage. The gate conductive layer 60 may be at least one selected from the group consisting of a polycrystalline silicon layer, silicide layers and/or metal layers, among others.

Figure 51:
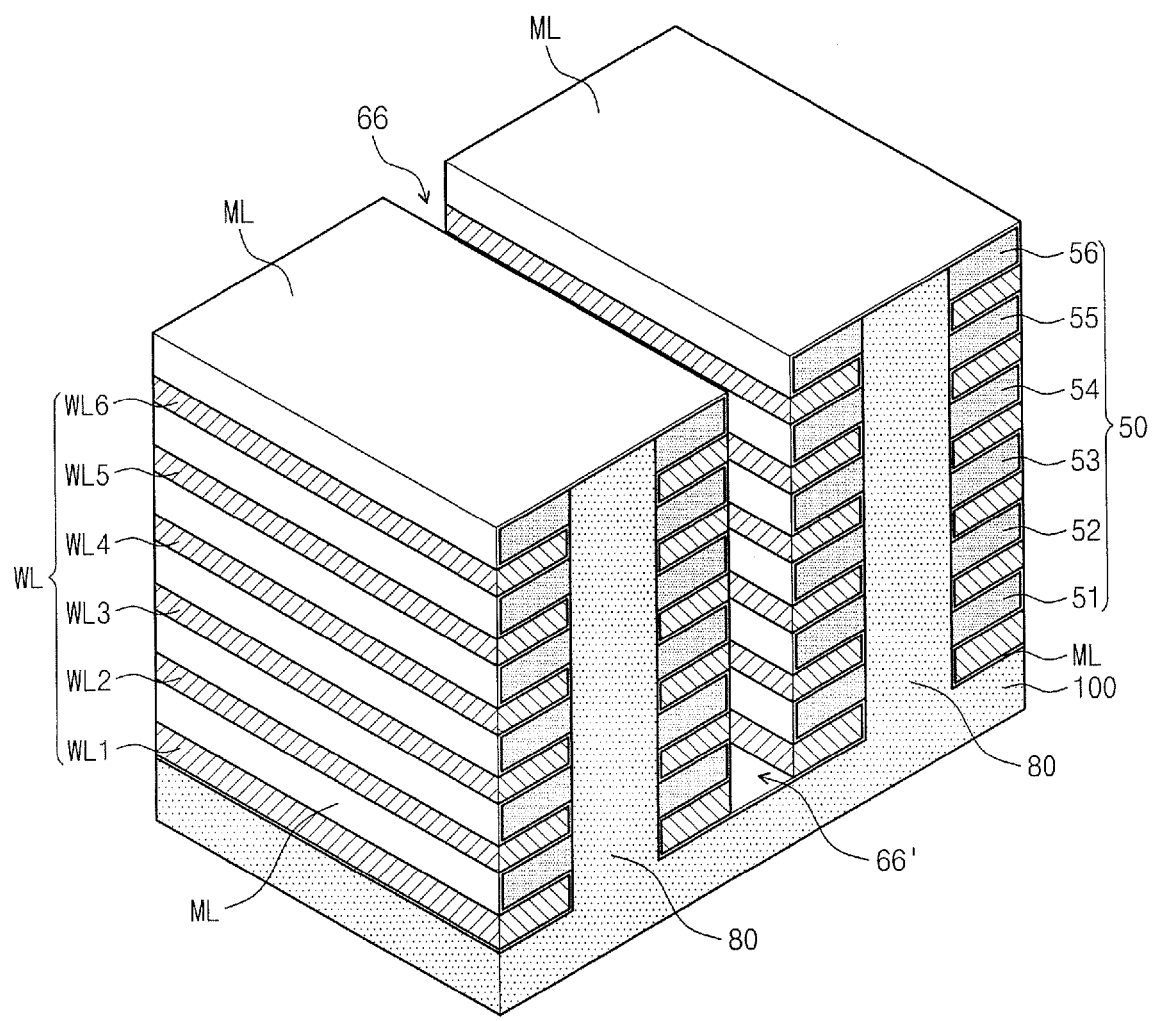
Figure 52:
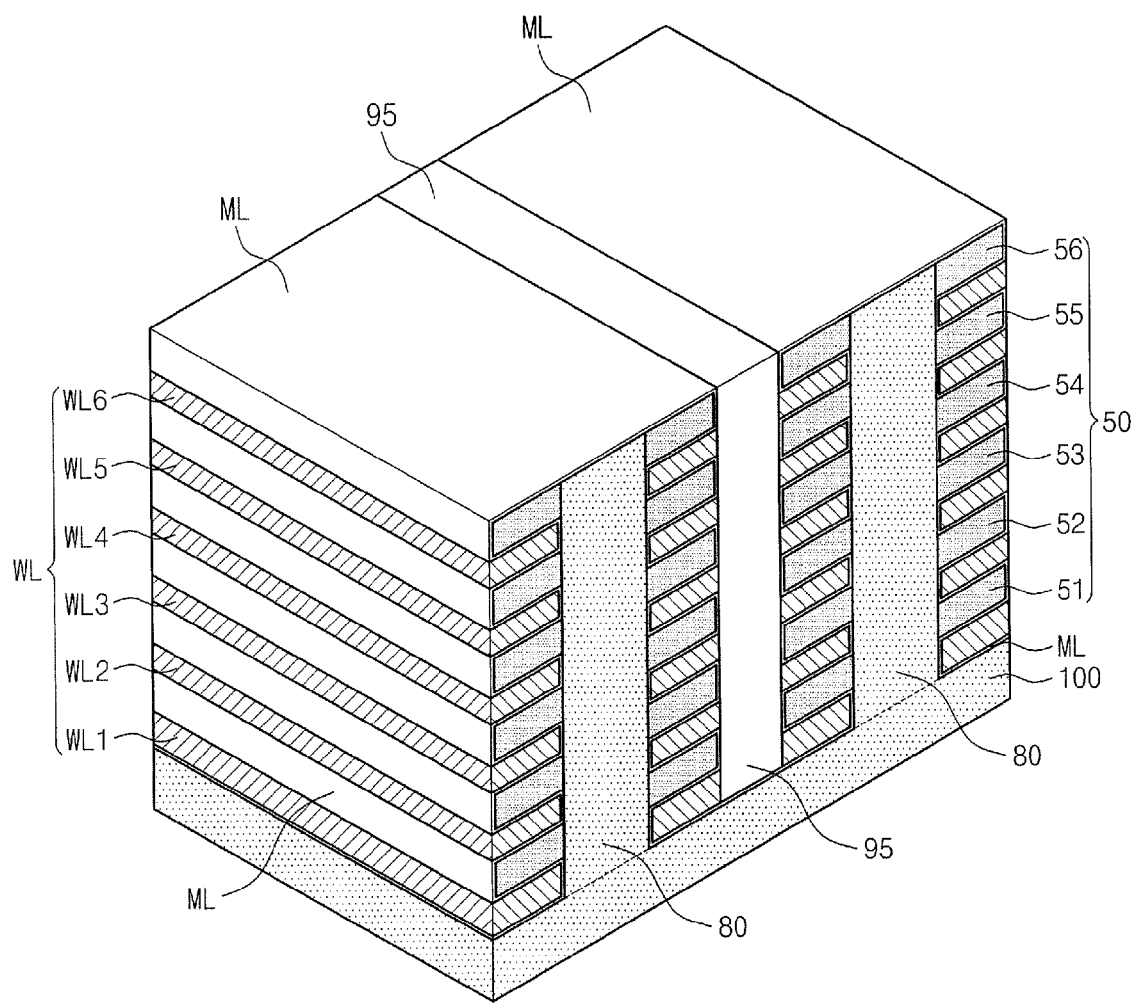

Referring to FIGS. 51 and 52, the gate conductive layer 60 may be patterned to form a word line separation region 66 defining the electrically separated word lines. Here, as in some previous embodiments, the word lines (WL) constitute a word line structure and are vertically separated by the gate interlayer dielectrics 51-56. Thereafter, as shown in FIG. 52, a gate separation dielectric 95 filling the word line separation region 66 may be formed.

Some embodiments provide that forming the word line separation region 66 may include forming a photoresist pattern and then anisotropically etching the gate conductive layer 60 using the formed photoresist pattern as an etch mask. In such embodiments, for electrical separation of the word lines (WL), the photoresist pattern may be formed so as to expose an area larger than the preliminary word line separation region 66'.

According to some other embodiments, forming the word line structure may include anisotropically etching the gate conductive layer 60 using the memory layer (ML) or the uppermost layer 56 of the gate interlayer dielectric structure 50 as an etch mask. Here, for electrical separation of the word lines (WL), forming the word line structure may include isotropically etching sidewalls of the word line (WL) exposed by the word line separation region 66, after performing the anisotropic etching. According to still other embodiments, the memory layer (ML) on the sidewall of the gate interlayer dielectrics 50 exposed at the word line separation region 66 may be further removed.

Figure 53:
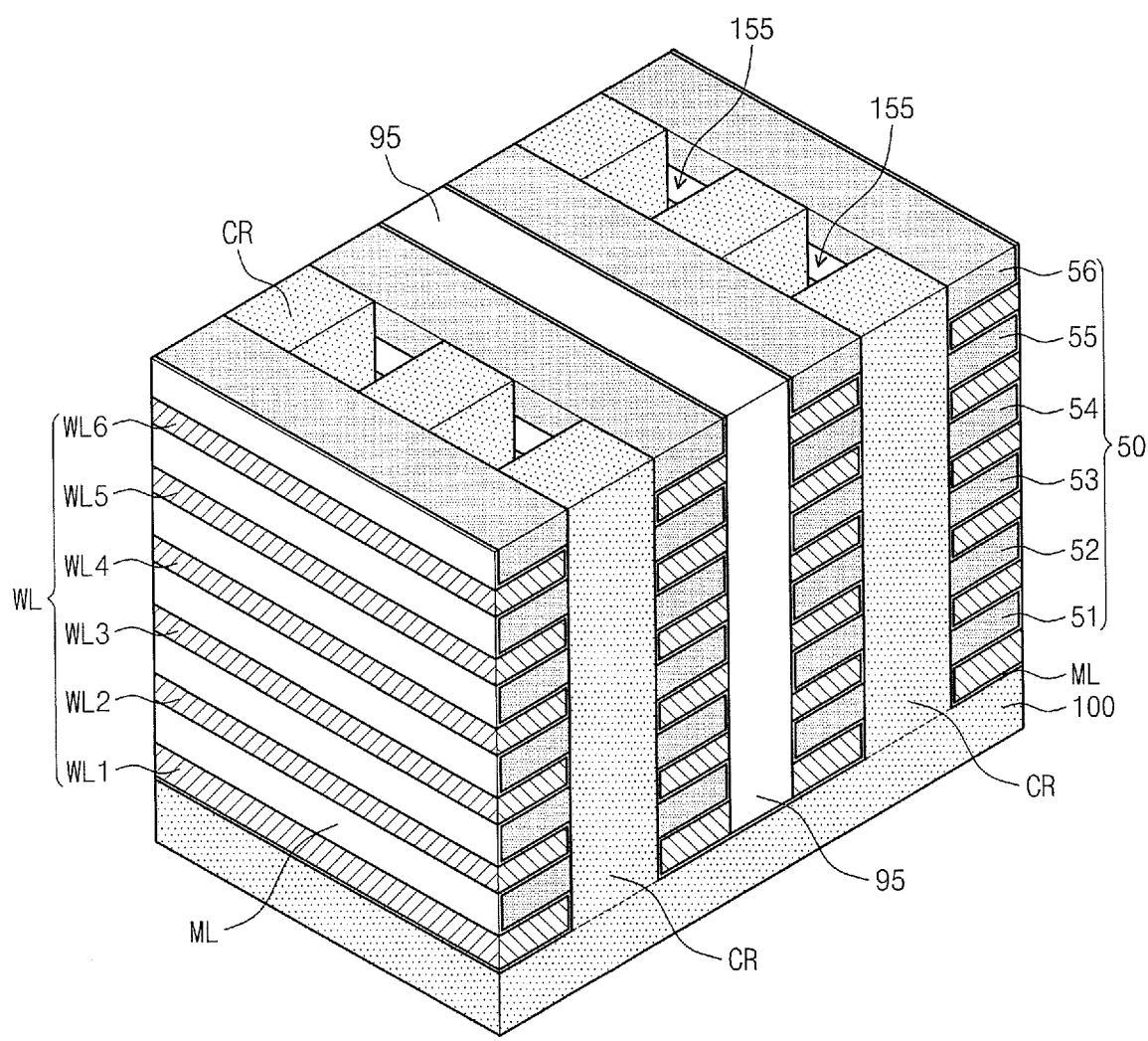

Referring to FIG. 53, the semiconductor layer 80 may be patterned to form trenches 155, which may divide the semiconductor layer 80 into a plurality of channel semiconductor patterns (CR). Forming the trenches 155 may include forming mask patterns crossing the word lines and then anisotropically etching the semiconductor layer 80 using the formed mask patterns as an etch mask. Thereafter, a semiconductor layer (not shown) may be formed in the trenches 155. In this case, the semiconductor layer may be used as the electrode semiconductor pattern (ER) shown in FIG. 36, and the cell array of the semiconductor memory device shown in FIG. 36 may be completed.

Some modified embodiments provide that electrode semiconductor patterns (ER) may be formed using the manufacturing method described with reference to FIGS. 40 and 41. In such embodiments, each of the trenches 155 may be formed so as to have a width that an inside of each trench 155 can be filled by two electrode semiconductor patterns (ER) and one device isolation pattern 90. In the case where the manufacturing method described with reference to FIGS. 40 and 41 is applied after the process described with reference to FIG. 53, the cell array of the semiconductor memory device shown in FIG. 39 may be formed.

Figure 54:
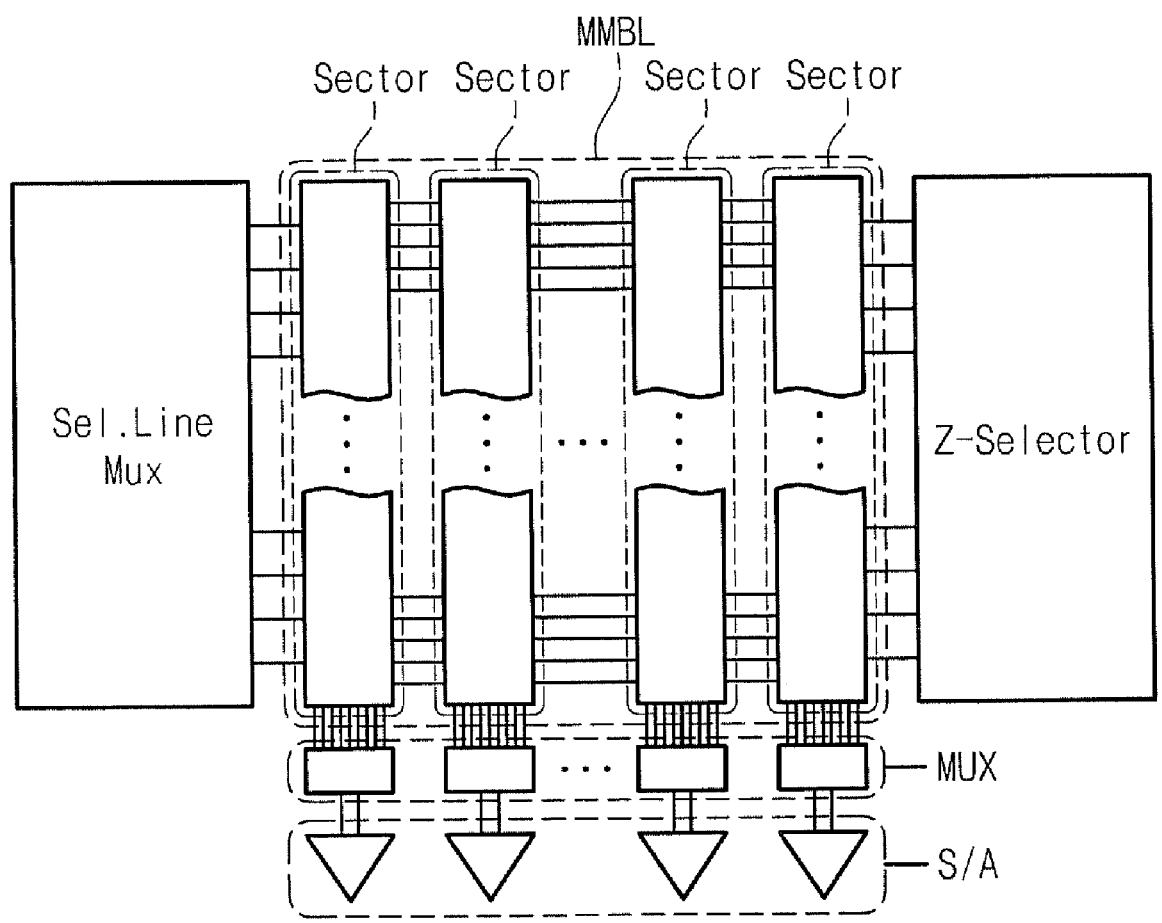
FIG. 54 is a schematic view illustrating a cell array structure of a semiconductor memory device according to some embodiments of the present invention.
Figure 55:
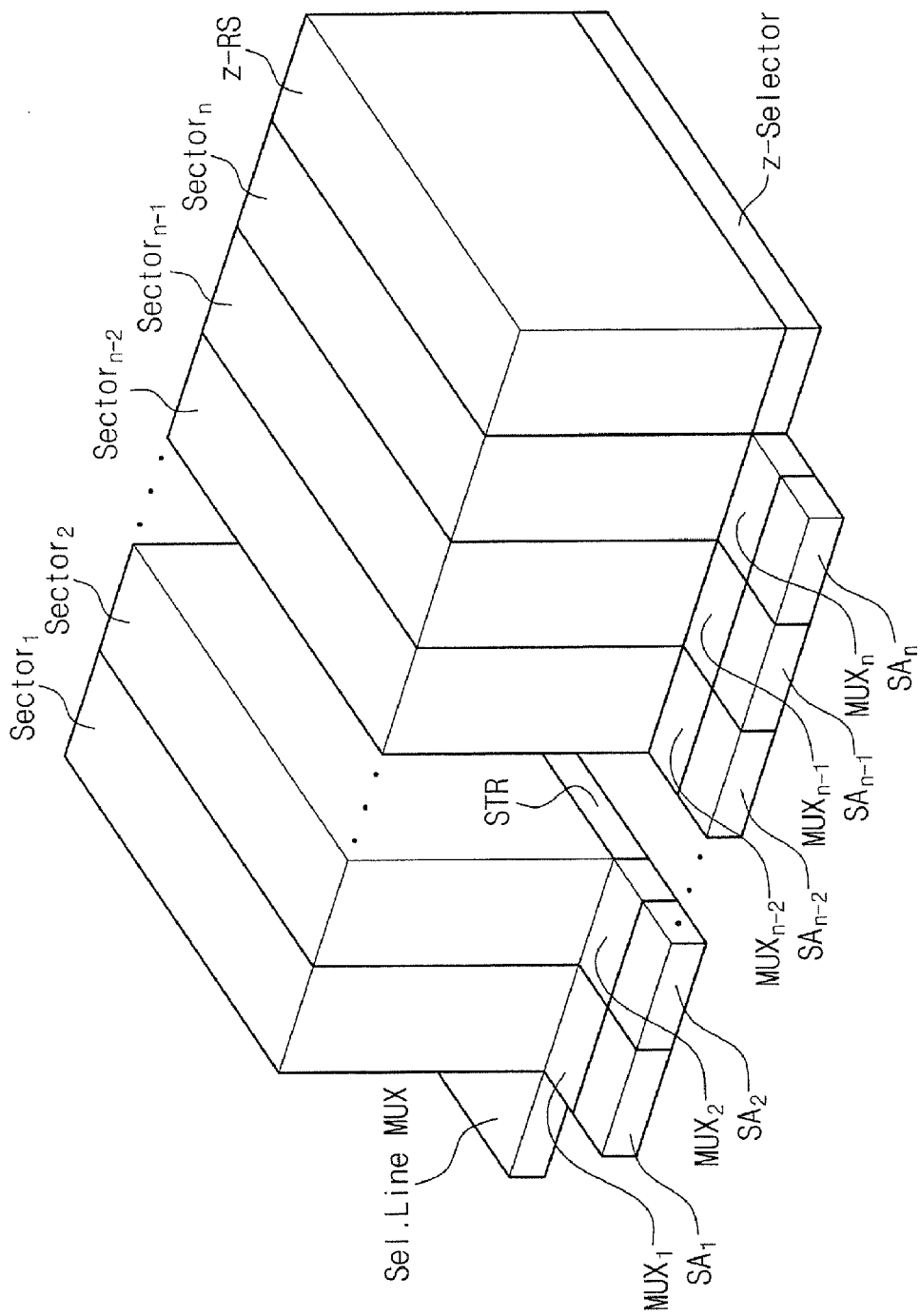
FIG. 55 is a perspective view exemplarily illustrating a cell array structure of a semiconductor memory device according to some embodiments of the present invention.

FIG. 54 is a schematic view illustrating a cell array structure of a semiconductor memory device according to some embodiments of the present invention. FIG. 55 is a perspective view exemplarily illustrating a cell array structure of a semiconductor memory device according to some embodiments of the present invention.

Referring to FIGS. 54 and 55, the cell array of the semiconductor memory device includes at least one memory block (MMBL). The memory block (MMBL) may include three-dimensionally arranged memory cell transistors, and may also include two or more word line structures described with reference to FIG. 2, two or more active semiconductor patterns (ASP) between the two or more word line structures, and a memory layer (ML) between the word line structures (WLS) and the active semiconductor patterns (ASP). As described above with reference to FIGS. 1 through 53, each of the word line structures (WLS) may include two or more word lines positioned at different levels, and dielectrics between the two or more word lines. Further, each of the active semiconductor patterns (ASP) may include two or more electrode regions (ER) and two or more channel regions (CR).

Below the memory block (MMBL), a select transistor region (STR) may be disposed as shown in FIG. 55 and the select transistors (Sel.TRs) in the embodiments described with reference to FIGS. 5 through 7 may be disposed on the select transistor region (STR). That is, the select transistors (Sel.TRs) may include a plurality of select lines (Sel.Line) connecting gate electrodes of the select transistors, and bit lines (BL) crossing the plurality of select lines (Sel.Line).

According to some embodiments, a select line MUX circuit (Sel.Line MUX) configured to control the select lines (Sel.Line) and a plurality of MUX circuits ($MUX_1$-$MUX_n$) configured to control the bit lines (BL) may be disposed around the memory block (MMBL) or the select transistor region (STR). Each of the plurality of MUX circuits ($MUX_1$-$MUX_n$) may be configured to operate independently, and a plurality of sensing circuits ($SA_1$-$SA_n$) configured to operate independently may be connected to the plurality of MUX circuits ($MUX_1$-$MUX_n$), respectively. In some embodiments, the plurality of MUX circuits ($MUX_1$-$MUX_n$) may be disposed between the sensing circuits ($SA_1$-$SA_n$) and the select transistor region (STR).

Some embodiments provide that a z-coordinate selector (z-Selector) configured to control the word lines (WL) and a z-routing structure (z-RS) connecting the z-Selector with the three-dimensionally arranged word lines (WL) may be further disposed around the memory block (MMBL).

According to some embodiments, since the plurality of MUX circuits ($MUX_1$-$MUX_n$) and the plurality of sensing circuits ($SA_1$-$SA_n$) are configured to operate independently, the memory cell transistors may be divided into a plurality of sectors that can operate independently. Herein, each sector may be comprised of memory cells sharing one sensing circuit. That is, bit lines connected to one MUX circuit (e.g., $MUX_1$) and memory cell transistors connected to the bit lines may be selected independently from bit lines connected to another MUX circuit (e.g., $MUX_2$) and memory cell transistors connected to the bit lines.

In some embodiments, in the case where one memory block (MMBL) includes a plurality of sectors ($Sector_1$-$Sector_n$) that can be selected independently, a plurality of memory cells can be independently selected at the same time, so that rapid data program and read operations may be possible. Specifically, since each of the word lines (WL) crosses the plurality of sectors ($Sector_1$-$Sector_n$) to which a voltage condition can be independently applied, when a predetermined program voltage and/or a predetermined read voltage is applied to one word line, two or more data can be updated and/or read at the same time. In such operations, the number (hereinafter referred to as 'page') of data that can be updated or read at the same time may be equal to the number of sectors sharing one word line.

Meanwhile, as described above with reference to FIGS. 25 through 27, one memory layer may include first and second memory regions (MR1 and MR2) that can store two bits and may be discriminated from each other, and two separated memory layers may be disposed around one channel region (CR). As a result, some embodiments provide that at least four different data may be stored around one channel region (CR). Accordingly, the number of data (i.e., the number of page) that can be stored in one sector may be at least four times a product of the number of layers of word lines (disposed in one sector), the number of select lines, and/or the number of bit lines.

Figure 56:
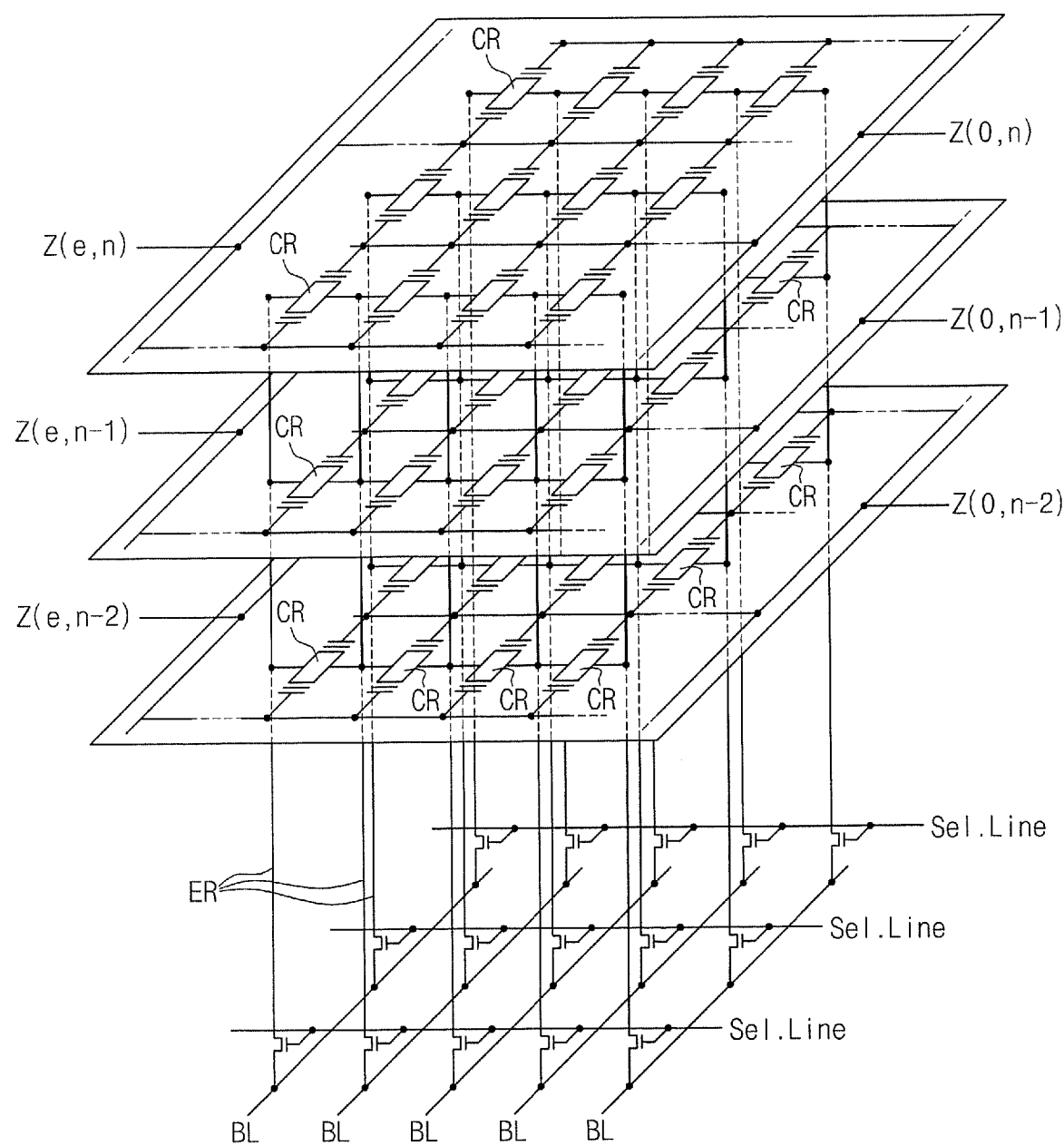
FIG. 56 is a circuit diagram for illustrating sectors of a semiconductor memory device according to some embodiments of the present invention.

FIG. 56 is a circuit diagram for illustrating sectors of a semiconductor memory device according to some embodiments of the present invention. In the description that is provided below, technical features overlapping those of embodiments described above with reference to FIGS. 2 through 8 may be omitted.

Referring to FIG. 56, as aforementioned, the word lines (WL) may be arranged on two or more layers. Stated differently, the word lines (WL) may be three-dimensionally arranged.

According to some embodiments, even-numbered word lines and odd-numbered word lines arranged on i-th layer may be electrically connected to z(e, i) interconnection line and z(o, i) interconnection line, respectively (where the letter 'e' represents an even-numbered number, 'o' represents an odd-numbered number, and the order of a selected layer). That is, word lines on one layer may be electrically connected to one of two separated z-interconnection lines (i.e., z(e, i) interconnection line and z(o, i) interconnection line), and 2m number of z-interconnection lines may be disposed in one memory block (MMBL) (where the letter 'm' represents a total number of stacked layers).

The z-routing structure (z-RS) may be configured to electrically connect the z-coordinate selector (z-Selector) and the z-interconnection lines. The z-coordinate selector (z-Selector) may be configured to select any one of the z-interconnection lines connected through the z-routing structure (z-RS).

According to some embodiments, a coordinate of one memory cell selected from the three-dimensionally arranged memory cells may be determined through selection of the select line (Sel.Line), the z-interconnection line and the bit line (BL). That is, when one z-interconnection line is selected, a z-coordinate of the selected memory cell can be specified, and when one select line (Sel.Line) is selected, an x-coordinate of the selected memory cell can be specified. In addition, when one pair of adjacent bit lines (BL) are selected, one pair of select transistors respectively connected to source and drain of the selected memory cell may be selected and thus a y-coordinate of the selected memory cell can be specified.

Here, as described with reference to FIGS. 26 through 30, since two different voltage conditions ([Vs, Vd] and [Vd, Vs]) may be applied to the one pair of selected bit lines (BL), two bits may be stored in one selected memory cell.

In addition, two word lines, which may be disposed on the same layer but may be connected to different z-interconnection lines (e.g., z(e, 1) and z(o, 1)), may be disposed around one channel region (CR). The charge storage layers may be disposed between the channel region (CR) and the two word lines. Since the two word lines may be connected to the different z-interconnection lines, different voltages can be independently applied to the two word lines. As a result, two charge storage layers between the channel region (CR) and two word lines adjacent to the channel region (CR) can be used to store independent data.

According to some modified embodiments, word lines (WL) disposed on one layer may be connected to the z-coordinate selector (z-Selector) through three or more z-interconnection lines. For example, word lines disposed on one layer may be all separated. Additionally, according to other modified embodiments, in contrast with embodiments described above with reference to FIG. 55, the z-routing structure (z-RS) may be disposed at both sides of the memory block or all four sides.

Figure 57:
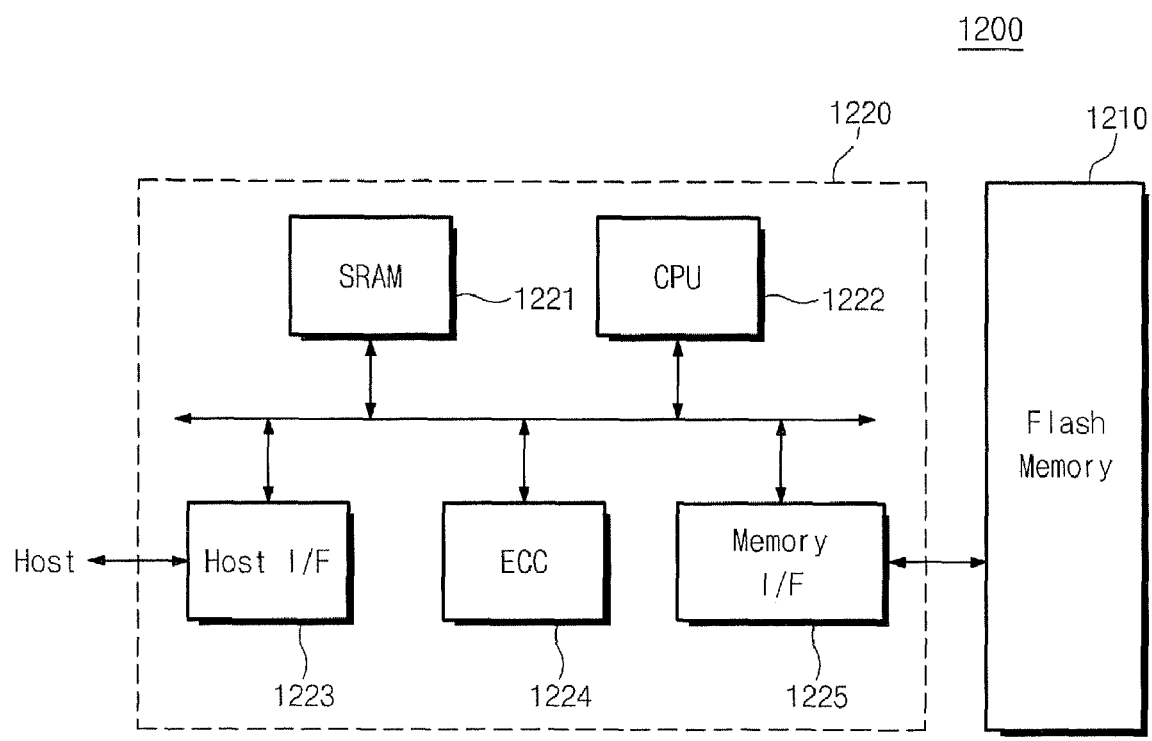
FIG. 57 is a block diagram schematically showing a memory card 1200 provided with a flash memory device according to some embodiments of the present invention.

FIG. 57 is a block diagram schematically showing a memory card 1200 provided with a flash memory device according to some embodiments of the present invention. Referring to FIG. 57, the memory card 1200 for supporting high-capacity data storage capability may be provided with a flash memory device 1210 according to some embodiments of the present invention. The memory card 1200 may include a memory controller 1220 that controls data exchange between a host and the flash memory device 1210.

An SRAM 1221 may be used as a working memory of a processing unit 1222. A host interface 1223 may provide a data exchange protocol of the host connected to the memory card 1200. An error correction block 1224 may detect and correct an error included in data read from the multi-bit flash memory device 1210. A memory interface 1225 may interface with the flash memory device 1210. The processing unit 1222 may perform an overall control operation for data exchange of the memory controller 1220. Although not shown in the drawings, it will be apparent to those skilled in the art that the memory card 1200 according to some embodiments of the present invention can further include a ROM (not shown) storing code data for interfacing with the host.

According to the flash memory device and the memory card or the memory system of the present invention, a memory system with high reliability may be provided through the flash memory device 1210 in which erase characteristics of dummy cells may be improved. The flash memory devices according to some embodiments of the present invention can be provided in a memory system such as solid state disk (hereinafter referred to as 'SSD') actively researched. In this case, read error caused by dummy cells may be prevented and thus may improve reliability of a memory system.

Figure 58:
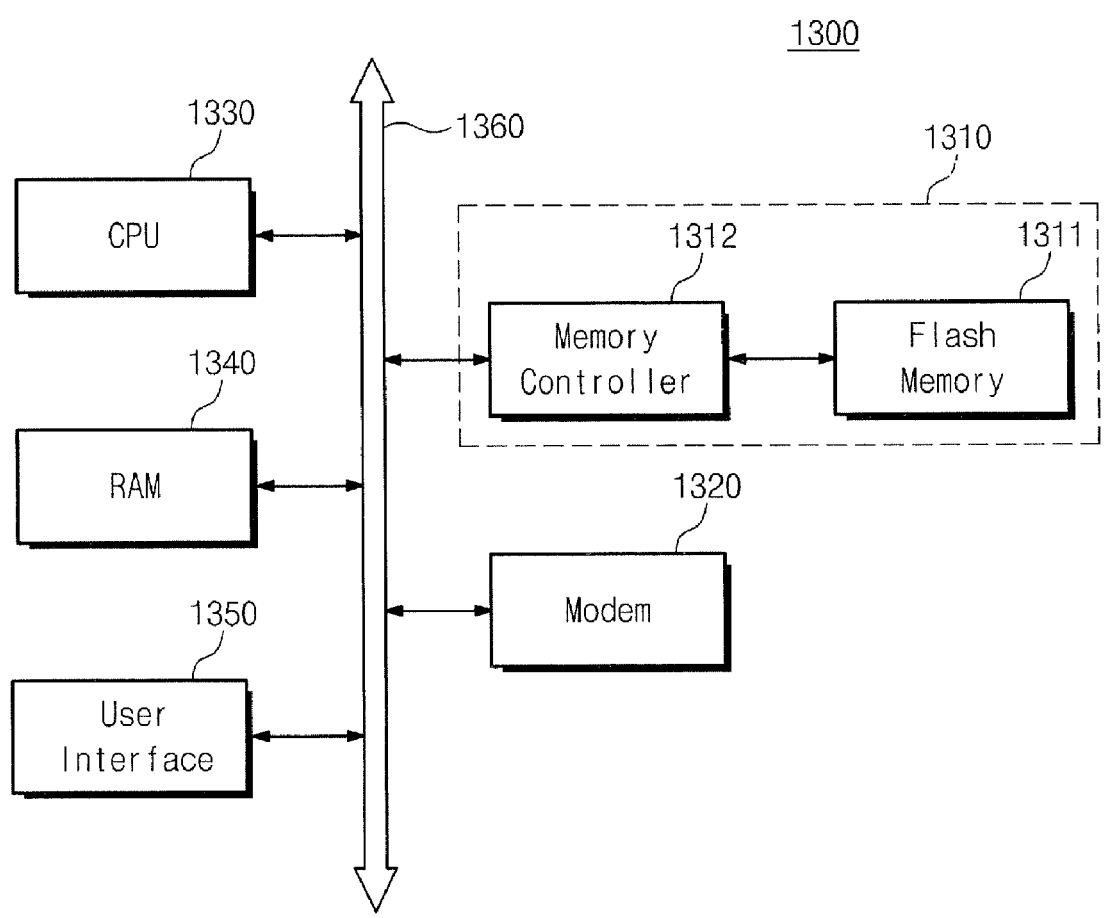
FIG. 58 is a block diagram schematically showing an information processing system provided with a flash memory system 1310 according to some embodiments of the present invention.

FIG. 58 is a block diagram schematically showing an information processing system provided with a flash memory system 1310 according to some embodiments of the present invention. Referring to FIG. 58, the flash memory system 1310 according to the embodiments of the present invention may be mounted on an information processing system such as a mobile device or desktop computer. The information processing system 1200 according to some embodiments of the present invention includes a flash memory system 1310, a modem 1320 electrically connected to a system bus 1360, a central processing unit (CPU) 1330, a RAM 1340, and/or a user interface 1350, among others. The flash memory system 1310 may have substantially the same configuration as the aforementioned memory system and/or flash memory system. Data processed by the CPU 1330 and/or external input data may be stored in the flash memory system 1310. In this exemplary application, the flash memory system 1310 may be configured with a semiconductor disk device (SSD). In some embodiments, the information processing system 1300 can stably store high-capacity data in the flash memory system 1310. Moreover, as the reliability of the semiconductor device is improved, the flash memory system 1310 can save resources consumed in error correction, thereby providing a high-speed data exchange function to the information processing system 1300. Although not shown in the drawings, it will be apparent to those skilled in the art that an application chipset, a camera image processor (CIS), input/output device, etc., can be provided in the information processing system 1300 according to some embodiments of the present invention.

Furthermore, the flash memory device or memory system according to some embodiments of the present invention may be mounted in various types of packages. Examples of the packages of the flash memory devices and/or memory systems according to some embodiments of the present invention may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), and/or a wafer-level processed stack package (WSP), among others.

According to some embodiments of the present invention, since the memory cells may be three-dimensionally arranged, the semiconductor device may have an increased integration. In addition, since one memory layer may include two memory regions, the integration of semiconductor memory devices according to some embodiments of the present invention may be further increased.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A three-dimensional semiconductor memory device comprising:
    a plurality of word line structures on a substrate;
    a plurality of active semiconductor patterns between the plurality of word line structures; and
    a plurality of information storage elements between the plurality of word line structures and the plurality of active semiconductor patterns,
    wherein each of the plurality of word line structures includes a plurality of word lines spaced apart from each other and stacked sequentially, and
    wherein the plurality of active semiconductor patterns include a plurality of electrode regions and a plurality of channel regions, which are alternately arranged and have conductive types different from each other.

2. The three-dimensional semiconductor memory device of claim 1, wherein the plurality of electrode regions and the plurality of channel regions constituting one active semiconductor pattern are continuously arranged, wherein each of the plurality of channel regions directly contacts two of the plurality of electrode regions adjacent thereto.

3. The three-dimensional semiconductor memory device of claim 1, further comprising a plurality of bit lines connecting respective ones of the electrode regions,
    wherein ones of the plurality of bit lines are disposed above or below ones of the plurality of word line structures to cross the plurality of word lines.

4. The three-dimensional semiconductor memory device of claim 3, wherein the plurality of bit lines comprise:
    a plurality of first bit lines connecting ones of the plurality of electrode regions corresponding to odd-numbered active semiconductor patterns; and
    a plurality of second bit lines connecting ones of the plurality of electrode regions corresponding to even-numbered active semiconductor patterns and are electrically separated from the plurality of first bit lines.

5. The three-dimensional semiconductor memory device of claim 4, wherein the plurality of first bit lines are disposed above the plurality of word line structures, and
    wherein the plurality of second bit lines are disposed below the plurality of word line structures.

6. The three-dimensional semiconductor memory device of claim 1, further comprising:
    a plurality of bit lines crossing above or below the plurality of word line structures; and
    a plurality of switching elements disposed between ones of the plurality of electrode regions and ones of the plurality of bit lines to control an electrical connection between ones of the plurality of electrode regions and ones of the plurality of bit lines,
    wherein ones of the plurality of switching elements are configured to electrically connect ones of the plurality of electrode regions of one of one pair of adjacent active semiconductor patterns to corresponding ones of the plurality of bit lines and to electrically separate ones of the plurality the electrode regions of an other of the one pair of adjacent active semiconductor patterns from the plurality of bit lines.

7. The three-dimensional semiconductor memory device of claim 1, wherein the substrate comprises a cell array region on which the plurality of word line structures are disposed, and a peripheral region on which a peripheral circuit is disposed,
    wherein the plurality of word line structures are placed at a level higher than the substrate below the peripheral circuit.

8. The three-dimensional semiconductor memory device of claim 1, further comprising:
    a plurality of bit lines crossing above or below the plurality of word line structures;
    a plurality of switching elements disposed between ones of the plurality of electrode regions and the plurality of bit lines to control an electrical connection between the electrode regions and the bit lines; and
    a plurality of MUX circuits connected to the plurality of bit lines to select at least one of the plurality of bit lines,
    wherein each of the plurality of MUX circuits is configured to operate independently.

9. A three-dimensional semiconductor memory device comprising:
    a plurality of word line structures including a plurality of spaced apart word lines on a substrate;
    a plurality of active semiconductor patterns that are arranged between the plurality of word line structures and that include a plurality of electrode regions and a plurality of channel regions;

a plurality of information storage elements between the plurality of word line structures and the plurality of active semiconductor patterns;

a plurality of bit lines connecting respective ones of the electrode regions and crossing above or below the plurality of word line structures; and a plurality of switching elements disposed between ones of the plurality of electrode regions and ones of the plurality of bit lines to control an electrical connection between ones of the plurality of electrode regions and ones of the plurality of bit lines.

10. The three-dimensional semiconductor memory device of claim 9, wherein ones of the plurality of switching elements are configured to electrically connect ones of the plurality of electrode regions of one of one pair of adjacent active semiconductor patterns to corresponding ones of the plurality of bit lines and to electrically separate ones of the plurality the electrode regions of an other of the one pair of adjacent active semiconductor patterns from the plurality of bit lines.

* * * * *